(12) United States Patent
Ko et al.

(10) Patent No.: US 9,450,799 B2
(45) Date of Patent: *Sep. 20, 2016

(54) APPARATUS FOR TRANSMITTING AND RECEIVING A SIGNAL AND METHOD OF TRANSMITTING AND RECEIVING A SIGNAL

(71) Applicant: LG Electronics Inc., Seoul (KR)

(72) Inventors: Woo Suk Ko, Seoul (KR); Sang Chul Moon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/742,226

(22) Filed: Jun. 17, 2015

(65) Prior Publication Data

US 2015/0304145 A1 Oct. 22, 2015

Related U.S. Application Data

(63) Continuation of application No. 14/480,094, filed on Sep. 8, 2014, now Pat. No. 9,148,251, which is a (Continued)

(51) Int. Cl.
*H04L 27/26* (2006.01)
*H04L 1/00* (2006.01)

(Continued)

(52) U.S. Cl.
CPC ...... *H04L 27/2626* (2013.01); *H03M 13/1102* (2013.01); *H04B 1/38* (2013.01);

(Continued)

(58) Field of Classification Search
CPC ........... H04L 27/2626; H04L 27/2613; H04L 27/2647; H04L 27/2698; H04L 5/0007; H04L 5/0048; H04L 5/0053
USPC .................................. 375/260, 295
See application file for complete search history.

(56) References Cited

U.S. PATENT DOCUMENTS 6,064,662 A 5/2000 Gitlin et al.
8,248,910 B2 8/2012 Jokela et al.

(Continued)

FOREIGN PATENT DOCUMENTS

CN 1889404 A 1/2007
CN 1943156 A 4/2007

(Continued)

OTHER PUBLICATIONS

Stadelmeier, L.: "Response to the DBV-C2 Call for Technologies", European Patent Register, Nov. 2, 2007, XP002744167, Retrieved from the Internet: URL:https://register.epo.org/application?documentId=ERQUOYXE9371FI4&number=EP09161842&Ing=en&npl=true [retrieved on Sep. 14, 2015] *figures 2, 3*.

(Continued)

*Primary Examiner* — Leon Flores
(74) *Attorney, Agent, or Firm* — Dentons US LLP

(57) ABSTRACT

A method of transmitting a broadcasting signal is provided. The method includes encoding data; encoding signaling data by an LDPC (Low Density Parity Check) scheme; building a signal frame based on at least one preamble data symbol having the encoded signaling data and a data slice having the encoded data; inserting at least one pilot into the signal frame with a specific pattern and modulating the signal frame by an OFDM (Orthogonal Frequency Division Multiplexing) method; and transmitting the modulated signal frame. A signaling block having the signaling data is repeated in the at least one preamble data symbol in a frequency domain by a bandwidth. The bandwidth of the signaling block corresponds to a number of active subcarriers assigned to a single channel.

16 Claims, 50 Drawing Sheets

Related U.S. Application Data continuation of application No. 13/941,148, filed on Jul. 12, 2013, now Pat. No. 8,867,640, which is a continuation of application No. 12/922,156, filed as application No. PCT/KR2009/002503 on May 12, 2009, now Pat. No. 8,503,549.

(60) Provisional application No. 61/107,329, filed on Oct. 21, 2008.

(51) Int. Cl.
| | | |
|---|---|---|
| *H04L 5/00* | (2006.01) | |
| *H04N 19/89* | (2014.01) | |
| *H03M 13/11* | (2006.01) | |
| *H04B 1/38* | (2015.01) | |
| *H04J 11/00* | (2006.01) | |

(52) U.S. Cl.
CPC .......... *H04L 1/0045* (2013.01); *H04L 1/0057* (2013.01); *H04L 1/0068* (2013.01); *H04L 1/0071* (2013.01); *H04L 5/0007* (2013.01); *H04L 5/0048* (2013.01); *H04L 5/0053* (2013.01); *H04L 27/2613* (2013.01); *H04L 27/2647* (2013.01); *H04L 27/2698* (2013.01); *H04N 19/89* (2014.11); *H04J 2011/0009* (2013.01); *H04L 5/0044* (2013.01); *H04L 5/0094* (2013.01)

(56) References Cited

U.S. PATENT DOCUMENTS

| 2008/0225996 A1 | 9/2008 | Vare et al. |
| 2011/0188588 A1 | 8/2011 | Ko et al. |
| 2014/0023148 A1 | 1/2014 | Ko et al. |

FOREIGN PATENT DOCUMENTS

| CN | 1960357 A | 5/2007 |
| CN | 1996985 A | 7/2007 |
| CN | 101018105 A | 8/2007 |
| CN | 101018224 A | 8/2007 |
| CN | 101167322 | 4/2008 |
| CN | 101198179 | 6/2008 |
| CN | 101202729 A | 6/2008 |
| EP | 1850547 | 10/2007 |
| EP | 2154848 | 2/2010 |
| RU | 2006110517 | 10/2007 |
| RU | 2006117781 | 11/2007 |
| WO | 2006131797 | 12/2006 |
| WO | 2008110886 | 9/2008 |
| WO | 2009031109 | 3/2009 |
| WO | 2009095525 | 8/2009 |

OTHER PUBLICATIONS

Sony, "Response to the DVB-C2 Call for Technologies", Sony, "C2-063", Jun. 2008, 58 pages.

Sony, "Sony's Response to the DVB-C2 cfT C2-076", DVB-C2, Jul. 2008, 30 pages.

Samsung, et al., "Preamble structure for C2", DVB-C2 Joint contribution, Nov. 2008, 28 pages.

TU-BS/Sony, "C2 ModCod Header proposal: Revised architecture and draft simulation results", DVB-C2, Nov. 2008, 16 pages.

DVB, "Frame structure channel coding and modulation for a second generation digital terrestrial television broadcasting system (DVB-T2)", TM 3980 Rev. 5, DVB Document A122, XP-002545919, Jun. 2008, 6 pages.

BBC, et al., "DVB-T2 Concept (BBC, Nokia, Teracom)", Presentation at TM-T2 meeting in Helsinki, Jun. 2007, 38 pages.

BBC, et al., "DVB-T2 Concept", Jun. 2007, 74 pages.

ETSI, "Draft DVB-T2 Specification Version 0.5.6", Mar. 2008, 1 page.

Nokia, et al., "L1 signaling parameter definition and signaling transmission in T2", DTV Group, Nov. 2007, 22 pages.

LG, "Preamble Structure for Channel Bonding", DVB Homepage, Nov. 2008, 12 pages.

ETSI, "Digital Video Broadcasting (DVB); Frame Structure channel coding and modulation for a second generation digital terrestrial television broadcasting system (DVB-T2)," Specification Version 0.5.5, Mar. 2008, 134 pages.

IP Australia Application Serial No. 2009307270, Examination Report dated Feb. 14, 2013, 3 pages.

The State Intellectual Property Office of the People's Republic of China Application Serial No. 200980127546.0, Office Action dated Jan. 17, 2013, 7 pages.

Sony, "Response to the DVB-C2 Call for Technologies (CfT)", Jun. 16, 2008, 58 pages.

Russian Federation Federal Service for Intellectual Property, Patents and Trademarks Application Serial No. 2011120431107, Notice of Allowance dated Mar. 7, 2013, 8 pages.

Digital Video Broadcasting (DVB), "Frame Structure Channel Coding and Modulation for a Second Generation Digital Terrestrial Television Broadcasting System (DVB-T2)," DVB Document A122r1, Jan. 2008, 165 pages (relevant pages: p. 15-112).

European Telecommunications Standards Institute (ETSI), "Digital Video Broadcasting (DVB), Second Generation Framing Structure, Channel Coding and Modulation Systems for Broadcasting, Interactive Services, News Gathering and Other Broadband Satellite Applications," ETSI EN 302 307 V1.1.2, Jun. 2006, 74 pages. (relevant pages: p. 11-32).

Digital Video Broadcasting (DVB), "Frame Structure Channel Coding and Modulation for a Second Generation Digital Terrestrial Television Broadcasting System (DVB-T2)," DVB Document A122, XP-002545919, Jun. 2008, pp. 63-64, 75-76.

Different bit

Fig. 6
(a)
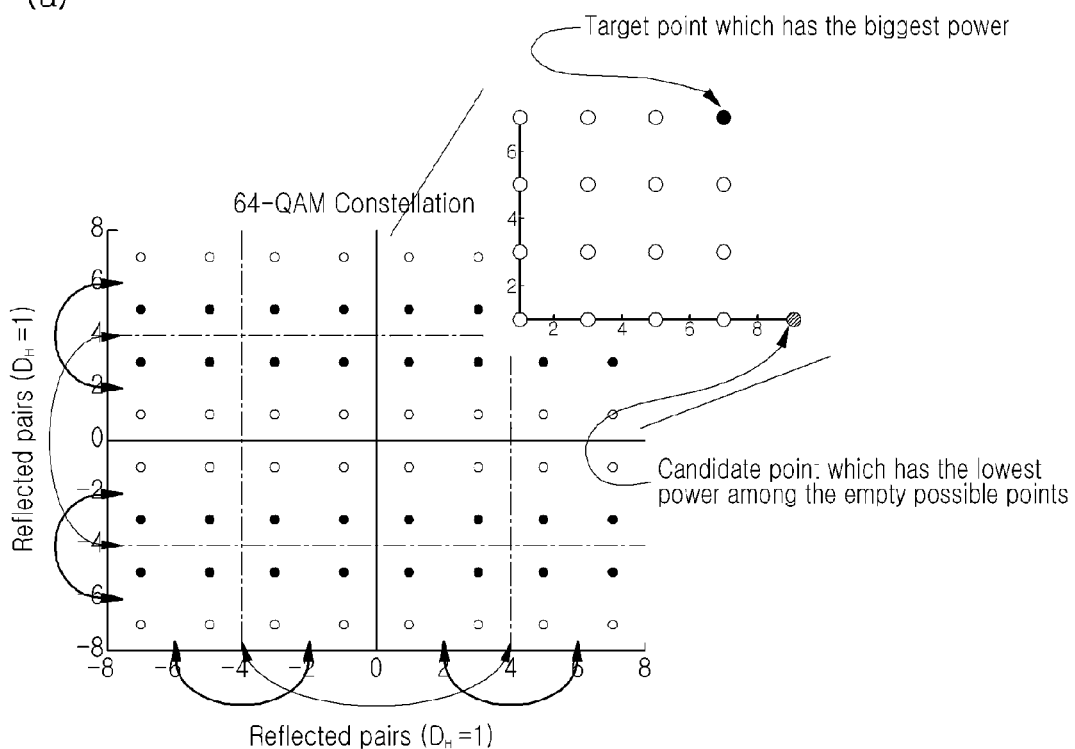
(b)
*Candidate point is the closest neighbor point of target point's reflected pair
Pt : Power of target point
Pc : Power of candidate point
Ps : Powers of each scatter points
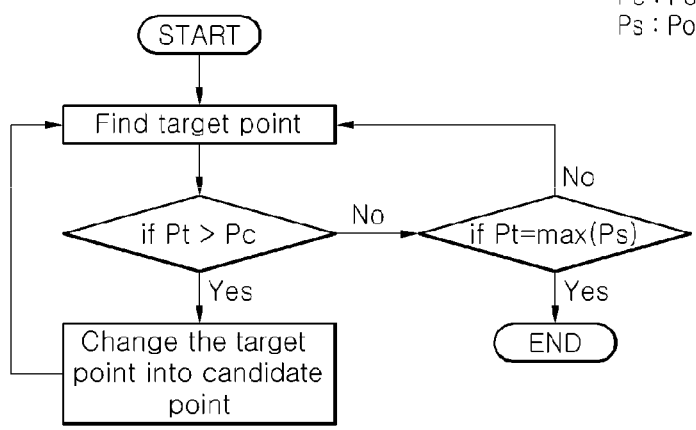

Fig. 8

| Value | Scatter |
|---|---|
| 0 | 9 + 1i |
| 1 | 7 + 5i |
| 2 | 5 + 7i |
| 3 | 5 + 5i |
| 4 | 7 + 1i |
| 5 | 7 + 3i |
| 6 | 5 + 1i |
| 7 | 5 + 3i |
| 8 | 1 + 7i |
| 9 | 1 + 5i |
| 10 | 3 + 7i |
| 11 | 3 + 5i |
| 12 | 1 + 1i |
| 13 | 1 + 3i |
| 14 | 3 + 1i |
| 15 | 3 + 3i |
| 16 | 1 - 9i |
| 17 | 7 - 5i |
| 18 | 5 - 7i |
| 19 | 5 - 5i |
| 20 | 7 - 1i |
| 21 | 7 - 3i |
| 22 | 5 - 1i |
| 23 | 5 - 3i |
| 24 | 1 - 7i |
| 25 | 1 - 5i |
| 26 | 3 - 7i |
| 27 | 3 - 5i |
| 28 | 1 - 1i |
| 29 | 1 - 3i |
| 30 | 3 - 1i |

Fig. 9

| Value | Scatter |
|---|---|
| 31 | 3 - 3i |
| 32 | -1 + 9i |
| 33 | -7 + 5i |
| 34 | -5 + 7i |
| 35 | -5 + 5i |
| 36 | -7 + 1i |
| 37 | -7 + 3i |
| 38 | -5 + 1i |
| 39 | -5 + 3i |
| 40 | -1 + 7i |
| 41 | -1 + 5i |
| 42 | -3 + 7i |
| 43 | -3 + 5i |
| 44 | -1 + 1i |
| 45 | -1 + 3i |
| 46 | -3 + 1i |
| 47 | -3 + 3i |
| 48 | -9 - 1i |
| 49 | -7 - 5i |
| 50 | -5 - 7i |
| 51 | -5 - 5i |
| 52 | -7 - 1i |
| 53 | -7 - 3i |
| 54 | -5 - 1i |
| 55 | -5 - 3i |
| 56 | -1 - 7i |
| 57 | -1 - 5i |
| 58 | -3 - 7i |
| 59 | -3 - 5i |
| 60 | -1 - 1i |
| 61 | -1 - 3i |
| 62 | -3 - 1i |
| 63 | -3 - 3i |

Fig. 10

| Value | Scatter | Value | Scatter | Value | Scatter | Value | Scatter |
|---|---|---|---|---|---|---|---|
| 0 | 17 + 1i | 64 | 1 - 17i | 128 | -1 + 17i | 192 | -17 - 1i |
| 1 | 17 + 3i | 65 | 17 - 3i | 129 | -17 + 3i | 193 | -17 - 3i |
| 2 | 3 + 17i | 66 | 3 - 17i | 130 | -3 + 17i | 194 | -3 - 17i |
| 3 | 13 + 13i | 67 | 13 - 13i | 131 | -13 + 13i | 195 | -13 - 13i |
| 4 | 15 + 9i | 68 | 15 - 9i | 132 | -15 + 9i | 196 | -15 - 9i |
| 5 | 17 + 5i | 69 | 17 - 5i | 133 | -17 + 5i | 197 | -17 - 5i |
| 6 | 13 + 9i | 70 | 13 - 9i | 134 | -13 + 9i | 198 | -13 - 9i |
| 7 | 13 + 11i | 71 | 13 - 11i | 135 | -13 + 11i | 199 | -13 - 11i |
| 8 | 9 + 15i | 72 | 9 - 15i | 136 | -9 + 15i | 200 | -9 - 15i |
| 9 | 9 + 13i | 73 | 9 - 13i | 137 | -9 + 13i | 201 | -9 - 13i |
| 10 | 5 + 17i | 74 | 5 - 17i | 138 | -5 + 17i | 202 | -5 - 17i |
| 11 | 11 + 13i | 75 | 11 - 13i | 139 | -11 + 13i | 203 | -11 - 13i |
| 12 | 9 + 9i | 76 | 9 - 9i | 140 | -9 + 9i | 204 | -9 - 9i |
| 13 | 9 + 11i | 77 | 9 - 11i | 141 | -9 + 11i | 205 | -9 - 11i |
| 14 | 11 + 9i | 78 | 11 - 9i | 142 | -11 + 9i | 206 | -11 - 9i |
| 15 | 11 + 11i | 79 | 11 - 11i | 143 | -11 + 11i | 207 | -11 - 11i |
| 16 | 15 + 11i | 80 | 15 - 11i | 144 | -15 + 11i | 208 | -15 - 11i |
| 17 | 15 + 3i | 81 | 15 - 3i | 145 | -15 + 3i | 209 | -15 - 3i |
| 18 | 13 + 1i | 82 | 13 - 1i | 146 | -13 + 1i | 210 | -13 - 1i |
| 19 | 13 + 3i | 83 | 13 - 3i | 147 | -13 + 3i | 211 | -13 - 3i |
| 20 | 15 + 7i | 84 | 15 - 7i | 148 | -15 + 7i | 212 | -15 - 7i |
| 21 | 15 + 5i | 85 | 15 - 5i | 149 | -15 + 5i | 213 | -15 - 5i |
| 22 | 13 + 7i | 86 | 13 - 7i | 150 | -13 + 7i | 214 | -13 - 7i |
| 23 | 13 + 5i | 87 | 13 - 5i | 151 | -13 + 5i | 215 | -13 - 5i |
| 24 | 9 + 1i | 88 | 9 - 1i | 152 | -9 + 1i | 216 | -9 - 1i |
| 25 | 9 + 3i | 89 | 9 - 3i | 153 | -9 + 3i | 217 | -9 - 3i |
| 26 | 11 + 1i | 90 | 11 - 1i | 154 | -11 + 1i | 218 | -11 - 1i |
| 27 | 11 + 3i | 91 | 11 - 3i | 155 | -11 + 3i | 219 | -11 - 3i |
| 28 | 9 + 7i | 92 | 9 - 7i | 156 | -9 + 7i | 220 | -9 - 7i |
| 29 | 9 + 5i | 93 | 9 - 5i | 157 | -9 + 5i | 221 | -9 - 5i |
| 30 | 11 + 7i | 94 | 11 - 7i | 158 | -11 + 7i | 222 | -11 - 7i |

Fig. 11

| Value | Scatter | Value | Scatter | Value | Scatter | Value | Scatter |
|---|---|---|---|---|---|---|---|
| 31 | 11 + 5i | 95 | 11 - 5i | 159 | -11 + 5i | 223 | -11 - 5i |
| 32 | 1 + 15i | 96 | 1 - 15i | 160 | -1 + 15i | 224 | -1 - 15i |
| 33 | 1 + 13i | 97 | 1 - 13i | 161 | -1 + 13i | 225 | -1 - 13i |
| 34 | 3 + 15i | 98 | 3 - 15i | 162 | -3 + 15i | 226 | -3 - 15i |
| 35 | 3 + 13i | 99 | 3 - 13i | 163 | -3 + 13i | 227 | -3 - 13i |
| 36 | 1 + 9i | 100 | 1 - 9i | 164 | -1 + 9i | 228 | -1 - 9i |
| 37 | 1 + 11i | 101 | 1 - 11i | 165 | -1 + 11i | 229 | -1 - 11i |
| 38 | 3 + 9i | 102 | 3 - 9i | 166 | -3 + 9i | 230 | -3 - 9i |
| 39 | 3 + 11i | 103 | 3 - 11i | 167 | -3 + 11i | 231 | -3 - 11i |
| 40 | 7 + 15i | 104 | 7 - 15i | 168 | -7 + 15i | 232 | -7 - 15i |
| 41 | 7 + 13i | 105 | 7 - 13i | 169 | -7 + 13i | 233 | -7 - 13i |
| 42 | 5 + 15i | 106 | 5 - 15i | 170 | -5 + 15i | 234 | -5 - 15i |
| 43 | 5 + 13i | 107 | 5 - 13i | 171 | -5 + 13i | 235 | -5 - 13i |
| 44 | 7 + 9i | 108 | 7 - 9i | 172 | -7 + 9i | 236 | -7 - 9i |
| 45 | 7 + 11i | 109 | 7 - 11i | 173 | -7 + 11i | 237 | -7 - 11i |
| 46 | 5 + 9i | 110 | 5 - 9i | 174 | -5 + 9i | 238 | -5 - 9i |
| 47 | 5 + 11i | 111 | 5 - 11i | 175 | -5 + 11i | 239 | -5 - 11i |
| 48 | 1 + 1i | 112 | 1 - 1i | 176 | -1 + 1i | 240 | -1 - 1i |
| 49 | 1 + 3i | 113 | 1 - 3i | 177 | -1 + 3i | 241 | -1 - 3i |
| 50 | 3 + 1i | 114 | 3 - 1i | 178 | -3 + 1i | 242 | -3 - 1i |
| 51 | 3 + 3i | 115 | 3 - 3i | 179 | -3 + 3i | 243 | -3 - 3i |
| 52 | 1 + 7i | 116 | 1 - 7i | 180 | -1 + 7i | 244 | -1 - 7i |
| 53 | 1 + 5i | 117 | 1 - 5i | 181 | -1 + 5i | 245 | -1 - 5i |
| 54 | 3 + 7i | 118 | 3 - 7i | 182 | -3 + 7i | 246 | -3 - 7i |
| 55 | 3 + 5i | 119 | 3 - 5i | 183 | -3 + 5i | 247 | -3 - 5i |
| 56 | 7 + 1i | 120 | 7 - 1i | 184 | -7 + 1i | 248 | -7 - 1i |
| 57 | 7 + 3i | 121 | 7 - 3i | 185 | -7 + 3i | 249 | -7 - 3i |
| 58 | 5 + 1i | 122 | 5 - 1i | 186 | -5 + 1i | 250 | -5 - 1i |
| 59 | 5 + 3i | 123 | 5 - 3i | 187 | -5 + 3i | 251 | -5 - 3i |
| 60 | 7 + 7i | 124 | 7 - 7i | 188 | -7 + 7i | 252 | -7 - 7i |
| 61 | 7 + 5i | 125 | 7 - 5i | 189 | -7 + 5i | 253 | -7 - 5i |
| 62 | 5 + 7i | 126 | 5 - 7i | 190 | -5 + 7i | 254 | -5 - 7i |
| 63 | 5 + 5i | 127 | 5 - 5i | 191 | -5 + 5i | 255 | -5 - 5i |

Fig. 12

| Value | Scatter | Value | Scatter | Value | Scatter | Value | Scatter | Value | Scatter | Value | Scatter | Value | Scatter | Value | Scatter |
|---|---|---|---|---|---|---|---|---|---|---|---|---|---|---|---|
| 0 | 33 + 1i | 64 | 31 + 1i | 128 | 1 + 31i | 192 | 1 + 1i | 256 | 1 - 33i | 320 | 31 - 1i | 384 | 1 - 31i | 448 | 1 - 1i |
| 1 | 33 + 3i | 65 | 31 + 3i | 129 | 1 + 29i | 193 | 1 + 3i | 257 | 33 - 3i | 321 | 31 - 3i | 385 | 1 - 29i | 449 | 1 - 3i |
| 2 | 3 + 33i | 66 | 29 + 1i | 130 | 3 + 31i | 194 | 3 + 1i | 258 | 3 - 33i | 322 | 29 - 1i | 386 | 3 - 31i | 450 | 3 - 1i |
| 3 | 35 + 3i | 67 | 29 + 3i | 131 | 3 + 29i | 195 | 3 + 3i | 259 | 3 - 35i | 323 | 29 - 3i | 387 | 3 - 29i | 451 | 3 - 3i |
| 4 | 33 + 7i | 68 | 31 + 7i | 132 | 1 + 25i | 196 | 1 + 7i | 260 | 33 - 7i | 324 | 31 - 7i | 388 | 1 - 25i | 452 | 1 - 7i |
| 5 | 33 + 5i | 69 | 31 + 5i | 133 | 1 + 27i | 197 | 1 + 5i | 261 | 33 - 5i | 325 | 31 - 5i | 389 | 1 - 27i | 453 | 1 - 5i |
| 6 | 35 + 7i | 70 | 29 + 7i | 134 | 3 + 25i | 198 | 3 + 7i | 262 | 35 - 7i | 326 | 29 - 7i | 390 | 3 - 25i | 454 | 3 - 7i |
| 7 | 35 + 5i | 71 | 29 + 5i | 135 | 3 + 27i | 199 | 3 + 5i | 263 | 35 - 5i | 327 | 29 - 5i | 391 | 3 - 27i | 455 | 3 - 5i |
| 8 | 7 + 33i | 72 | 25 + 1i | 136 | 7 + 31i | 200 | 7 + 1i | 264 | 7 - 33i | 328 | 25 - 1i | 392 | 7 - 31i | 456 | 7 - 1i |
| 9 | 7 + 35i | 73 | 25 + 3i | 137 | 7 + 29i | 201 | 7 + 3i | 265 | 7 - 35i | 329 | 25 - 3i | 393 | 7 - 29i | 457 | 7 - 3i |
| 10 | 5 + 33i | 74 | 27 + 1i | 138 | 5 + 31i | 202 | 5 + 1i | 266 | 5 - 33i | 330 | 27 - 1i | 394 | 5 - 31i | 458 | 5 - 1i |
| 11 | 5 + 35i | 75 | 27 + 3i | 139 | 5 + 29i | 203 | 5 + 3i | 267 | 5 - 35i | 331 | 27 - 3i | 395 | 5 - 29i | 459 | 5 - 3i |
| 12 | 25 + 25i | 76 | 25 + 7i | 140 | 7 + 25i | 204 | 7 + 7i | 268 | 25 - 25i | 332 | 25 - 7i | 396 | 7 - 25i | 460 | 7 - 7i |
| 13 | 25 + 27i | 77 | 25 + 5i | 141 | 7 + 27i | 205 | 7 + 5i | 269 | 25 - 27i | 333 | 25 - 5i | 397 | 7 - 27i | 461 | 7 - 5i |
| 14 | 27 + 25i | 78 | 27 + 7i | 142 | 5 + 25i | 206 | 5 + 7i | 270 | 27 - 25i | 334 | 27 - 7i | 398 | 5 - 25i | 462 | 5 - 7i |
| 15 | 37 + 5i | 79 | 27 + 5i | 143 | 5 + 27i | 207 | 5 + 5i | 271 | 5 - 37i | 335 | 27 - 5i | 399 | 5 - 27i | 463 | 5 - 5i |
| 16 | 31 + 17i | 80 | 31 + 15i | 144 | 1 + 17i | 208 | 1 + 15i | 272 | 31 - 17i | 336 | 31 - 15i | 400 | 1 - 17i | 464 | 1 - 15i |
| 17 | 33 + 13i | 81 | 31 + 13i | 145 | 1 + 19i | 209 | 1 + 13i | 273 | 33 - 13i | 337 | 31 - 13i | 401 | 1 - 19i | 465 | 1 - 13i |
| 18 | 29 + 17i | 82 | 29 + 15i | 146 | 3 + 17i | 210 | 3 + 15i | 274 | 29 - 17i | 338 | 29 - 15i | 402 | 3 - 17i | 466 | 3 - 15i |
| 19 | 29 + 19i | 83 | 29 + 13i | 147 | 3 + 19i | 211 | 3 + 13i | 275 | 29 - 19i | 339 | 29 - 13i | 403 | 3 - 19i | 467 | 3 - 13i |
| 20 | 33 + 9i | 84 | 31 + 9i | 148 | 1 + 23i | 212 | 1 + 9i | 276 | 33 - 9i | 340 | 31 - 9i | 404 | 1 - 23i | 468 | 1 - 9i |
| 21 | 33 + 11i | 85 | 31 + 11i | 149 | 1 + 21i | 213 | 1 + 11i | 277 | 33 - 11i | 341 | 31 - 11i | 405 | 1 - 21i | 469 | 1 - 11i |
| 22 | 35 + 9i | 86 | 29 + 9i | 150 | 3 + 23i | 214 | 3 + 9i | 278 | 35 - 9i | 342 | 29 - 9i | 406 | 3 - 23i | 470 | 3 - 9i |
| 23 | 29 + 21i | 87 | 29 + 11i | 151 | 3 + 21i | 215 | 3 + 11i | 279 | 29 - 21i | 343 | 29 - 11i | 407 | 3 - 21i | 471 | 3 - 11i |
| 24 | 25 + 17i | 88 | 25 + 15i | 152 | 7 + 17i | 216 | 7 + 15i | 280 | 25 - 17i | 344 | 25 - 15i | 408 | 7 - 17i | 472 | 7 - 15i |
| 25 | 25 + 19i | 89 | 25 + 13i | 153 | 7 + 19i | 217 | 7 + 13i | 281 | 25 - 19i | 345 | 25 - 13i | 409 | 7 - 19i | 473 | 7 - 13i |
| 26 | 27 + 17i | 90 | 27 + 15i | 154 | 5 + 17i | 218 | 5 + 15i | 282 | 27 - 17i | 346 | 27 - 15i | 410 | 5 - 17i | 474 | 5 - 15i |
| 27 | 27 + 19i | 91 | 27 + 13i | 155 | 5 + 19i | 219 | 5 + 13i | 283 | 27 - 19i | 347 | 27 - 13i | 411 | 5 - 19i | 475 | 5 - 13i |
| 28 | 25 + 23i | 92 | 25 + 9i | 156 | 7 + 23i | 220 | 7 + 9i | 284 | 25 - 23i | 348 | 25 - 9i | 412 | 7 - 23i | 476 | 7 - 9i |
| 29 | 25 + 21i | 93 | 25 + 11i | 157 | 7 + 21i | 221 | 7 + 11i | 285 | 25 - 21i | 349 | 25 - 11i | 413 | 7 - 21i | 477 | 7 - 11i |
| 30 | 27 + 23i | 94 | 27 + 9i | 158 | 5 + 23i | 222 | 5 + 9i | 286 | 27 - 23i | 350 | 27 - 9i | 414 | 5 - 23i | 478 | 5 - 9i |

Fig. 13

| # | Value | # | Value | # | Value | # | Value | # | Value | # | Value | # | Value | # | Value |
|---|---|---|---|---|---|---|---|---|---|---|---|---|---|---|---|
| 31 | 27 + 21i | 95 | 27 + 11i | 159 | 5 + 21i | 223 | 5 + 11i | 287 | 27 - 21i | 351 | 27 - 11i | 415 | 5 - 21i | 479 | 5 - 11i |
| 32 | 17 + 31i | 96 | 17 + 1i | 160 | 15 + 31i | 224 | 15 + 1i | 288 | 17 - 31i | 352 | 17 - 1i | 416 | 15 - 31i | 480 | 15 - 1i |
| 33 | 17 + 29i | 97 | 17 + 3i | 161 | 15 + 29i | 225 | 15 + 3i | 289 | 17 - 29i | 353 | 17 - 3i | 417 | 15 - 29i | 481 | 15 - 3i |
| 34 | 13 + 33i | 98 | 19 + 1i | 162 | 13 + 31i | 226 | 13 + 1i | 290 | 13 - 33i | 354 | 19 - 1i | 418 | 13 - 31i | 482 | 13 - 1i |
| 35 | 19 + 29i | 99 | 19 + 3i | 163 | 13 + 29i | 227 | 13 + 3i | 291 | 19 - 29i | 355 | 19 - 3i | 419 | 13 - 29i | 483 | 13 - 3i |
| 36 | 17 + 25i | 100 | 17 + 7i | 164 | 15 + 25i | 228 | 15 + 7i | 292 | 17 - 25i | 356 | 17 - 7i | 420 | 15 - 25i | 484 | 15 - 7i |
| 37 | 17 + 27i | 101 | 17 + 5i | 165 | 15 + 27i | 229 | 15 + 5i | 293 | 17 - 27i | 357 | 17 - 5i | 421 | 15 - 27i | 485 | 15 - 5i |
| 38 | 19 + 25i | 102 | 19 + 7i | 166 | 13 + 25i | 230 | 13 + 7i | 294 | 19 - 25i | 358 | 19 - 7i | 422 | 13 - 25i | 486 | 13 - 7i |
| 39 | 19 + 27i | 103 | 19 + 5i | 167 | 13 + 27i | 231 | 13 + 5i | 295 | 19 - 27i | 359 | 19 - 5i | 423 | 13 - 27i | 487 | 13 - 5i |
| 40 | 9 + 33i | 104 | 23 + 1i | 168 | 9 + 31i | 232 | 9 + 1i | 296 | 9 - 33i | 360 | 23 - 1i | 424 | 9 - 31i | 488 | 9 - 1i |
| 41 | 9 + 35i | 105 | 23 + 3i | 169 | 9 + 29i | 233 | 9 + 3i | 297 | 9 - 35i | 361 | 23 - 3i | 425 | 9 - 29i | 489 | 9 - 3i |
| 42 | 11 + 33i | 106 | 21 + 1i | 170 | 11 + 31i | 234 | 11 + 1i | 298 | 11 - 33i | 362 | 21 - 1i | 426 | 11 - 31i | 490 | 11 - 1i |
| 43 | 21 + 29i | 107 | 21 + 3i | 171 | 11 + 29i | 235 | 11 + 3i | 299 | 21 - 29i | 363 | 21 - 3i | 427 | 11 - 29i | 491 | 11 - 3i |
| 44 | 23 + 25i | 108 | 23 + 7i | 172 | 9 + 25i | 236 | 9 + 7i | 300 | 23 - 25i | 364 | 23 - 7i | 428 | 9 - 25i | 492 | 9 - 7i |
| 45 | 23 + 27i | 109 | 23 + 5i | 173 | 9 + 27i | 237 | 9 + 5i | 301 | 23 - 27i | 365 | 23 - 5i | 429 | 9 - 27i | 493 | 9 - 5i |
| 46 | 21 + 25i | 110 | 21 + 7i | 174 | 11 + 25i | 238 | 11 + 7i | 302 | 21 - 25i | 366 | 21 - 7i | 430 | 11 - 25i | 494 | 11 - 7i |
| 47 | 21 + 27i | 111 | 21 + 5i | 175 | 11 + 27i | 239 | 11 + 5i | 303 | 21 - 27i | 367 | 21 - 5i | 431 | 11 - 27i | 495 | 11 - 5i |
| 48 | 17 + 17i | 112 | 17 + 15i | 176 | 15 + 17i | 240 | 15 + 15i | 304 | 17 - 17i | 368 | 17 - 15i | 432 | 15 - 17i | 496 | 15 - 15i |
| 49 | 17 + 19i | 113 | 17 + 13i | 177 | 15 + 19i | 241 | 15 + 13i | 305 | 17 - 19i | 369 | 17 - 13i | 433 | 15 - 19i | 497 | 15 - 13i |
| 50 | 19 + 17i | 114 | 19 + 15i | 178 | 13 + 17i | 242 | 13 + 15i | 306 | 19 - 17i | 370 | 19 - 15i | 434 | 13 - 17i | 498 | 13 - 15i |
| 51 | 19 + 19i | 115 | 19 + 13i | 179 | 13 + 19i | 243 | 13 + 13i | 307 | 19 - 19i | 371 | 19 - 13i | 435 | 13 - 19i | 499 | 13 - 13i |
| 52 | 17 + 23i | 116 | 17 + 11i | 180 | 15 + 23i | 244 | 15 + 11i | 308 | 17 - 23i | 372 | 17 - 11i | 436 | 15 - 23i | 500 | 15 - 11i |
| 53 | 17 + 21i | 117 | 17 + 9i | 181 | 15 + 21i | 245 | 15 + 9i | 309 | 17 - 21i | 373 | 17 - 9i | 437 | 15 - 21i | 501 | 15 - 9i |
| 54 | 19 + 23i | 118 | 19 + 11i | 182 | 13 + 23i | 246 | 13 + 11i | 310 | 19 - 23i | 374 | 19 - 11i | 438 | 13 - 23i | 502 | 13 - 11i |
| 55 | 19 + 21i | 119 | 19 + 9i | 183 | 13 + 21i | 247 | 13 + 9i | 311 | 19 - 21i | 375 | 19 - 9i | 439 | 13 - 21i | 503 | 13 - 9i |
| 56 | 23 + 17i | 120 | 23 + 15i | 184 | 9 + 17i | 248 | 9 + 15i | 312 | 23 - 17i | 376 | 23 - 15i | 440 | 9 - 17i | 504 | 9 - 15i |
| 57 | 23 + 19i | 121 | 23 + 13i | 185 | 9 + 19i | 249 | 9 + 13i | 313 | 23 - 19i | 377 | 23 - 13i | 441 | 9 - 19i | 505 | 9 - 13i |
| 58 | 21 + 17i | 122 | 21 + 15i | 186 | 11 + 17i | 250 | 11 + 15i | 314 | 21 - 17i | 378 | 21 - 15i | 442 | 11 - 17i | 506 | 11 - 15i |
| 59 | 21 + 19i | 123 | 21 + 13i | 187 | 11 + 19i | 251 | 11 + 13i | 315 | 21 - 19i | 379 | 21 - 13i | 443 | 11 - 19i | 507 | 11 - 13i |
| 60 | 23 + 21i | 124 | 23 + 9i | 188 | 9 + 23i | 252 | 9 + 9i | 316 | 23 - 21i | 380 | 23 - 9i | 444 | 9 - 23i | 508 | 9 - 9i |
| 61 | 23 + 23i | 125 | 23 + 11i | 189 | 9 + 21i | 253 | 9 + 11i | 317 | 23 - 23i | 381 | 23 - 11i | 445 | 9 - 21i | 509 | 9 - 11i |
| 62 | 21 + 23i | 126 | 21 + 9i | 190 | 11 + 23i | 254 | 11 + 9i | 318 | 21 - 23i | 382 | 21 - 9i | 446 | 11 - 23i | 510 | 11 - 9i |
| 63 | 21 + 21i | 127 | 21 + 11i | 191 | 11 + 21i | 255 | 11 + 11i | 319 | 21 - 21i | 383 | 21 - 11i | 447 | 11 - 21i | 511 | 11 - 11i |

Fig. 14

| Value | Scatter | Value | Scatter | Value | Scatter | Value | Scatter | Value | Scatter | Value | Scatter | Value | Scatter |
|---|---|---|---|---|---|---|---|---|---|---|---|---|---|
| 512 | -1 + 33i | 576 | -31 + 1i | 640 | -1 + 31i | 704 | -1 + 1i | 768 | -33 - 1i | 832 | -31 - 1i | 896 | -1 - 1i |
| 513 | -33 + 3i | 577 | -31 + 3i | 641 | -1 + 29i | 705 | -1 + 3i | 769 | -33 - 3i | 833 | -31 - 3i | 897 | -1 - 3i |
| 514 | -3 + 33i | 578 | -29 + 1i | 642 | -3 + 31i | 706 | -3 + 1i | 770 | -3 - 33i | 834 | -29 - 3i | 898 | -3 - 1i |
| 515 | -3 + 35i | 579 | -29 + 3i | 643 | -3 + 29i | 707 | -3 + 3i | 771 | -35 - 3i | 835 | -29 - 3i | 899 | -3 - 3i |
| 516 | -33 + 7i | 580 | -31 + 7i | 644 | -1 + 25i | 708 | -1 + 7i | 772 | -33 - 7i | 836 | -31 - 7i | 900 | -1 - 7i |
| 517 | -33 + 5i | 581 | -31 + 5i | 645 | -1 + 27i | 709 | -1 + 5i | 773 | -33 - 5i | 837 | -31 - 5i | 901 | -1 - 5i |
| 518 | -35 + 7i | 582 | -29 + 7i | 646 | -3 + 25i | 710 | -3 + 7i | 774 | -35 - 7i | 838 | -29 - 7i | 902 | -3 - 7i |
| 519 | -35 + 5i | 583 | -29 + 5i | 647 | -3 + 27i | 711 | -3 + 5i | 775 | -35 - 5i | 839 | -29 - 5i | 903 | -3 - 5i |
| 520 | -7 + 33i | 584 | -25 + 1i | 648 | -7 + 31i | 712 | -7 + 1i | 776 | -7 - 33i | 840 | -25 - 1i | 904 | -7 - 1i |
| 521 | -7 + 35i | 585 | -25 + 3i | 649 | -7 + 29i | 713 | -7 + 3i | 777 | -7 - 35i | 841 | -25 - 3i | 905 | -7 - 3i |
| 522 | -5 + 33i | 586 | -27 + 1i | 650 | -5 + 31i | 714 | -5 + 1i | 778 | -5 - 33i | 842 | -27 - 1i | 906 | -5 - 1i |
| 523 | -5 + 35i | 587 | -27 + 3i | 651 | -5 + 29i | 715 | -5 + 3i | 779 | -5 - 35i | 843 | -27 - 3i | 907 | -5 - 3i |
| 524 | -25 + 25i | 588 | -25 + 7i | 652 | -7 + 25i | 716 | -7 + 7i | 780 | -25 - 25i | 844 | -25 - 7i | 908 | -7 - 7i |
| 525 | -25 + 27i | 589 | -25 + 5i | 653 | -7 + 27i | 717 | -7 + 5i | 781 | -25 - 27i | 845 | -25 - 5i | 909 | -7 - 5i |
| 526 | -27 + 25i | 590 | -27 + 7i | 654 | -5 + 25i | 718 | -5 + 7i | 782 | -27 - 25i | 846 | -27 - 7i | 910 | -5 - 7i |
| 527 | -5 + 37i | 591 | -27 + 5i | 655 | -5 + 27i | 719 | -5 + 5i | 783 | -37 - 5i | 847 | -27 - 5i | 911 | -5 - 5i |
| 528 | -31 + 17i | 592 | -31 + 15i | 656 | -1 + 17i | 720 | -1 + 15i | 784 | -31 - 17i | 848 | -31 - 15i | 912 | -1 - 15i |
| 529 | -33 + 13i | 593 | -31 + 13i | 657 | -1 + 19i | 721 | -1 + 13i | 785 | -33 - 13i | 849 | -31 - 13i | 913 | -1 - 13i |
| 530 | -29 + 17i | 594 | -29 + 15i | 658 | -3 + 17i | 722 | -3 + 15i | 786 | -29 - 17i | 850 | -29 - 15i | 914 | -3 - 15i |
| 531 | -29 + 19i | 595 | -29 + 13i | 659 | -3 + 19i | 723 | -3 + 13i | 787 | -29 - 19i | 851 | -29 - 13i | 915 | -3 - 13i |
| 532 | -33 + 9i | 596 | -31 + 9i | 660 | -1 + 9i | 724 | -1 + 9i | 788 | -33 - 9i | 852 | -31 - 9i | 916 | -1 - 9i |
| 533 | -33 + 11i | 597 | -31 + 11i | 661 | -1 + 21i | 725 | -1 + 11i | 789 | -33 - 11i | 853 | -31 - 11i | 917 | -1 - 11i |
| 534 | -35 + 9i | 598 | -29 + 9i | 662 | -3 + 23i | 726 | -3 + 9i | 790 | -35 - 9i | 854 | -29 - 9i | 918 | -3 - 9i |
| 535 | -29 + 21i | 599 | -29 + 11i | 663 | -3 + 21i | 727 | -3 + 11i | 791 | -29 - 21i | 855 | -29 - 11i | 919 | -3 - 11i |
| 536 | -25 + 17i | 600 | -25 + 15i | 664 | -7 + 17i | 728 | -7 + 15i | 792 | -25 - 17i | 856 | -25 - 15i | 920 | -7 - 15i |
| 537 | -25 + 19i | 601 | -25 + 13i | 665 | -7 + 19i | 729 | -7 + 13i | 793 | -25 - 19i | 857 | -25 - 13i | 921 | -7 - 13i |
| 538 | -27 + 17i | 602 | -27 + 15i | 666 | -5 + 17i | 730 | -5 + 15i | 794 | -27 - 17i | 858 | -27 - 15i | 922 | -5 - 15i |
| 539 | -27 + 19i | 603 | -27 + 13i | 667 | -5 + 19i | 731 | -5 + 13i | 795 | -27 - 19i | 859 | -27 - 13i | 923 | -5 - 13i |
| 540 | -25 + 23i | 604 | -25 + 9i | 668 | -7 + 23i | 732 | -7 + 9i | 796 | -25 - 23i | 860 | -25 - 9i | 924 | -7 - 9i |

Fig. 15

| | | | | | | | | | | | |
|---|---|---|---|---|---|---|---|---|---|---|---|
| 541 | -25 + 21i | 605 | -25 + 11i | 669 | -7 + 21i | 733 | -7 + 11i | 797 | -25 - 21i | 861 | -25 - 11i | 925 | -7 - 21i | 989 | -7 - 11i |
| 542 | -27 + 23i | 606 | -27 + 9i | 670 | -5 + 23i | 734 | -5 + 9i | 798 | -27 - 23i | 862 | -27 - 9i | 926 | -5 - 23i | 990 | -5 - 9i |
| 543 | -27 + 21i | 607 | -27 + 11i | 671 | -5 + 21i | 735 | -5 + 11i | 799 | -27 - 21i | 863 | -27 - 11i | 927 | -5 - 21i | 991 | -5 - 11i |
| 544 | -17 + 31i | 608 | -17 + 1i | 672 | -15 + 31i | 736 | -15 + 3i | 800 | -17 - 31i | 864 | -17 - 1i | 928 | -15 - 31i | 992 | -15 - 3i |
| 545 | -17 + 29i | 609 | -17 + 3i | 673 | -15 + 29i | 737 | -15 + 3i | 801 | -17 - 29i | 865 | -17 - 3i | 929 | -15 - 29i | 993 | -15 - 3i |
| 546 | -13 + 33i | 610 | -19 + 1i | 674 | -13 + 31i | 738 | -13 + 1i | 802 | -13 - 33i | 866 | -19 - 1i | 930 | -13 - 31i | 994 | -13 - 1i |
| 547 | -19 + 29i | 611 | -19 + 3i | 675 | -13 + 29i | 739 | -13 + 3i | 803 | -19 - 29i | 867 | -19 - 3i | 931 | -13 - 29i | 995 | -13 - 3i |
| 548 | -17 + 25i | 612 | -17 + 7i | 676 | -15 + 25i | 740 | -15 + 7i | 804 | -17 - 25i | 868 | -17 - 7i | 932 | -15 - 25i | 996 | -15 - 7i |
| 549 | -17 + 27i | 613 | -19 + 5i | 677 | -15 + 27i | 741 | -13 + 7i | 805 | -17 - 27i | 869 | -19 - 5i | 933 | -15 - 27i | 997 | -15 - 7i |
| 550 | -19 + 25i | 614 | -19 + 7i | 678 | -13 + 25i | 742 | -13 + 5i | 806 | -19 - 25i | 870 | -19 - 7i | 934 | -13 - 25i | 998 | -13 - 5i |
| 551 | -19 + 27i | 615 | -19 + 5i | 679 | -13 + 27i | 743 | -13 + 7i | 807 | -19 - 27i | 871 | -19 - 5i | 935 | -13 - 27i | 999 | -13 - 7i |
| 552 | -9 + 33i | 616 | -23 + 1i | 680 | -9 + 31i | 744 | -9 + 1i | 808 | -9 - 33i | 872 | -23 - 1i | 936 | -9 - 31i | 1000 | -9 - 1i |
| 553 | -9 + 35i | 617 | -23 + 3i | 681 | -9 + 29i | 745 | -9 + 3i | 809 | -9 - 35i | 873 | -23 - 3i | 937 | -9 - 29i | 1001 | -9 - 3i |
| 554 | -11 + 33i | 618 | -21 + 1i | 682 | -11 + 31i | 746 | -11 + 1i | 810 | -11 - 33i | 874 | -21 - 1i | 938 | -11 - 31i | 1002 | -11 - 1i |
| 555 | -21 + 29i | 619 | -21 + 3i | 683 | -11 + 29i | 747 | -11 + 3i | 811 | -21 - 29i | 875 | -21 - 3i | 939 | -11 - 29i | 1003 | -11 - 3i |
| 556 | -23 + 25i | 620 | -23 + 7i | 684 | -9 + 25i | 748 | -9 + 7i | 812 | -23 - 25i | 876 | -23 - 7i | 940 | -9 - 25i | 1004 | -9 - 7i |
| 557 | -23 + 27i | 621 | -23 + 5i | 685 | -9 + 27i | 749 | -9 + 5i | 813 | -23 - 27i | 877 | -23 - 5i | 941 | -9 - 27i | 1005 | -9 - 5i |
| 558 | -21 + 25i | 622 | -21 + 7i | 686 | -11 + 25i | 750 | -11 + 7i | 814 | -21 - 25i | 878 | -21 - 7i | 942 | -11 - 25i | 1006 | -11 - 7i |
| 559 | -21 + 27i | 623 | -21 + 5i | 687 | -11 + 27i | 751 | -11 + 5i | 815 | -21 - 27i | 879 | -21 - 5i | 943 | -11 - 27i | 1007 | -11 - 5i |
| 560 | -17 + 17i | 624 | -17 + 15i | 688 | -15 + 17i | 752 | -15 + 15i | 816 | -17 - 17i | 880 | -17 - 15i | 944 | -15 - 17i | 1008 | -15 - 15i |
| 561 | -17 + 19i | 625 | -17 + 13i | 689 | -15 + 19i | 753 | -15 + 13i | 817 | -17 - 19i | 881 | -17 - 13i | 945 | -15 - 19i | 1009 | -15 - 13i |
| 562 | -19 + 17i | 626 | -19 + 15i | 690 | -13 + 17i | 754 | -13 + 15i | 818 | -19 - 17i | 882 | -19 - 15i | 946 | -13 - 17i | 1010 | -13 - 15i |
| 563 | -19 + 19i | 627 | -19 + 13i | 691 | -13 + 19i | 755 | -13 + 13i | 819 | -19 - 19i | 883 | -19 - 13i | 947 | -13 - 19i | 1011 | -13 - 13i |
| 564 | -17 + 23i | 628 | -17 + 9i | 692 | -15 + 23i | 756 | -15 + 9i | 820 | -17 - 23i | 884 | -17 - 9i | 948 | -15 - 23i | 1012 | -15 - 9i |
| 565 | -17 + 21i | 629 | -17 + 11i | 693 | -15 + 21i | 757 | -15 + 11i | 821 | -17 - 21i | 885 | -17 - 11i | 949 | -15 - 21i | 1013 | -15 - 11i |
| 566 | -19 + 23i | 630 | -19 + 9i | 694 | -13 + 23i | 758 | -13 + 9i | 822 | -19 - 23i | 886 | -19 - 9i | 950 | -13 - 23i | 1014 | -13 - 9i |
| 567 | -19 + 21i | 631 | -19 + 11i | 695 | -13 + 21i | 759 | -13 + 11i | 823 | -19 - 21i | 887 | -19 - 11i | 951 | -13 - 21i | 1015 | -13 - 11i |
| 568 | -23 + 17i | 632 | -23 + 15i | 696 | -9 + 17i | 760 | -9 + 15i | 824 | -23 - 17i | 888 | -23 - 15i | 952 | -9 - 17i | 1016 | -9 - 15i |
| 569 | -23 + 19i | 633 | -23 + 13i | 697 | -9 + 19i | 761 | -9 + 13i | 825 | -23 - 19i | 889 | -23 - 13i | 953 | -9 - 19i | 1017 | -9 - 13i |
| 570 | -21 + 17i | 634 | -21 + 15i | 698 | -11 + 17i | 762 | -11 + 15i | 826 | -21 - 17i | 890 | -21 - 15i | 954 | -11 - 17i | 1018 | -11 - 15i |
| 571 | -21 + 19i | 635 | -21 + 13i | 699 | -11 + 19i | 763 | -11 + 13i | 827 | -21 - 19i | 891 | -21 - 13i | 955 | -11 - 19i | 1019 | -11 - 13i |
| 572 | -23 + 23i | 636 | -23 + 9i | 700 | -9 + 23i | 764 | -9 + 9i | 828 | -23 - 23i | 892 | -23 - 9i | 956 | -9 - 23i | 1020 | -9 - 9i |
| 573 | -23 + 21i | 637 | -23 + 11i | 701 | -9 + 21i | 765 | -9 + 11i | 829 | -23 - 21i | 893 | -23 - 11i | 957 | -9 - 21i | 1021 | -9 - 11i |
| 574 | -21 + 23i | 638 | -21 + 9i | 702 | -11 + 23i | 766 | -11 + 9i | 830 | -21 - 23i | 894 | -21 - 9i | 958 | -11 - 23i | 1022 | -11 - 9i |
| 575 | -21 + 21i | 639 | -21 + 11i | 703 | -11 + 21i | 767 | -11 + 11i | 831 | -21 - 21i | 895 | -21 - 11i | 959 | -11 - 21i | 1023 | -11 - 11i |

Fig. 16

| Value | Scatter | Value | Scatter | Value | Scatter | Value | Scatter | Value | Scatter | Value | Scatter | Value | Scatter |
|---|---|---|---|---|---|---|---|---|---|---|---|---|---|
| 0 | 65 + 1i | 64 | 63 + 33i | 128 | 33 + 63i | 192 | 33 + 33i | 256 | 63 + 1i | 320 | 63 + 31i | 384 | 33 + 1i | 448 | 33 + 31i |
| 1 | 65 + 3i | 65 | 65 + 29i | 129 | 33 + 61i | 193 | 33 + 35i | 257 | 63 + 3i | 321 | 63 + 29i | 385 | 33 + 3i | 449 | 33 + 29i |
| 2 | 3 + 65i | 66 | 61 + 33i | 130 | 29 + 65i | 194 | 35 + 33i | 258 | 61 + 1i | 322 | 61 + 31i | 386 | 35 + 1i | 450 | 35 + 31i |
| 3 | 67 + 3i | 67 | 61 + 35i | 131 | 35 + 61i | 195 | 35 + 35i | 259 | 61 + 3i | 323 | 61 + 29i | 387 | 35 + 3i | 451 | 35 + 29i |
| 4 | 65 + 7i | 68 | 65 + 25i | 132 | 33 + 57i | 196 | 33 + 39i | 260 | 63 + 7i | 324 | 63 + 25i | 388 | 33 + 7i | 452 | 33 + 25i |
| 5 | 65 + 5i | 69 | 65 + 27i | 133 | 33 + 59i | 197 | 33 + 37i | 261 | 63 + 5i | 325 | 63 + 27i | 389 | 33 + 5i | 453 | 33 + 27i |
| 6 | 67 + 7i | 70 | 67 + 25i | 134 | 35 + 57i | 198 | 35 + 39i | 262 | 61 + 7i | 326 | 61 + 25i | 390 | 35 + 7i | 454 | 35 + 25i |
| 7 | 67 + 5i | 71 | 61 + 37i | 135 | 35 + 59i | 199 | 35 + 37i | 263 | 61 + 5i | 327 | 61 + 27i | 391 | 35 + 5i | 455 | 35 + 27i |
| 8 | 7 + 65i | 72 | 57 + 33i | 136 | 25 + 65i | 200 | 39 + 33i | 264 | 57 + 1i | 328 | 57 + 31i | 392 | 39 + 1i | 456 | 39 + 31i |
| 9 | 7 + 67i | 73 | 57 + 35i | 137 | 25 + 67i | 201 | 39 + 35i | 265 | 57 + 3i | 329 | 57 + 29i | 393 | 39 + 3i | 457 | 39 + 29i |
| 10 | 5 + 65i | 74 | 59 + 33i | 138 | 27 + 65i | 202 | 37 + 33i | 266 | 59 + 1i | 330 | 59 + 31i | 394 | 37 + 1i | 458 | 37 + 31i |
| 11 | 5 + 67i | 75 | 59 + 35i | 139 | 27 + 67i | 203 | 37 + 35i | 267 | 59 + 3i | 331 | 59 + 29i | 395 | 37 + 3i | 459 | 37 + 29i |
| 12 | 7 + 71i | 76 | 57 + 39i | 140 | 25 + 57i | 204 | 39 + 39i | 268 | 57 + 7i | 332 | 57 + 25i | 396 | 39 + 7i | 460 | 39 + 25i |
| 13 | 7 + 69i | 77 | 57 + 37i | 141 | 25 + 59i | 205 | 39 + 37i | 269 | 57 + 5i | 333 | 57 + 27i | 397 | 39 + 5i | 461 | 39 + 27i |
| 14 | 5 + 71i | 78 | 59 + 39i | 142 | 27 + 57i | 206 | 37 + 39i | 270 | 59 + 7i | 334 | 59 + 25i | 398 | 37 + 7i | 462 | 37 + 25i |
| 15 | 5 + 69i | 79 | 59 + 37i | 143 | 27 + 59i | 207 | 37 + 37i | 271 | 59 + 5i | 335 | 59 + 27i | 399 | 37 + 5i | 463 | 37 + 27i |
| 16 | 15 + 65i | 80 | 65 + 17i | 144 | 33 + 49i | 208 | 33 + 47i | 272 | 63 + 15i | 336 | 63 + 17i | 400 | 33 + 15i | 464 | 33 + 17i |
| 17 | 13 + 65i | 81 | 65 + 19i | 145 | 33 + 51i | 209 | 33 + 45i | 273 | 63 + 13i | 337 | 63 + 19i | 401 | 33 + 13i | 465 | 33 + 19i |
| 18 | 15 + 67i | 82 | 67 + 17i | 146 | 35 + 49i | 210 | 35 + 47i | 274 | 61 + 15i | 338 | 61 + 17i | 402 | 35 + 15i | 466 | 35 + 17i |
| 19 | 13 + 67i | 83 | 67 + 19i | 147 | 35 + 51i | 211 | 35 + 45i | 275 | 61 + 13i | 339 | 61 + 19i | 403 | 35 + 13i | 467 | 35 + 19i |
| 20 | 9 + 65i | 84 | 65 + 23i | 148 | 33 + 55i | 212 | 33 + 41i | 276 | 63 + 9i | 340 | 63 + 23i | 404 | 33 + 9i | 468 | 33 + 23i |
| 21 | 11 + 65i | 85 | 65 + 21i | 149 | 33 + 53i | 213 | 33 + 43i | 277 | 63 + 11i | 341 | 63 + 21i | 405 | 33 + 11i | 469 | 33 + 21i |
| 22 | 9 + 67i | 86 | 67 + 23i | 150 | 35 + 55i | 214 | 35 + 41i | 278 | 61 + 11i | 342 | 61 + 23i | 406 | 35 + 9i | 470 | 35 + 23i |
| 23 | 11 + 67i | 87 | 67 + 21i | 151 | 35 + 53i | 215 | 35 + 43i | 279 | 61 + 11i | 343 | 61 + 21i | 407 | 35 + 11i | 471 | 35 + 21i |
| 24 | 15 + 71i | 88 | 71 + 17i | 152 | 39 + 49i | 216 | 39 + 47i | 280 | 57 + 15i | 344 | 57 + 17i | 408 | 39 + 15i | 472 | 39 + 17i |
| 25 | 13 + 71i | 89 | 57 + 45i | 153 | 39 + 51i | 217 | 39 + 45i | 281 | 57 + 13i | 345 | 57 + 19i | 409 | 39 + 13i | 473 | 39 + 19i |
| 26 | 15 + 69i | 90 | 69 + 17i | 154 | 37 + 49i | 218 | 37 + 47i | 282 | 59 + 15i | 346 | 59 + 17i | 410 | 37 + 15i | 474 | 37 + 17i |
| 27 | 13 + 69i | 91 | 69 + 19i | 155 | 37 + 51i | 219 | 37 + 45i | 283 | 59 + 13i | 347 | 59 + 19i | 411 | 37 + 13i | 475 | 37 + 19i |
| 28 | 9 + 71i | 92 | 57 + 41i | 156 | 39 + 55i | 220 | 39 + 41i | 284 | 57 + 9i | 348 | 57 + 23i | 412 | 39 + 9i | 476 | 39 + 23i |
| 29 | 11 + 71i | 93 | 57 + 43i | 157 | 39 + 53i | 221 | 39 + 43i | 285 | 57 + 11i | 349 | 57 + 21i | 413 | 39 + 11i | 477 | 39 + 21i |
| 30 | 9 + 69i | 94 | 59 + 41i | 158 | 37 + 55i | 222 | 37 + 41i | 286 | 59 + 9i | 350 | 59 + 23i | 414 | 37 + 9i | 478 | 37 + 23i |

| Value | Scatter | Value | Scatter | Value | Scatter | Value | Scatter | Value | Scatter | Value | Scatter | Value | Scatter | Value | Scatter |
|---|---|---|---|---|---|---|---|---|---|---|---|---|---|---|---|
| 512 | 1 + 63i | 576 | 1 + 33i | 640 | 31 + 63i | 704 | 31 + 33i | 768 | 1 + 1i | 832 | 1 + 31i | 896 | 31 + 1i | 960 | 31 + 31i |
| 513 | 1 + 61i | 577 | 1 + 35i | 641 | 31 + 61i | 705 | 31 + 35i | 769 | 1 + 3i | 833 | 1 + 29i | 897 | 31 + 3i | 961 | 31 + 29i |
| 514 | 3 + 63i | 578 | 3 + 33i | 642 | 29 + 63i | 706 | 29 + 33i | 770 | 3 + 1i | 834 | 3 + 31i | 898 | 29 + 1i | 962 | 29 + 31i |
| 515 | 3 + 61i | 579 | 3 + 35i | 643 | 29 + 61i | 707 | 29 + 35i | 771 | 3 + 3i | 835 | 3 + 29i | 899 | 29 + 3i | 963 | 29 + 29i |
| 516 | 1 + 57i | 580 | 1 + 39i | 644 | 31 + 57i | 708 | 31 + 39i | 772 | 1 + 7i | 836 | 1 + 25i | 900 | 31 + 7i | 964 | 31 + 25i |
| 517 | 1 + 59i | 581 | 1 + 37i | 645 | 31 + 59i | 709 | 31 + 37i | 773 | 1 + 5i | 837 | 1 + 27i | 901 | 31 + 5i | 965 | 31 + 27i |
| 518 | 3 + 57i | 582 | 3 + 39i | 646 | 29 + 57i | 710 | 29 + 39i | 774 | 3 + 7i | 838 | 3 + 25i | 902 | 29 + 7i | 966 | 29 + 25i |
| 519 | 3 + 59i | 583 | 3 + 37i | 647 | 29 + 59i | 711 | 29 + 37i | 775 | 3 + 5i | 839 | 3 + 27i | 903 | 29 + 5i | 967 | 29 + 27i |
| 520 | 7 + 63i | 584 | 7 + 33i | 648 | 25 + 63i | 712 | 25 + 33i | 776 | 7 + 1i | 840 | 7 + 31i | 904 | 25 + 1i | 968 | 25 + 31i |
| 521 | 7 + 61i | 585 | 7 + 35i | 649 | 25 + 61i | 713 | 25 + 35i | 777 | 7 + 3i | 841 | 7 + 29i | 905 | 25 + 3i | 969 | 25 + 29i |
| 522 | 5 + 63i | 586 | 5 + 33i | 650 | 27 + 63i | 714 | 27 + 33i | 778 | 5 + 1i | 842 | 5 + 31i | 906 | 27 + 1i | 970 | 27 + 31i |
| 523 | 5 + 61i | 587 | 5 + 35i | 651 | 27 + 61i | 715 | 27 + 35i | 779 | 5 + 3i | 843 | 5 + 29i | 907 | 27 + 3i | 971 | 27 + 29i |
| 524 | 7 + 57i | 588 | 7 + 39i | 652 | 25 + 57i | 716 | 25 + 39i | 780 | 7 + 7i | 844 | 7 + 25i | 908 | 25 + 7i | 972 | 25 + 25i |
| 525 | 7 + 59i | 589 | 7 + 37i | 653 | 25 + 59i | 717 | 25 + 37i | 781 | 7 + 5i | 845 | 7 + 27i | 909 | 25 + 5i | 973 | 25 + 27i |
| 526 | 5 + 57i | 590 | 5 + 39i | 654 | 27 + 57i | 718 | 27 + 39i | 782 | 5 + 7i | 846 | 5 + 25i | 910 | 27 + 7i | 974 | 27 + 25i |
| 527 | 5 + 59i | 591 | 5 + 37i | 655 | 27 + 59i | 719 | 27 + 37i | 783 | 5 + 5i | 847 | 5 + 27i | 911 | 27 + 5i | 975 | 27 + 27i |
| 528 | 1 + 49i | 592 | 1 + 47i | 656 | 31 + 49i | 720 | 31 + 47i | 784 | 1 + 15i | 848 | 1 + 17i | 912 | 31 + 15i | 976 | 31 + 17i |
| 529 | 1 + 51i | 593 | 1 + 45i | 657 | 31 + 51i | 721 | 31 + 45i | 785 | 1 + 13i | 849 | 1 + 19i | 913 | 31 + 13i | 977 | 31 + 19i |
| 530 | 3 + 49i | 594 | 3 + 47i | 658 | 29 + 49i | 722 | 29 + 47i | 786 | 3 + 15i | 850 | 3 + 17i | 914 | 29 + 15i | 978 | 29 + 17i |
| 531 | 3 + 51i | 595 | 3 + 45i | 659 | 29 + 51i | 723 | 29 + 45i | 787 | 3 + 13i | 851 | 3 + 19i | 915 | 29 + 13i | 979 | 29 + 19i |
| 532 | 1 + 55i | 596 | 1 + 41i | 660 | 31 + 55i | 724 | 31 + 41i | 788 | 1 + 9i | 852 | 1 + 23i | 916 | 31 + 9i | 980 | 31 + 23i |
| 533 | 1 + 53i | 597 | 1 + 43i | 661 | 31 + 53i | 725 | 31 + 43i | 789 | 1 + 11i | 853 | 1 + 21i | 917 | 31 + 11i | 981 | 31 + 21i |
| 534 | 3 + 55i | 598 | 3 + 41i | 662 | 29 + 55i | 726 | 29 + 41i | 790 | 3 + 9i | 854 | 3 + 23i | 918 | 29 + 9i | 982 | 29 + 23i |
| 535 | 3 + 53i | 599 | 3 + 43i | 663 | 29 + 53i | 727 | 29 + 43i | 791 | 3 + 11i | 855 | 3 + 21i | 919 | 29 + 11i | 983 | 29 + 21i |
| 536 | 7 + 49i | 600 | 7 + 47i | 664 | 25 + 49i | 728 | 25 + 47i | 792 | 7 + 15i | 856 | 7 + 17i | 920 | 25 + 15i | 984 | 25 + 17i |
| 537 | 7 + 51i | 601 | 7 + 45i | 665 | 25 + 51i | 729 | 25 + 45i | 793 | 7 + 13i | 857 | 7 + 19i | 921 | 25 + 13i | 985 | 25 + 19i |
| 538 | 5 + 49i | 602 | 5 + 47i | 666 | 27 + 49i | 730 | 27 + 47i | 794 | 5 + 15i | 858 | 5 + 17i | 922 | 27 + 15i | 986 | 27 + 17i |
| 539 | 5 + 51i | 603 | 5 + 45i | 667 | 27 + 51i | 731 | 27 + 45i | 795 | 5 + 13i | 859 | 5 + 19i | 923 | 27 + 13i | 987 | 27 + 19i |
| 540 | 7 + 55i | 604 | 7 + 41i | 668 | 25 + 55i | 732 | 25 + 41i | 796 | 7 + 9i | 860 | 7 + 23i | 924 | 25 + 9i | 988 | 25 + 23i |

Fig. 19

| | | | | | | | | | | | | | |
|---|---|---|---|---|---|---|---|---|---|---|---|---|---|
| 541 | 7 + 53i | 605 | 7 + 43i | 669 | 25 + 53i | 733 | 25 + 43i | 797 | 7 + 11i | 861 | 7 + 21i | 925 | 25 + 11i | 989 | 25 + 21i |
| 542 | 5 + 55i | 606 | 5 + 41i | 670 | 27 + 55i | 734 | 27 + 41i | 798 | 5 + 9i | 862 | 5 + 23i | 926 | 27 + 9i | 990 | 27 + 23i |
| 543 | 5 + 53i | 607 | 5 + 43i | 671 | 27 + 53i | 735 | 27 + 43i | 799 | 5 + 11i | 863 | 5 + 21i | 927 | 27 + 11i | 991 | 27 + 21i |
| 544 | 15 + 63i | 608 | 15 + 33i | 672 | 17 + 63i | 736 | 17 + 33i | 800 | 15 + 1i | 864 | 15 + 31i | 928 | 17 + 1i | 992 | 17 + 31i |
| 545 | 15 + 61i | 609 | 15 + 35i | 673 | 17 + 61i | 737 | 17 + 35i | 801 | 15 + 3i | 865 | 15 + 29i | 929 | 17 + 3i | 993 | 17 + 29i |
| 546 | 13 + 63i | 610 | 13 + 33i | 674 | 19 + 63i | 738 | 19 + 33i | 802 | 13 + 1i | 866 | 13 + 31i | 930 | 19 + 1i | 994 | 19 + 31i |
| 547 | 13 + 61i | 611 | 13 + 35i | 675 | 19 + 61i | 739 | 19 + 35i | 803 | 13 + 3i | 867 | 13 + 29i | 931 | 19 + 3i | 995 | 19 + 29i |
| 548 | 15 + 57i | 612 | 15 + 39i | 676 | 17 + 57i | 740 | 17 + 39i | 804 | 15 + 7i | 868 | 15 + 25i | 932 | 17 + 7i | 996 | 17 + 25i |
| 549 | 15 + 59i | 613 | 15 + 37i | 677 | 17 + 59i | 741 | 17 + 37i | 805 | 15 + 5i | 869 | 15 + 27i | 933 | 17 + 5i | 997 | 17 + 27i |
| 550 | 13 + 57i | 614 | 13 + 39i | 678 | 19 + 57i | 742 | 19 + 39i | 806 | 13 + 7i | 870 | 13 + 25i | 934 | 19 + 7i | 998 | 19 + 25i |
| 551 | 13 + 59i | 615 | 13 + 37i | 679 | 19 + 59i | 743 | 19 + 37i | 807 | 13 + 5i | 871 | 13 + 27i | 935 | 19 + 5i | 999 | 19 + 27i |
| 552 | 9 + 63i | 616 | 9 + 33i | 680 | 23 + 63i | 744 | 23 + 33i | 808 | 9 + 1i | 872 | 9 + 31i | 936 | 23 + 1i | 1000 | 23 + 31i |
| 553 | 9 + 61i | 617 | 9 + 35i | 681 | 23 + 61i | 745 | 23 + 35i | 809 | 9 + 3i | 873 | 9 + 29i | 937 | 23 + 3i | 1001 | 23 + 29i |
| 554 | 11 + 63i | 618 | 11 + 33i | 682 | 21 + 63i | 746 | 21 + 33i | 810 | 11 + 1i | 874 | 11 + 31i | 938 | 21 + 1i | 1002 | 21 + 31i |
| 555 | 11 + 61i | 619 | 11 + 35i | 683 | 21 + 61i | 747 | 21 + 35i | 811 | 11 + 3i | 875 | 11 + 29i | 939 | 21 + 3i | 1003 | 21 + 29i |
| 556 | 9 + 57i | 620 | 9 + 39i | 684 | 23 + 57i | 748 | 23 + 39i | 812 | 9 + 7i | 876 | 9 + 25i | 940 | 23 + 7i | 1004 | 23 + 25i |
| 557 | 9 + 59i | 621 | 9 + 37i | 685 | 23 + 59i | 749 | 23 + 37i | 813 | 9 + 5i | 877 | 9 + 27i | 941 | 23 + 5i | 1005 | 23 + 27i |
| 558 | 11 + 57i | 622 | 11 + 39i | 686 | 21 + 57i | 750 | 21 + 39i | 814 | 11 + 7i | 878 | 11 + 25i | 942 | 21 + 7i | 1006 | 21 + 25i |
| 559 | 11 + 59i | 623 | 11 + 37i | 687 | 21 + 59i | 751 | 21 + 37i | 815 | 11 + 5i | 879 | 11 + 27i | 943 | 21 + 5i | 1007 | 21 + 27i |
| 560 | 15 + 49i | 624 | 15 + 47i | 688 | 17 + 49i | 752 | 17 + 47i | 816 | 15 + 15i | 880 | 15 + 17i | 944 | 17 + 15i | 1008 | 17 + 17i |
| 561 | 15 + 51i | 625 | 15 + 45i | 689 | 17 + 51i | 753 | 17 + 45i | 817 | 15 + 13i | 881 | 15 + 19i | 945 | 17 + 13i | 1009 | 17 + 19i |
| 562 | 13 + 49i | 626 | 13 + 47i | 690 | 19 + 49i | 754 | 19 + 47i | 818 | 13 + 15i | 882 | 13 + 17i | 946 | 19 + 15i | 1010 | 19 + 17i |
| 563 | 13 + 51i | 627 | 13 + 45i | 691 | 19 + 51i | 755 | 19 + 45i | 819 | 13 + 13i | 883 | 13 + 19i | 947 | 19 + 13i | 1011 | 19 + 19i |
| 564 | 15 + 55i | 628 | 15 + 41i | 692 | 17 + 55i | 756 | 17 + 41i | 820 | 15 + 9i | 884 | 15 + 23i | 948 | 17 + 9i | 1012 | 17 + 23i |
| 565 | 15 + 53i | 629 | 15 + 43i | 693 | 17 + 53i | 757 | 17 + 43i | 821 | 15 + 11i | 885 | 15 + 21i | 949 | 17 + 11i | 1013 | 17 + 21i |
| 566 | 13 + 55i | 630 | 13 + 41i | 694 | 19 + 55i | 758 | 19 + 41i | 822 | 13 + 9i | 886 | 13 + 23i | 950 | 19 + 9i | 1014 | 19 + 23i |
| 567 | 13 + 53i | 631 | 13 + 43i | 695 | 19 + 53i | 759 | 19 + 43i | 823 | 13 + 11i | 887 | 13 + 21i | 951 | 19 + 11i | 1015 | 19 + 21i |
| 568 | 9 + 49i | 632 | 9 + 47i | 696 | 23 + 49i | 760 | 23 + 47i | 824 | 9 + 15i | 888 | 9 + 17i | 952 | 23 + 15i | 1016 | 23 + 17i |
| 569 | 9 + 51i | 633 | 9 + 45i | 697 | 23 + 51i | 761 | 23 + 45i | 825 | 9 + 13i | 889 | 9 + 19i | 953 | 23 + 13i | 1017 | 23 + 19i |
| 570 | 11 + 49i | 634 | 11 + 47i | 698 | 21 + 49i | 762 | 21 + 47i | 826 | 11 + 15i | 890 | 11 + 17i | 954 | 21 + 15i | 1018 | 21 + 17i |
| 571 | 11 + 51i | 635 | 11 + 45i | 699 | 21 + 51i | 763 | 21 + 45i | 827 | 11 + 13i | 891 | 11 + 19i | 955 | 21 + 13i | 1019 | 21 + 19i |
| 572 | 9 + 55i | 636 | 9 + 41i | 700 | 23 + 55i | 764 | 23 + 41i | 828 | 9 + 9i | 892 | 9 + 23i | 956 | 23 + 9i | 1020 | 23 + 23i |
| 573 | 9 + 53i | 637 | 9 + 43i | 701 | 23 + 53i | 765 | 23 + 43i | 829 | 9 + 11i | 893 | 9 + 21i | 957 | 23 + 11i | 1021 | 23 + 21i |
| 574 | 11 + 55i | 638 | 11 + 41i | 702 | 21 + 55i | 766 | 21 + 41i | 830 | 11 + 9i | 894 | 11 + 23i | 958 | 21 + 9i | 1022 | 21 + 23i |
| 575 | 11 + 53i | 639 | 11 + 43i | 703 | 21 + 53i | 767 | 21 + 43i | 831 | 11 + 11i | 895 | 11 + 21i | 959 | 21 + 11i | 1023 | 21 + 21i |

Fig. 20

| Value | Scatter | Value | Scatter | Value | Scatter | Value | Scatter | Value | Scatter | Value | Scatter | Value | Scatter |
|---|---|---|---|---|---|---|---|---|---|---|---|---|---|
| 1024 | 1 - 65i | 1088 | 63 - 33i | 1152 | 33 - 63i | 1216 | 33 - 33i | 1280 | 63 - 1i | 1344 | 63 - 31i | 1408 | 33 - 1i | 1472 | 33 - 31i |
| 1025 | 65 - 3i | 1089 | 65 - 29i | 1153 | 33 - 61i | 1217 | 33 - 35i | 1281 | 63 - 3i | 1345 | 63 - 29i | 1409 | 33 - 3i | 1473 | 33 - 29i |
| 1026 | 3 - 65i | 1090 | 61 - 33i | 1154 | 29 - 65i | 1218 | 35 - 33i | 1282 | 61 - 1i | 1346 | 61 - 31i | 1410 | 35 - 1i | 1474 | 35 - 31i |
| 1027 | 3 - 67i | 1091 | 61 - 35i | 1155 | 35 - 61i | 1219 | 35 - 35i | 1283 | 61 - 3i | 1347 | 61 - 29i | 1411 | 35 - 3i | 1475 | 35 - 29i |
| 1028 | 65 - 7i | 1092 | 65 - 25i | 1156 | 33 - 57i | 1220 | 33 - 39i | 1284 | 63 - 7i | 1348 | 63 - 25i | 1412 | 33 - 7i | 1476 | 33 - 25i |
| 1029 | 65 - 5i | 1093 | 65 - 27i | 1157 | 33 - 59i | 1221 | 33 - 37i | 1285 | 63 - 5i | 1349 | 63 - 27i | 1413 | 33 - 5i | 1477 | 33 - 27i |
| 1030 | 67 - 7i | 1094 | 67 - 25i | 1158 | 35 - 57i | 1222 | 35 - 39i | 1286 | 61 - 7i | 1350 | 61 - 25i | 1414 | 35 - 7i | 1478 | 35 - 25i |
| 1031 | 67 - 5i | 1095 | 61 - 37i | 1159 | 35 - 59i | 1223 | 35 - 37i | 1287 | 61 - 5i | 1351 | 61 - 27i | 1415 | 35 - 5i | 1479 | 35 - 27i |
| 1032 | 7 - 65i | 1096 | 57 - 33i | 1160 | 25 - 65i | 1224 | 39 - 33i | 1288 | 57 - 1i | 1352 | 57 - 31i | 1416 | 39 - 1i | 1480 | 39 - 31i |
| 1033 | 7 - 67i | 1097 | 57 - 35i | 1161 | 25 - 67i | 1225 | 39 - 35i | 1289 | 57 - 3i | 1353 | 57 - 29i | 1417 | 39 - 3i | 1481 | 39 - 29i |
| 1034 | 5 - 65i | 1098 | 59 - 33i | 1162 | 27 - 65i | 1226 | 37 - 33i | 1290 | 59 - 1i | 1354 | 59 - 31i | 1418 | 37 - 1i | 1482 | 37 - 31i |
| 1035 | 5 - 67i | 1099 | 59 - 35i | 1163 | 37 - 61i | 1227 | 37 - 35i | 1291 | 59 - 3i | 1355 | 59 - 29i | 1419 | 37 - 3i | 1483 | 37 - 29i |
| 1036 | 7 - 71i | 1100 | 57 - 39i | 1164 | 39 - 57i | 1228 | 39 - 39i | 1292 | 57 - 7i | 1356 | 57 - 25i | 1420 | 39 - 7i | 1484 | 39 - 25i |
| 1037 | 7 - 69i | 1101 | 57 - 37i | 1165 | 39 - 59i | 1229 | 39 - 37i | 1293 | 57 - 5i | 1357 | 57 - 27i | 1421 | 39 - 5i | 1485 | 39 - 27i |
| 1038 | 69 - 7i | 1102 | 59 - 39i | 1166 | 37 - 57i | 1230 | 37 - 39i | 1294 | 59 - 7i | 1358 | 59 - 25i | 1422 | 37 - 7i | 1486 | 37 - 25i |
| 1039 | 5 - 69i | 1103 | 59 - 37i | 1167 | 37 - 59i | 1231 | 37 - 37i | 1295 | 59 - 5i | 1359 | 59 - 27i | 1423 | 37 - 5i | 1487 | 37 - 27i |
| 1040 | 65 - 15i | 1104 | 65 - 17i | 1168 | 33 - 49i | 1232 | 33 - 47i | 1296 | 63 - 15i | 1360 | 63 - 17i | 1424 | 33 - 15i | 1488 | 33 - 17i |
| 1041 | 65 - 13i | 1105 | 65 - 19i | 1169 | 33 - 51i | 1233 | 33 - 45i | 1297 | 63 - 13i | 1361 | 63 - 19i | 1425 | 33 - 13i | 1489 | 33 - 19i |
| 1042 | 67 - 15i | 1106 | 67 - 17i | 1170 | 35 - 49i | 1234 | 35 - 47i | 1298 | 61 - 15i | 1362 | 61 - 17i | 1426 | 35 - 15i | 1490 | 35 - 17i |
| 1043 | 67 - 13i | 1107 | 67 - 19i | 1171 | 35 - 51i | 1235 | 35 - 45i | 1299 | 61 - 13i | 1363 | 61 - 19i | 1427 | 35 - 13i | 1491 | 35 - 19i |
| 1044 | 65 - 23i | 1108 | 65 - 23i | 1172 | 33 - 55i | 1236 | 33 - 41i | 1300 | 63 - 9i | 1364 | 63 - 23i | 1428 | 33 - 9i | 1492 | 33 - 23i |
| 1045 | 65 - 21i | 1109 | 65 - 21i | 1173 | 33 - 53i | 1237 | 33 - 43i | 1301 | 63 - 11i | 1365 | 63 - 21i | 1429 | 33 - 11i | 1493 | 33 - 21i |
| 1046 | 67 - 11i | 1110 | 67 - 23i | 1174 | 35 - 55i | 1238 | 35 - 41i | 1302 | 61 - 9i | 1366 | 61 - 23i | 1430 | 35 - 9i | 1494 | 35 - 23i |
| 1047 | 67 - 11i | 1111 | 67 - 21i | 1175 | 35 - 53i | 1239 | 35 - 43i | 1303 | 61 - 11i | 1367 | 61 - 21i | 1431 | 35 - 11i | 1495 | 35 - 17i |
| 1048 | 71 - 15i | 1112 | 57 - 45i | 1176 | 39 - 49i | 1240 | 39 - 47i | 1304 | 57 - 15i | 1368 | 57 - 17i | 1432 | 39 - 15i | 1496 | 39 - 17i |
| 1049 | 71 - 13i | 1113 | 57 - 17i | 1177 | 39 - 51i | 1241 | 39 - 45i | 1305 | 57 - 13i | 1369 | 57 - 19i | 1433 | 39 - 13i | 1497 | 39 - 19i |
| 1050 | 69 - 15i | 1114 | 69 - 17i | 1178 | 37 - 49i | 1242 | 37 - 47i | 1306 | 59 - 15i | 1370 | 59 - 17i | 1434 | 37 - 15i | 1498 | 37 - 17i |
| 1051 | 69 - 13i | 1115 | 69 - 19i | 1179 | 37 - 51i | 1243 | 37 - 45i | 1307 | 59 - 13i | 1371 | 59 - 19i | 1435 | 37 - 13i | 1499 | 37 - 19i |
| 1052 | 71 - 9i | 1116 | 57 - 41i | 1180 | 39 - 55i | 1244 | 39 - 41i | 1308 | 57 - 9i | 1372 | 57 - 23i | 1436 | 39 - 9i | 1500 | 39 - 23i |
| 1053 | 71 - 11i | 1117 | 57 - 43i | 1181 | 39 - 53i | 1245 | 39 - 43i | 1309 | 57 - 11i | 1373 | 57 - 21i | 1437 | 39 - 11i | 1501 | 39 - 21i |
| 1054 | 69 - 9i | 1118 | 59 - 41i | 1182 | 37 - 55i | 1246 | 37 - 41i | 1310 | 59 - 9i | 1374 | 59 - 23i | 1438 | 37 - 9i | 1502 | 37 - 23i |
| 1055 | 69 - 11i | 1119 | 69 - 21i | 1183 | 37 - 53i | 1247 | 37 - 43i | 1311 | 59 - 11i | 1375 | 59 - 21i | 1439 | 37 - 11i | 1503 | 37 - 21i |

Fig. 21

| ID | Value | ID | Value | ID | Value | ID | Value | ID | Value | ID | Value | ID | Value | ID | Value |
|---|---|---|---|---|---|---|---|---|---|---|---|---|---|---|---|
| 1056 | 15 - 65i | 1120 | 49 - 33i | 1184 | 17 - 65i | 1248 | 47 - 33i | 1312 | 49 - 1i | 1376 | 49 - 31i | 1440 | 47 - 1i | 1504 | 47 - 31i |
| 1057 | 15 - 67i | 1121 | 49 - 35i | 1185 | 17 - 67i | 1249 | 47 - 35i | 1313 | 49 - 3i | 1377 | 49 - 29i | 1441 | 47 - 3i | 1505 | 47 - 29i |
| 1058 | 13 - 65i | 1122 | 51 - 33i | 1186 | 19 - 65i | 1250 | 45 - 33i | 1314 | 51 - 1i | 1378 | 51 - 31i | 1442 | 45 - 1i | 1506 | 45 - 31i |
| 1059 | 13 - 67i | 1123 | 51 - 35i | 1187 | 19 - 67i | 1251 | 45 - 35i | 1315 | 51 - 3i | 1379 | 51 - 29i | 1443 | 45 - 3i | 1507 | 45 - 29i |
| 1060 | 15 - 71i | 1124 | 49 - 39i | 1188 | 17 - 71i | 1252 | 47 - 39i | 1316 | 49 - 7i | 1380 | 49 - 25i | 1444 | 47 - 7i | 1508 | 47 - 25i |
| 1061 | 15 - 69i | 1125 | 49 - 37i | 1189 | 17 - 69i | 1253 | 47 - 37i | 1317 | 49 - 5i | 1381 | 49 - 27i | 1445 | 47 - 5i | 1509 | 47 - 27i |
| 1062 | 13 - 71i | 1126 | 51 - 39i | 1190 | 45 - 57i | 1254 | 45 - 39i | 1318 | 51 - 7i | 1382 | 51 - 25i | 1446 | 45 - 7i | 1510 | 45 - 25i |
| 1063 | 13 - 69i | 1127 | 51 - 37i | 1191 | 19 - 69i | 1255 | 45 - 37i | 1319 | 51 - 5i | 1383 | 51 - 27i | 1447 | 45 - 5i | 1511 | 45 - 27i |
| 1064 | 9 - 65i | 1128 | 55 - 33i | 1192 | 23 - 65i | 1256 | 41 - 33i | 1320 | 55 - 1i | 1384 | 55 - 31i | 1448 | 41 - 1i | 1512 | 41 - 31i |
| 1065 | 9 - 67i | 1129 | 55 - 35i | 1193 | 23 - 67i | 1257 | 41 - 35i | 1321 | 55 - 3i | 1385 | 55 - 29i | 1449 | 41 - 3i | 1513 | 41 - 29i |
| 1066 | 11 - 65i | 1130 | 53 - 33i | 1194 | 21 - 65i | 1258 | 43 - 33i | 1322 | 53 - 1i | 1386 | 53 - 31i | 1450 | 43 - 1i | 1514 | 43 - 31i |
| 1067 | 11 - 67i | 1131 | 53 - 35i | 1195 | 21 - 67i | 1259 | 43 - 35i | 1323 | 53 - 3i | 1387 | 53 - 29i | 1451 | 43 - 3i | 1515 | 43 - 29i |
| 1068 | 9 - 71i | 1132 | 55 - 39i | 1196 | 41 - 57i | 1260 | 41 - 39i | 1324 | 55 - 7i | 1388 | 55 - 25i | 1452 | 41 - 7i | 1516 | 41 - 25i |
| 1069 | 9 - 69i | 1133 | 55 - 37i | 1197 | 41 - 59i | 1261 | 41 - 37i | 1325 | 55 - 5i | 1389 | 55 - 27i | 1453 | 41 - 5i | 1517 | 41 - 27i |
| 1070 | 11 - 71i | 1134 | 53 - 39i | 1198 | 43 - 57i | 1262 | 43 - 39i | 1326 | 53 - 7i | 1390 | 53 - 25i | 1454 | 43 - 7i | 1518 | 43 - 25i |
| 1071 | 11 - 69i | 1135 | 53 - 37i | 1199 | 21 - 69i | 1263 | 43 - 37i | 1327 | 53 - 5i | 1391 | 53 - 27i | 1455 | 43 - 5i | 1519 | 43 - 27i |
| 1072 | 49 - 49i | 1136 | 49 - 47i | 1200 | 47 - 49i | 1264 | 47 - 47i | 1328 | 49 - 15i | 1392 | 49 - 17i | 1456 | 47 - 15i | 1520 | 47 - 17i |
| 1073 | 49 - 51i | 1137 | 49 - 45i | 1201 | 47 - 51i | 1265 | 47 - 45i | 1329 | 49 - 13i | 1393 | 49 - 19i | 1457 | 47 - 13i | 1521 | 47 - 19i |
| 1074 | 51 - 49i | 1138 | 51 - 47i | 1202 | 45 - 49i | 1266 | 45 - 47i | 1330 | 51 - 15i | 1394 | 51 - 17i | 1458 | 45 - 15i | 1522 | 45 - 17i |
| 1075 | 51 - 51i | 1139 | 51 - 45i | 1203 | 45 - 51i | 1267 | 45 - 45i | 1331 | 51 - 13i | 1395 | 51 - 19i | 1459 | 45 - 13i | 1523 | 45 - 19i |
| 1076 | 49 - 55i | 1140 | 49 - 41i | 1204 | 47 - 53i | 1268 | 47 - 41i | 1332 | 49 - 9i | 1396 | 49 - 23i | 1460 | 47 - 9i | 1524 | 47 - 23i |
| 1077 | 49 - 53i | 1141 | 51 - 41i | 1205 | 45 - 55i | 1269 | 45 - 41i | 1333 | 51 - 9i | 1397 | 51 - 23i | 1461 | 47 - 11i | 1525 | 47 - 21i |
| 1078 | 13 - 73i | 1142 | 51 - 43i | 1206 | 45 - 53i | 1270 | 45 - 43i | 1334 | 51 - 11i | 1398 | 51 - 21i | 1462 | 45 - 9i | 1526 | 45 - 23i |
| 1079 | 51 - 53i | 1143 | 55 - 41i | 1207 | 41 - 49i | 1271 | 41 - 47i | 1335 | 55 - 11i | 1399 | 51 - 19i | 1463 | 45 - 11i | 1527 | 45 - 21i |
| 1080 | 55 - 49i | 1144 | 55 - 45i | 1208 | 41 - 49i | 1272 | 41 - 45i | 1336 | 55 - 13i | 1400 | 55 - 17i | 1464 | 41 - 15i | 1528 | 41 - 17i |
| 1081 | 73 - 13i | 1145 | 55 - 47i | 1209 | 43 - 51i | 1273 | 43 - 45i | 1337 | 55 - 13i | 1401 | 55 - 19i | 1465 | 41 - 13i | 1529 | 41 - 19i |
| 1082 | 53 - 49i | 1146 | 53 - 47i | 1210 | 43 - 49i | 1274 | 43 - 47i | 1338 | 53 - 15i | 1402 | 53 - 17i | 1466 | 43 - 15i | 1530 | 43 - 19i |
| 1083 | 53 - 51i | 1147 | 53 - 45i | 1211 | 41 - 51i | 1275 | 43 - 45i | 1339 | 53 - 13i | 1403 | 53 - 19i | 1467 | 43 - 13i | 1531 | 43 - 19i |
| 1084 | 9 - 73i | 1148 | 55 - 43i | 1212 | 41 - 55i | 1276 | 41 - 41i | 1340 | 55 - 9i | 1404 | 55 - 23i | 1468 | 41 - 9i | 1532 | 41 - 23i |
| 1085 | 73 - 11i | 1149 | 55 - 43i | 1213 | 41 - 53i | 1277 | 41 - 43i | 1341 | 55 - 11i | 1405 | 55 - 21i | 1469 | 41 - 11i | 1533 | 41 - 21i |
| 1086 | 11 - 73i | 1150 | 53 - 41i | 1214 | 43 - 55i | 1278 | 43 - 41i | 1342 | 53 - 9i | 1406 | 53 - 23i | 1470 | 43 - 9i | 1534 | 43 - 23i |
| 1087 | 53 - 53i | 1151 | 53 - 43i | 1215 | 43 - 53i | 1279 | 43 - 43i | 1343 | 53 - 11i | 1407 | 53 - 21i | 1471 | 43 - 11i | 1535 | 43 - 21i |

Fig. 22

| Value | Scatter | Value | Scatter | Value | Scatter | Value | Scatter | Value | Scatter | Value | Scatter | Value | Scatter |
|---|---|---|---|---|---|---|---|---|---|---|---|---|---|
| 1536 | 1 - 63i | 1600 | 1 - 33i | 1664 | 1 - 33i | 1728 | 31 - 33i | 1792 | 1 - 1i | 1856 | 1 - 31i | 1920 | 31 - 1i | 1984 | 31 - 31i |
| 1537 | 1 - 61i | 1601 | 1 - 35i | 1665 | 1 - 35i | 1729 | 31 - 35i | 1793 | 1 - 3i | 1857 | 1 - 29i | 1921 | 31 - 3i | 1985 | 31 - 29i |
| 1538 | 3 - 63i | 1602 | 3 - 33i | 1666 | 3 - 33i | 1730 | 29 - 33i | 1794 | 3 - 1i | 1858 | 3 - 31i | 1922 | 29 - 1i | 1986 | 29 - 31i |
| 1539 | 3 - 61i | 1603 | 3 - 35i | 1667 | 3 - 35i | 1731 | 29 - 35i | 1795 | 3 - 3i | 1859 | 3 - 29i | 1923 | 29 - 3i | 1987 | 29 - 29i |
| 1540 | 1 - 57i | 1604 | 1 - 39i | 1668 | 1 - 39i | 1732 | 31 - 39i | 1796 | 1 - 7i | 1860 | 1 - 25i | 1924 | 31 - 7i | 1988 | 31 - 25i |
| 1541 | 1 - 59i | 1605 | 1 - 37i | 1669 | 1 - 37i | 1733 | 31 - 37i | 1797 | 1 - 5i | 1861 | 1 - 27i | 1925 | 31 - 5i | 1989 | 31 - 27i |
| 1542 | 3 - 57i | 1606 | 3 - 39i | 1670 | 3 - 39i | 1734 | 29 - 39i | 1798 | 3 - 7i | 1862 | 3 - 25i | 1926 | 29 - 7i | 1990 | 29 - 25i |
| 1543 | 3 - 59i | 1607 | 3 - 37i | 1671 | 3 - 37i | 1735 | 29 - 37i | 1799 | 3 - 5i | 1863 | 3 - 27i | 1927 | 29 - 5i | 1991 | 29 - 27i |
| 1544 | 7 - 63i | 1608 | 7 - 33i | 1672 | 7 - 33i | 1736 | 25 - 33i | 1800 | 7 - 1i | 1864 | 7 - 31i | 1928 | 25 - 1i | 1992 | 25 - 31i |
| 1545 | 7 - 61i | 1609 | 7 - 35i | 1673 | 7 - 35i | 1737 | 25 - 35i | 1801 | 7 - 3i | 1865 | 7 - 29i | 1929 | 25 - 3i | 1993 | 25 - 29i |
| 1546 | 5 - 63i | 1610 | 5 - 33i | 1674 | 5 - 33i | 1738 | 27 - 33i | 1802 | 5 - 1i | 1866 | 5 - 31i | 1930 | 27 - 1i | 1994 | 27 - 31i |
| 1547 | 5 - 61i | 1611 | 5 - 35i | 1675 | 5 - 35i | 1739 | 27 - 35i | 1803 | 5 - 3i | 1867 | 5 - 29i | 1931 | 27 - 3i | 1995 | 27 - 29i |
| 1548 | 7 - 57i | 1612 | 7 - 39i | 1676 | 7 - 39i | 1740 | 25 - 39i | 1804 | 7 - 7i | 1868 | 7 - 25i | 1932 | 25 - 7i | 1996 | 25 - 25i |
| 1549 | 7 - 59i | 1613 | 7 - 37i | 1677 | 7 - 37i | 1741 | 25 - 37i | 1805 | 7 - 5i | 1869 | 7 - 27i | 1933 | 25 - 5i | 1997 | 25 - 27i |
| 1550 | 5 - 57i | 1614 | 5 - 39i | 1678 | 5 - 39i | 1742 | 27 - 39i | 1806 | 5 - 7i | 1870 | 5 - 25i | 1934 | 27 - 7i | 1998 | 27 - 25i |
| 1551 | 5 - 59i | 1615 | 5 - 37i | 1679 | 5 - 37i | 1743 | 27 - 37i | 1807 | 5 - 5i | 1871 | 5 - 27i | 1935 | 27 - 5i | 1999 | 27 - 27i |
| 1552 | 1 - 49i | 1616 | 1 - 47i | 1680 | 1 - 47i | 1744 | 31 - 47i | 1808 | 1 - 15i | 1872 | 1 - 17i | 1936 | 31 - 15i | 2000 | 31 - 17i |
| 1553 | 1 - 51i | 1617 | 1 - 45i | 1681 | 1 - 45i | 1745 | 31 - 45i | 1809 | 1 - 13i | 1873 | 1 - 19i | 1937 | 31 - 13i | 2001 | 31 - 19i |
| 1554 | 3 - 49i | 1618 | 3 - 47i | 1682 | 3 - 47i | 1746 | 29 - 47i | 1810 | 3 - 15i | 1874 | 3 - 17i | 1938 | 29 - 15i | 2002 | 29 - 17i |
| 1555 | 3 - 51i | 1619 | 3 - 45i | 1683 | 3 - 45i | 1747 | 29 - 45i | 1811 | 3 - 13i | 1875 | 3 - 19i | 1939 | 29 - 13i | 2003 | 29 - 19i |
| 1556 | 1 - 55i | 1620 | 1 - 41i | 1684 | 1 - 41i | 1748 | 31 - 41i | 1812 | 1 - 9i | 1876 | 1 - 23i | 1940 | 31 - 9i | 2004 | 31 - 23i |
| 1557 | 1 - 53i | 1621 | 1 - 43i | 1685 | 1 - 43i | 1749 | 31 - 43i | 1813 | 1 - 11i | 1877 | 1 - 21i | 1941 | 31 - 11i | 2005 | 31 - 21i |
| 1558 | 3 - 55i | 1622 | 3 - 41i | 1686 | 3 - 41i | 1750 | 29 - 41i | 1814 | 3 - 9i | 1878 | 3 - 23i | 1942 | 29 - 9i | 2006 | 29 - 23i |
| 1559 | 3 - 53i | 1623 | 3 - 43i | 1687 | 3 - 43i | 1751 | 29 - 43i | 1815 | 3 - 11i | 1879 | 3 - 21i | 1943 | 29 - 11i | 2007 | 29 - 21i |
| 1560 | 7 - 49i | 1624 | 7 - 47i | 1688 | 7 - 47i | 1752 | 25 - 47i | 1816 | 7 - 15i | 1880 | 7 - 17i | 1944 | 25 - 15i | 2008 | 25 - 17i |
| 1561 | 7 - 51i | 1625 | 7 - 45i | 1689 | 7 - 45i | 1753 | 25 - 45i | 1817 | 7 - 13i | 1881 | 7 - 19i | 1945 | 25 - 13i | 2009 | 25 - 19i |
| 1562 | 5 - 49i | 1626 | 5 - 47i | 1690 | 5 - 47i | 1754 | 27 - 47i | 1818 | 5 - 15i | 1882 | 5 - 17i | 1946 | 27 - 15i | 2010 | 27 - 17i |
| 1563 | 5 - 51i | 1627 | 5 - 45i | 1691 | 5 - 45i | 1755 | 27 - 45i | 1819 | 5 - 13i | 1883 | 5 - 19i | 1947 | 27 - 13i | 2011 | 27 - 19i |
| 1564 | 7 - 55i | 1628 | 7 - 41i | 1692 | 7 - 41i | 1756 | 25 - 41i | 1820 | 7 - 9i | 1884 | 7 - 23i | 1948 | 25 - 9i | 2012 | 25 - 23i |
| 1565 | 7 - 53i | 1629 | 7 - 43i | 1693 | 7 - 43i | 1757 | 25 - 43i | 1821 | 7 - 11i | 1885 | 7 - 21i | 1949 | 25 - 11i | 2013 | 25 - 21i |
| 1566 | 5 - 55i | 1630 | 5 - 41i | 1694 | 5 - 41i | 1758 | 27 - 41i | 1822 | 5 - 9i | 1886 | 5 - 23i | 1950 | 27 - 9i | 2014 | 27 - 23i |
| 1567 | 5 - 53i | 1631 | 5 - 43i | 1695 | 5 - 43i | 1759 | 27 - 43i | 1823 | 5 - 11i | 1887 | 5 - 21i | 1951 | 27 - 11i | 2015 | 27 - 21i |
| 1568 | 15 - 63i | 1632 | 15 - 33i | 1696 | 15 - 33i | 1760 | 17 - 33i | 1824 | 15 - 1i | 1888 | 15 - 31i | 1952 | 17 - 1i | 2016 | 17 - 31i |
| 1569 | 15 - 61i | 1633 | 15 - 35i | 1697 | 15 - 35i | 1761 | 17 - 35i | 1825 | 15 - 3i | 1889 | 15 - 29i | 1953 | 17 - 3i | 2017 | 17 - 29i |
| 1570 | 13 - 63i | 1634 | 13 - 33i | 1698 | 13 - 33i | 1762 | 19 - 33i | 1826 | 13 - 1i | 1890 | 13 - 31i | 1954 | 19 - 1i | 2018 | 19 - 31i |

Fig. 23

| | | | | | | | | | | | |
|---|---|---|---|---|---|---|---|---|---|---|---|
| 1571 | 13 - 61i | 1635 | 13 - 35i | 1699 | 19 - 61i | 1763 | 19 - 35i | 1827 | 13 - 3i | 1891 | 13 - 29i | 1955 | 19 - 3i | 2019 | 19 - 29i |
| 1572 | 15 - 57i | 1636 | 15 - 39i | 1700 | 17 - 57i | 1764 | 17 - 39i | 1828 | 15 - 7i | 1892 | 15 - 25i | 1956 | 17 - 7i | 2020 | 17 - 25i |
| 1573 | 15 - 59i | 1637 | 15 - 37i | 1701 | 17 - 59i | 1765 | 17 - 37i | 1829 | 15 - 5i | 1893 | 15 - 27i | 1957 | 17 - 5i | 2021 | 17 - 27i |
| 1574 | 13 - 57i | 1638 | 13 - 39i | 1702 | 19 - 59i | 1766 | 19 - 39i | 1830 | 13 - 7i | 1894 | 13 - 25i | 1958 | 19 - 7i | 2022 | 19 - 25i |
| 1575 | 13 - 59i | 1639 | 13 - 37i | 1703 | 19 - 57i | 1767 | 19 - 37i | 1831 | 13 - 5i | 1895 | 13 - 27i | 1959 | 19 - 5i | 2023 | 19 - 27i |
| 1576 | 9 - 63i | 1640 | 9 - 33i | 1704 | 23 - 63i | 1768 | 23 - 33i | 1832 | 9 - 1i | 1896 | 9 - 31i | 1960 | 23 - 1i | 2024 | 23 - 31i |
| 1577 | 9 - 61i | 1641 | 9 - 35i | 1705 | 23 - 61i | 1769 | 23 - 35i | 1833 | 9 - 3i | 1897 | 9 - 29i | 1961 | 23 - 3i | 2025 | 23 - 29i |
| 1578 | 11 - 63i | 1642 | 11 - 33i | 1706 | 21 - 63i | 1770 | 21 - 33i | 1834 | 11 - 1i | 1898 | 11 - 31i | 1962 | 21 - 1i | 2026 | 21 - 31i |
| 1579 | 11 - 61i | 1643 | 11 - 35i | 1707 | 21 - 61i | 1771 | 21 - 35i | 1835 | 11 - 3i | 1899 | 11 - 29i | 1963 | 21 - 3i | 2027 | 21 - 29i |
| 1580 | 9 - 57i | 1644 | 9 - 39i | 1708 | 23 - 57i | 1772 | 23 - 39i | 1836 | 9 - 7i | 1900 | 9 - 25i | 1964 | 23 - 7i | 2028 | 23 - 25i |
| 1581 | 9 - 59i | 1645 | 9 - 37i | 1709 | 23 - 59i | 1773 | 23 - 37i | 1837 | 9 - 5i | 1901 | 9 - 27i | 1965 | 23 - 5i | 2029 | 23 - 27i |
| 1582 | 11 - 57i | 1646 | 11 - 39i | 1710 | 21 - 57i | 1774 | 21 - 39i | 1838 | 11 - 7i | 1902 | 11 - 25i | 1966 | 21 - 7i | 2030 | 21 - 25i |
| 1583 | 11 - 59i | 1647 | 11 - 37i | 1711 | 21 - 59i | 1775 | 21 - 37i | 1839 | 11 - 5i | 1903 | 11 - 27i | 1967 | 21 - 5i | 2031 | 21 - 27i |
| 1584 | 15 - 49i | 1648 | 15 - 47i | 1712 | 17 - 49i | 1776 | 17 - 47i | 1840 | 15 - 15i | 1904 | 15 - 17i | 1968 | 17 - 15i | 2032 | 17 - 17i |
| 1585 | 15 - 51i | 1649 | 15 - 45i | 1713 | 17 - 51i | 1777 | 17 - 45i | 1841 | 15 - 13i | 1905 | 15 - 19i | 1969 | 17 - 13i | 2033 | 17 - 19i |
| 1586 | 13 - 49i | 1650 | 13 - 47i | 1714 | 19 - 49i | 1778 | 19 - 47i | 1842 | 13 - 15i | 1906 | 13 - 17i | 1970 | 19 - 15i | 2034 | 19 - 17i |
| 1587 | 13 - 51i | 1651 | 13 - 45i | 1715 | 19 - 51i | 1779 | 19 - 45i | 1843 | 13 - 13i | 1907 | 13 - 19i | 1971 | 19 - 13i | 2035 | 19 - 19i |
| 1588 | 15 - 53i | 1652 | 15 - 41i | 1716 | 17 - 53i | 1780 | 17 - 41i | 1844 | 15 - 9i | 1908 | 15 - 21i | 1972 | 17 - 9i | 2036 | 17 - 21i |
| 1589 | 15 - 55i | 1653 | 15 - 43i | 1717 | 17 - 55i | 1781 | 17 - 43i | 1845 | 15 - 11i | 1909 | 15 - 23i | 1973 | 17 - 11i | 2037 | 17 - 23i |
| 1590 | 13 - 53i | 1654 | 13 - 41i | 1718 | 19 - 53i | 1782 | 19 - 41i | 1846 | 13 - 9i | 1910 | 13 - 21i | 1974 | 19 - 9i | 2038 | 19 - 21i |
| 1591 | 13 - 55i | 1655 | 13 - 43i | 1719 | 19 - 55i | 1783 | 19 - 43i | 1847 | 13 - 11i | 1911 | 13 - 23i | 1975 | 19 - 11i | 2039 | 19 - 23i |
| 1592 | 9 - 49i | 1656 | 9 - 47i | 1720 | 23 - 49i | 1784 | 23 - 47i | 1848 | 9 - 15i | 1912 | 9 - 17i | 1976 | 23 - 15i | 2040 | 23 - 17i |
| 1593 | 9 - 51i | 1657 | 9 - 45i | 1721 | 23 - 51i | 1785 | 23 - 45i | 1849 | 9 - 13i | 1913 | 9 - 19i | 1977 | 23 - 13i | 2041 | 23 - 19i |
| 1594 | 11 - 49i | 1658 | 11 - 47i | 1722 | 21 - 49i | 1786 | 21 - 47i | 1850 | 11 - 15i | 1914 | 11 - 17i | 1978 | 21 - 15i | 2042 | 21 - 17i |
| 1595 | 11 - 51i | 1659 | 11 - 45i | 1723 | 21 - 51i | 1787 | 21 - 45i | 1851 | 11 - 13i | 1915 | 11 - 19i | 1979 | 21 - 13i | 2043 | 21 - 19i |
| 1596 | 9 - 55i | 1660 | 9 - 41i | 1724 | 23 - 55i | 1788 | 23 - 41i | 1852 | 9 - 9i | 1916 | 9 - 23i | 1980 | 23 - 9i | 2044 | 23 - 23i |
| 1597 | 9 - 53i | 1661 | 9 - 43i | 1725 | 23 - 53i | 1789 | 23 - 43i | 1853 | 9 - 11i | 1917 | 9 - 21i | 1981 | 23 - 11i | 2045 | 23 - 21i |
| 1598 | 11 - 55i | 1662 | 11 - 41i | 1726 | 21 - 55i | 1790 | 21 - 41i | 1854 | 11 - 9i | 1918 | 11 - 23i | 1982 | 21 - 9i | 2046 | 21 - 23i |
| 1599 | 11 - 53i | 1663 | 11 - 43i | 1727 | 21 - 53i | 1791 | 21 - 43i | 1855 | 11 - 11i | 1919 | 11 - 21i | 1983 | 21 - 11i | 2047 | 21 - 21i |

Fig. 24

| Value | Scatter | Value | Scatter | Value | Scatter | Value | Scatter | Value | Scatter | Value | Scatter | Value | Scatter |
|---|---|---|---|---|---|---|---|---|---|---|---|---|---|
| 2048 | -1 + 65i | 2112 | -63 + 33i | 2176 | -33 + 63i | 2240 | -33 + 33i | 2304 | -63 + 11i | 2368 | -63 + 31i | 2432 | -33 + 11i | 2496 | -33 + 31i |
| 2049 | -65 + 3i | 2113 | -65 + 29i | 2177 | -33 + 61i | 2241 | -33 + 35i | 2305 | -63 + 3i | 2369 | -63 + 29i | 2433 | -33 + 3i | 2497 | -33 + 29i |
| 2050 | -3 + 65i | 2114 | -61 + 33i | 2178 | -29 + 65i | 2242 | -35 + 33i | 2306 | -61 + 1i | 2370 | -61 + 31i | 2434 | -35 + 1i | 2498 | -35 + 31i |
| 2051 | -3 + 67i | 2115 | -61 + 35i | 2179 | -35 + 61i | 2243 | -35 + 35i | 2307 | -61 + 3i | 2371 | -61 + 29i | 2435 | -35 + 3i | 2499 | -35 + 29i |
| 2052 | -65 + 7i | 2116 | -65 + 25i | 2180 | -33 + 57i | 2244 | -33 + 39i | 2308 | -63 + 7i | 2372 | -63 + 25i | 2436 | -33 + 7i | 2500 | -33 + 25i |
| 2053 | -65 + 5i | 2117 | -65 + 27i | 2181 | -33 + 59i | 2245 | -33 + 37i | 2309 | -63 + 5i | 2373 | -63 + 27i | 2437 | -33 + 5i | 2501 | -33 + 27i |
| 2054 | -67 + 7i | 2118 | -67 + 25i | 2182 | -35 + 57i | 2246 | -35 + 39i | 2310 | -61 + 7i | 2374 | -61 + 25i | 2438 | -35 + 7i | 2502 | -35 + 25i |
| 2055 | -67 + 5i | 2119 | -61 + 37i | 2183 | -35 + 59i | 2247 | -35 + 37i | 2311 | -61 + 5i | 2375 | -61 + 27i | 2439 | -35 + 5i | 2503 | -35 + 27i |
| 2056 | -7 + 65i | 2120 | -57 + 33i | 2184 | -25 + 65i | 2248 | -39 + 33i | 2312 | -57 + 1i | 2376 | -57 + 31i | 2440 | -39 + 1i | 2504 | -39 + 31i |
| 2057 | -7 + 67i | 2121 | -57 + 35i | 2185 | -25 + 67i | 2249 | -39 + 35i | 2313 | -57 + 3i | 2377 | -57 + 29i | 2441 | -39 + 3i | 2505 | -39 + 29i |
| 2058 | -5 + 65i | 2122 | -59 + 33i | 2186 | -27 + 65i | 2250 | -37 + 33i | 2314 | -59 + 1i | 2378 | -59 + 31i | 2442 | -37 + 1i | 2506 | -37 + 31i |
| 2059 | -5 + 67i | 2123 | -59 + 35i | 2187 | -37 + 61i | 2251 | -37 + 35i | 2315 | -59 + 3i | 2379 | -59 + 29i | 2443 | -37 + 3i | 2507 | -37 + 29i |
| 2060 | -7 + 71i | 2124 | -57 + 39i | 2188 | -39 + 57i | 2252 | -39 + 39i | 2316 | -57 + 7i | 2380 | -57 + 25i | 2444 | -39 + 7i | 2508 | -39 + 25i |
| 2061 | -7 + 69i | 2125 | -57 + 37i | 2189 | -39 + 59i | 2253 | -39 + 37i | 2317 | -57 + 5i | 2381 | -57 + 27i | 2445 | -39 + 5i | 2509 | -39 + 27i |
| 2062 | -69 + 7i | 2126 | -59 + 39i | 2190 | -37 + 57i | 2254 | -37 + 39i | 2318 | -59 + 7i | 2382 | -59 + 25i | 2446 | -37 + 7i | 2510 | -37 + 25i |
| 2063 | -5 + 69i | 2127 | -59 + 37i | 2191 | -37 + 59i | 2255 | -37 + 37i | 2319 | -59 + 5i | 2383 | -59 + 27i | 2447 | -37 + 5i | 2511 | -37 + 27i |
| 2064 | -65 + 15i | 2128 | -65 + 17i | 2192 | -33 + 49i | 2256 | -33 + 47i | 2320 | -63 + 15i | 2384 | -63 + 17i | 2448 | -33 + 15i | 2512 | -33 + 17i |
| 2065 | -65 + 13i | 2129 | -65 + 19i | 2193 | -33 + 51i | 2257 | -33 + 45i | 2321 | -63 + 13i | 2385 | -63 + 19i | 2449 | -33 + 13i | 2513 | -33 + 19i |
| 2066 | -67 + 15i | 2130 | -67 + 17i | 2194 | -35 + 49i | 2258 | -35 + 47i | 2322 | -61 + 15i | 2386 | -61 + 17i | 2450 | -35 + 15i | 2514 | -35 + 17i |
| 2067 | -67 + 13i | 2131 | -67 + 19i | 2195 | -35 + 51i | 2259 | -35 + 45i | 2323 | -61 + 13i | 2387 | -61 + 19i | 2451 | -35 + 13i | 2515 | -35 + 19i |
| 2068 | -65 + 9i | 2132 | -65 + 23i | 2196 | -33 + 55i | 2260 | -33 + 41i | 2324 | -63 + 9i | 2388 | -63 + 23i | 2452 | -33 + 9i | 2516 | -33 + 23i |
| 2069 | -65 + 11i | 2133 | -65 + 21i | 2197 | -33 + 53i | 2261 | -33 + 43i | 2325 | -63 + 11i | 2389 | -63 + 21i | 2453 | -33 + 11i | 2517 | -33 + 21i |
| 2070 | -67 + 9i | 2134 | -67 + 23i | 2198 | -35 + 55i | 2262 | -35 + 41i | 2326 | -61 + 9i | 2390 | -61 + 23i | 2454 | -35 + 9i | 2518 | -35 + 23i |
| 2071 | -67 + 11i | 2135 | -67 + 21i | 2199 | -35 + 53i | 2263 | -35 + 43i | 2327 | -61 + 11i | 2391 | -61 + 21i | 2455 | -35 + 11i | 2519 | -35 + 21i |
| 2072 | -71 + 15i | 2136 | -57 + 45i | 2200 | -39 + 49i | 2264 | -39 + 47i | 2328 | -57 + 15i | 2392 | -57 + 17i | 2456 | -39 + 15i | 2520 | -39 + 17i |
| 2073 | -71 + 13i | 2137 | -57 + 47i | 2201 | -39 + 51i | 2265 | -39 + 45i | 2329 | -57 + 13i | 2393 | -57 + 19i | 2457 | -39 + 13i | 2521 | -39 + 19i |
| 2074 | -69 + 15i | 2138 | -69 + 17i | 2202 | -37 + 49i | 2266 | -37 + 47i | 2330 | -59 + 15i | 2394 | -59 + 17i | 2458 | -37 + 15i | 2522 | -37 + 17i |
| 2075 | -69 + 13i | 2139 | -69 + 19i | 2203 | -37 + 51i | 2267 | -37 + 45i | 2331 | -59 + 13i | 2395 | -59 + 19i | 2459 | -37 + 13i | 2523 | -37 + 19i |
| 2076 | -71 + 9i | 2140 | -57 + 41i | 2204 | -39 + 55i | 2268 | -39 + 41i | 2332 | -57 + 9i | 2396 | -57 + 23i | 2460 | -39 + 9i | 2524 | -39 + 23i |
| 2077 | -71 + 11i | 2141 | -57 + 43i | 2205 | -39 + 53i | 2269 | -39 + 43i | 2333 | -57 + 11i | 2397 | -57 + 21i | 2461 | -39 + 11i | 2525 | -39 + 21i |
| 2078 | -69 + 9i | 2142 | -59 + 41i | 2206 | -37 + 55i | 2270 | -37 + 41i | 2334 | -59 + 9i | 2398 | -59 + 23i | 2462 | -37 + 9i | 2526 | -37 + 23i |
| 2079 | -69 + 11i | 2143 | -69 + 21i | 2207 | -37 + 53i | 2271 | -37 + 43i | 2335 | -59 + 11i | 2399 | -59 + 21i | 2463 | -37 + 11i | 2527 | -37 + 21i |
| 2080 | -15 + 65i | 2144 | -49 + 33i | 2208 | -17 + 65i | 2272 | -47 + 33i | 2336 | -49 + 1i | 2400 | -49 + 31i | 2464 | -47 + 1i | 2528 | -47 + 31i |

Fig. 25

| | | | | | | | | | | |
|---|---|---|---|---|---|---|---|---|---|---|
| 2081 | -15 + 67i | 2145 | -49 + 35i | 2209 | -17 + 67i | 2273 | -47 + 35i | 2337 | -49 + 3i | 2401 | -49 + 29i | 2465 | -47 + 3i | 2529 | -47 + 29i |
| 2082 | -13 + 65i | 2146 | -51 + 33i | 2210 | -19 + 65i | 2274 | -45 + 33i | 2338 | -51 + 1i | 2402 | -51 + 31i | 2466 | -45 + 1i | 2530 | -45 + 31i |
| 2083 | -13 + 67i | 2147 | -51 + 35i | 2211 | -19 + 67i | 2275 | -45 + 35i | 2339 | -51 + 3i | 2403 | -51 + 29i | 2467 | -45 + 3i | 2531 | -45 + 29i |
| 2084 | -15 + 71i | 2148 | -49 + 39i | 2212 | -17 + 71i | 2276 | -47 + 39i | 2340 | -49 + 7i | 2404 | -49 + 25i | 2468 | -47 + 7i | 2532 | -47 + 25i |
| 2085 | -15 + 69i | 2149 | -49 + 37i | 2213 | -17 + 69i | 2277 | -47 + 37i | 2341 | -49 + 5i | 2405 | -49 + 27i | 2469 | -47 + 5i | 2533 | -47 + 27i |
| 2086 | -13 + 71i | 2150 | -51 + 39i | 2214 | -45 + 57i | 2278 | -45 + 39i | 2342 | -51 + 7i | 2406 | -51 + 25i | 2470 | -45 + 5i | 2534 | -45 + 25i |
| 2087 | -13 + 69i | 2151 | -51 + 37i | 2215 | -19 + 69i | 2279 | -45 + 37i | 2343 | -51 + 5i | 2407 | -51 + 27i | 2471 | -45 + 5i | 2535 | -45 + 27i |
| 2088 | -9 + 65i | 2152 | -55 + 33i | 2216 | -23 + 65i | 2280 | -41 + 33i | 2344 | -55 + 1i | 2408 | -55 + 31i | 2472 | -41 + 3i | 2536 | -41 + 31i |
| 2089 | -9 + 67i | 2153 | -55 + 35i | 2217 | -23 + 67i | 2281 | -41 + 35i | 2345 | -55 + 3i | 2409 | -55 + 29i | 2473 | -41 + 3i | 2537 | -41 + 29i |
| 2090 | -11 + 65i | 2154 | -53 + 33i | 2218 | -21 + 65i | 2282 | -43 + 33i | 2346 | -53 + 1i | 2410 | -53 + 31i | 2474 | -43 + 1i | 2538 | -43 + 31i |
| 2091 | -11 + 67i | 2155 | -53 + 35i | 2219 | -21 + 67i | 2283 | -43 + 35i | 2347 | -53 + 3i | 2411 | -53 + 29i | 2475 | -43 + 3i | 2539 | -43 + 29i |
| 2092 | -9 + 71i | 2156 | -55 + 39i | 2220 | -41 + 57i | 2284 | -41 + 39i | 2348 | -55 + 7i | 2412 | -55 + 25i | 2476 | -41 + 7i | 2540 | -41 + 25i |
| 2093 | -9 + 69i | 2157 | -55 + 37i | 2221 | -41 + 59i | 2285 | -41 + 37i | 2349 | -55 + 5i | 2413 | -55 + 27i | 2477 | -41 + 5i | 2541 | -41 + 27i |
| 2094 | -11 + 71i | 2158 | -53 + 39i | 2222 | -43 + 57i | 2286 | -43 + 39i | 2350 | -53 + 7i | 2414 | -53 + 25i | 2478 | -43 + 7i | 2542 | -43 + 25i |
| 2095 | -11 + 69i | 2159 | -53 + 37i | 2223 | -21 + 69i | 2287 | -43 + 37i | 2351 | -53 + 5i | 2415 | -53 + 27i | 2479 | -43 + 5i | 2543 | -43 + 27i |
| 2096 | -49 + 49i | 2160 | -49 + 47i | 2224 | -47 + 49i | 2288 | -47 + 47i | 2352 | -49 + 15i | 2416 | -49 + 17i | 2480 | -47 + 15i | 2544 | -47 + 17i |
| 2097 | -49 + 51i | 2161 | -49 + 45i | 2225 | -47 + 51i | 2289 | -47 + 45i | 2353 | -49 + 13i | 2417 | -49 + 19i | 2481 | -47 + 13i | 2545 | -47 + 19i |
| 2098 | -51 + 49i | 2162 | -51 + 47i | 2226 | -45 + 49i | 2290 | -45 + 47i | 2354 | -51 + 15i | 2418 | -51 + 17i | 2482 | -45 + 15i | 2546 | -45 + 17i |
| 2099 | -51 + 51i | 2163 | -51 + 45i | 2227 | -45 + 51i | 2291 | -45 + 45i | 2355 | -51 + 13i | 2419 | -51 + 19i | 2483 | -45 + 13i | 2547 | -45 + 19i |
| 2100 | -49 + 55i | 2164 | -49 + 41i | 2228 | -47 + 55i | 2292 | -47 + 41i | 2356 | -49 + 9i | 2420 | -49 + 23i | 2484 | -47 + 9i | 2548 | -47 + 23i |
| 2101 | -49 + 53i | 2165 | -49 + 43i | 2229 | -47 + 53i | 2293 | -47 + 43i | 2357 | -49 + 11i | 2421 | -49 + 21i | 2485 | -47 + 11i | 2549 | -47 + 21i |
| 2102 | -13 + 73i | 2166 | -51 + 41i | 2230 | -45 + 55i | 2294 | -45 + 41i | 2358 | -51 + 9i | 2422 | -51 + 23i | 2486 | -45 + 9i | 2550 | -45 + 23i |
| 2103 | -51 + 53i | 2167 | -51 + 43i | 2231 | -45 + 53i | 2295 | -45 + 43i | 2359 | -51 + 11i | 2423 | -51 + 21i | 2487 | -45 + 11i | 2551 | -45 + 21i |
| 2104 | -55 + 49i | 2168 | -55 + 47i | 2232 | -41 + 49i | 2296 | -41 + 47i | 2360 | -55 + 15i | 2424 | -55 + 17i | 2488 | -41 + 15i | 2552 | -41 + 17i |
| 2105 | -73 + 13i | 2169 | -55 + 45i | 2233 | -41 + 51i | 2297 | -41 + 45i | 2361 | -55 + 13i | 2425 | -55 + 19i | 2489 | -41 + 13i | 2553 | -41 + 19i |
| 2106 | -53 + 49i | 2170 | -53 + 47i | 2234 | -43 + 49i | 2298 | -43 + 47i | 2362 | -53 + 15i | 2426 | -53 + 17i | 2490 | -43 + 15i | 2554 | -43 + 17i |
| 2107 | -53 + 51i | 2171 | -53 + 45i | 2235 | -43 + 51i | 2299 | -43 + 45i | 2363 | -53 + 13i | 2427 | -53 + 19i | 2491 | -43 + 13i | 2555 | -43 + 19i |
| 2108 | -9 + 73i | 2172 | -55 + 41i | 2236 | -41 + 55i | 2300 | -41 + 41i | 2364 | -55 + 9i | 2428 | -55 + 23i | 2492 | -41 + 9i | 2556 | -41 + 23i |
| 2109 | -73 + 11i | 2173 | -55 + 43i | 2237 | -41 + 53i | 2301 | -41 + 43i | 2365 | -55 + 11i | 2429 | -55 + 21i | 2493 | -41 + 11i | 2557 | -41 + 21i |
| 2110 | -11 + 73i | 2174 | -53 + 41i | 2238 | -43 + 55i | 2302 | -43 + 41i | 2366 | -53 + 9i | 2430 | -53 + 23i | 2494 | -43 + 9i | 2558 | -43 + 23i |
| 2111 | -53 + 53i | 2175 | -53 + 43i | 2239 | -43 + 53i | 2303 | -43 + 43i | 2367 | -53 + 11i | 2431 | -53 + 21i | 2495 | -43 + 11i | 2559 | -43 + 21i |

Fig. 26

| Value | Scatter | Value | Scatter | Value | Scatter | Value | Scatter | Value | Scatter | Value | Scatter |
|---|---|---|---|---|---|---|---|---|---|---|---|
| 2560 | -1 + 63i | 2624 | -1 + 33i | 2688 | -31 + 63i | 2752 | -31 + 33i | 2816 | -1 + 1i | 2880 | -1 + 31i | 2944 | -31 + 1i | 3008 | -31 + 31i |
| 2561 | -1 + 61i | 2625 | -1 + 35i | 2689 | -31 + 61i | 2753 | -31 + 35i | 2817 | -1 + 3i | 2881 | -1 + 29i | 2945 | -31 + 3i | 3009 | -31 + 29i |
| 2562 | -3 + 63i | 2626 | -3 + 33i | 2690 | -29 + 63i | 2754 | -29 + 33i | 2818 | -3 + 1i | 2882 | -3 + 31i | 2946 | -29 + 1i | 3010 | -29 + 31i |
| 2563 | -3 + 61i | 2627 | -3 + 35i | 2691 | -29 + 61i | 2755 | -29 + 35i | 2819 | -3 + 3i | 2883 | -3 + 29i | 2947 | -29 + 3i | 3011 | -29 + 29i |
| 2564 | -1 + 57i | 2628 | -1 + 39i | 2692 | -31 + 57i | 2756 | -31 + 39i | 2820 | -1 + 7i | 2884 | -1 + 25i | 2948 | -31 + 7i | 3012 | -31 + 25i |
| 2565 | -1 + 59i | 2629 | -1 + 37i | 2693 | -31 + 59i | 2757 | -31 + 37i | 2821 | -1 + 5i | 2885 | -1 + 27i | 2949 | -31 + 5i | 3013 | -31 + 27i |
| 2566 | -3 + 57i | 2630 | -3 + 39i | 2694 | -29 + 57i | 2758 | -29 + 39i | 2822 | -3 + 7i | 2886 | -3 + 25i | 2950 | -29 + 7i | 3014 | -29 + 25i |
| 2567 | -3 + 59i | 2631 | -3 + 37i | 2695 | -29 + 59i | 2759 | -29 + 37i | 2823 | -3 + 5i | 2887 | -3 + 27i | 2951 | -29 + 5i | 3015 | -29 + 27i |
| 2568 | -7 + 63i | 2632 | -7 + 33i | 2696 | -25 + 63i | 2760 | -25 + 33i | 2824 | -7 + 1i | 2888 | -7 + 31i | 2952 | -25 + 1i | 3016 | -25 + 31i |
| 2569 | -7 + 61i | 2633 | -7 + 35i | 2697 | -25 + 61i | 2761 | -25 + 35i | 2825 | -7 + 3i | 2889 | -7 + 29i | 2953 | -25 + 3i | 3017 | -25 + 29i |
| 2570 | -5 + 63i | 2634 | -5 + 33i | 2698 | -27 + 63i | 2762 | -27 + 33i | 2826 | -5 + 1i | 2890 | -5 + 31i | 2954 | -27 + 1i | 3018 | -27 + 31i |
| 2571 | -5 + 61i | 2635 | -5 + 35i | 2699 | -27 + 61i | 2763 | -27 + 35i | 2827 | -5 + 3i | 2891 | -5 + 29i | 2955 | -27 + 3i | 3019 | -27 + 29i |
| 2572 | -7 + 57i | 2636 | -7 + 39i | 2700 | -25 + 57i | 2764 | -25 + 39i | 2828 | -7 + 7i | 2892 | -7 + 25i | 2956 | -25 + 7i | 3020 | -25 + 25i |
| 2573 | -7 + 59i | 2637 | -7 + 37i | 2701 | -25 + 59i | 2765 | -25 + 37i | 2829 | -7 + 5i | 2893 | -7 + 27i | 2957 | -25 + 5i | 3021 | -25 + 27i |
| 2574 | -5 + 57i | 2638 | -5 + 39i | 2702 | -27 + 57i | 2766 | -27 + 39i | 2830 | -5 + 7i | 2894 | -5 + 25i | 2958 | -27 + 7i | 3022 | -27 + 25i |
| 2575 | -5 + 59i | 2639 | -5 + 37i | 2703 | -27 + 59i | 2767 | -27 + 37i | 2831 | -5 + 5i | 2895 | -5 + 27i | 2959 | -27 + 5i | 3023 | -27 + 27i |
| 2576 | -1 + 49i | 2640 | -1 + 47i | 2704 | -31 + 49i | 2768 | -31 + 47i | 2832 | -1 + 15i | 2896 | -1 + 17i | 2960 | -31 + 15i | 3024 | -31 + 17i |
| 2577 | -1 + 51i | 2641 | -1 + 45i | 2705 | -31 + 51i | 2769 | -31 + 45i | 2833 | -1 + 13i | 2897 | -1 + 19i | 2961 | -31 + 13i | 3025 | -31 + 19i |
| 2578 | -3 + 49i | 2642 | -3 + 47i | 2706 | -29 + 49i | 2770 | -29 + 47i | 2834 | -3 + 15i | 2898 | -3 + 17i | 2962 | -29 + 15i | 3026 | -29 + 17i |
| 2579 | -3 + 51i | 2643 | -3 + 45i | 2707 | -29 + 51i | 2771 | -29 + 45i | 2835 | -3 + 13i | 2899 | -3 + 19i | 2963 | -29 + 13i | 3027 | -29 + 19i |
| 2580 | -1 + 55i | 2644 | -1 + 41i | 2708 | -31 + 55i | 2772 | -31 + 41i | 2836 | -1 + 9i | 2900 | -1 + 23i | 2964 | -31 + 9i | 3028 | -31 + 23i |
| 2581 | -1 + 53i | 2645 | -1 + 43i | 2709 | -31 + 53i | 2773 | -31 + 43i | 2837 | -1 + 11i | 2901 | -1 + 21i | 2965 | -31 + 11i | 3029 | -31 + 21i |
| 2582 | -3 + 55i | 2646 | -3 + 41i | 2710 | -29 + 55i | 2774 | -29 + 41i | 2838 | -3 + 9i | 2902 | -3 + 23i | 2966 | -29 + 9i | 3030 | -29 + 23i |
| 2583 | -3 + 53i | 2647 | -3 + 43i | 2711 | -29 + 53i | 2775 | -29 + 43i | 2839 | -3 + 11i | 2903 | -3 + 21i | 2967 | -29 + 11i | 3031 | -29 + 21i |
| 2584 | -7 + 49i | 2648 | -7 + 47i | 2712 | -25 + 49i | 2776 | -25 + 47i | 2840 | -7 + 15i | 2904 | -7 + 17i | 2968 | -25 + 15i | 3032 | -25 + 17i |
| 2585 | -7 + 51i | 2649 | -7 + 45i | 2713 | -25 + 51i | 2777 | -25 + 45i | 2841 | -7 + 13i | 2905 | -7 + 19i | 2969 | -25 + 13i | 3033 | -25 + 19i |
| 2586 | -5 + 49i | 2650 | -5 + 47i | 2714 | -27 + 49i | 2778 | -27 + 47i | 2842 | -5 + 15i | 2906 | -5 + 17i | 2970 | -27 + 15i | 3034 | -27 + 17i |
| 2587 | -5 + 51i | 2651 | -5 + 45i | 2715 | -27 + 51i | 2779 | -27 + 45i | 2843 | -5 + 13i | 2907 | -5 + 19i | 2971 | -27 + 13i | 3035 | -27 + 19i |
| 2588 | -7 + 55i | 2652 | -7 + 41i | 2716 | -25 + 55i | 2780 | -25 + 41i | 2844 | -7 + 9i | 2908 | -7 + 23i | 2972 | -25 + 9i | 3036 | -25 + 23i |
| 2589 | -7 + 53i | 2653 | -7 + 43i | 2717 | -25 + 53i | 2781 | -25 + 43i | 2845 | -7 + 11i | 2909 | -7 + 21i | 2973 | -25 + 11i | 3037 | -25 + 21i |
| 2590 | -5 + 55i | 2654 | -5 + 41i | 2718 | -27 + 55i | 2782 | -27 + 41i | 2846 | -5 + 9i | 2910 | -5 + 23i | 2974 | -27 + 9i | 3038 | -27 + 23i |

Fig. 27

| | | | | | | | | | | | |
|---|---|---|---|---|---|---|---|---|---|---|---|
| 2591 | -5 + 53i | 2655 | -5 + 43i | 2719 | -27 + 53i | 2783 | -27 + 43i | 2847 | -5 + 11i | 2911 | -5 + 21i | 2975 | -27 + 11i | 3039 | -27 + 21i |
| 2592 | -15 + 63i | 2656 | -15 + 33i | 2720 | -17 + 63i | 2784 | -17 + 33i | 2848 | -15 + 1i | 2912 | -15 + 31i | 2976 | -17 + 1i | 3040 | -17 + 31i |
| 2593 | -15 + 61i | 2657 | -15 + 35i | 2721 | -17 + 61i | 2785 | -17 + 35i | 2849 | -15 + 3i | 2913 | -15 + 29i | 2977 | -17 + 3i | 3041 | -17 + 29i |
| 2594 | -13 + 63i | 2658 | -13 + 33i | 2722 | -19 + 63i | 2786 | -19 + 33i | 2850 | -13 + 3i | 2914 | -13 + 31i | 2978 | -19 + 1i | 3042 | -19 + 31i |
| 2595 | -13 + 61i | 2659 | -13 + 35i | 2723 | -19 + 61i | 2787 | -19 + 35i | 2851 | -13 + 3i | 2915 | -13 + 29i | 2979 | -19 + 3i | 3043 | -19 + 29i |
| 2596 | -15 + 57i | 2660 | -15 + 39i | 2724 | -17 + 57i | 2788 | -17 + 39i | 2852 | -15 + 7i | 2916 | -15 + 25i | 2980 | -17 + 7i | 3044 | -17 + 25i |
| 2597 | -15 + 59i | 2661 | -15 + 37i | 2725 | -17 + 59i | 2789 | -17 + 37i | 2853 | -15 + 5i | 2917 | -15 + 27i | 2981 | -17 + 5i | 3045 | -17 + 27i |
| 2598 | -13 + 57i | 2662 | -13 + 39i | 2726 | -19 + 57i | 2790 | -19 + 39i | 2854 | -13 + 7i | 2918 | -13 + 25i | 2982 | -19 + 7i | 3046 | -19 + 25i |
| 2599 | -13 + 59i | 2663 | -13 + 37i | 2727 | -19 + 59i | 2791 | -19 + 37i | 2855 | -13 + 5i | 2919 | -13 + 27i | 2983 | -19 + 5i | 3047 | -19 + 27i |
| 2600 | -9 + 63i | 2664 | -9 + 33i | 2728 | -23 + 63i | 2792 | -23 + 33i | 2856 | -9 + 1i | 2920 | -9 + 31i | 2984 | -23 + 1i | 3048 | -23 + 31i |
| 2601 | -9 + 61i | 2665 | -9 + 35i | 2729 | -23 + 61i | 2793 | -23 + 35i | 2857 | -9 + 3i | 2921 | -9 + 29i | 2985 | -23 + 3i | 3049 | -23 + 29i |
| 2602 | -11 + 63i | 2666 | -11 + 33i | 2730 | -21 + 63i | 2794 | -21 + 33i | 2858 | -11 + 1i | 2922 | -11 + 31i | 2986 | -21 + 1i | 3050 | -21 + 31i |
| 2603 | -11 + 61i | 2667 | -11 + 35i | 2731 | -21 + 61i | 2795 | -21 + 35i | 2859 | -11 + 3i | 2923 | -11 + 29i | 2987 | -21 + 3i | 3051 | -21 + 29i |
| 2604 | -9 + 57i | 2668 | -9 + 39i | 2732 | -23 + 57i | 2796 | -23 + 39i | 2860 | -9 + 7i | 2924 | -9 + 25i | 2988 | -23 + 7i | 3052 | -23 + 25i |
| 2605 | -9 + 59i | 2669 | -9 + 37i | 2733 | -23 + 59i | 2797 | -23 + 37i | 2861 | -9 + 5i | 2925 | -9 + 27i | 2989 | -23 + 5i | 3053 | -23 + 27i |
| 2606 | -11 + 57i | 2670 | -11 + 39i | 2734 | -21 + 57i | 2798 | -21 + 39i | 2862 | -11 + 7i | 2926 | -11 + 25i | 2990 | -21 + 7i | 3054 | -21 + 25i |
| 2607 | -11 + 59i | 2671 | -11 + 37i | 2735 | -21 + 59i | 2799 | -21 + 37i | 2863 | -11 + 5i | 2927 | -11 + 27i | 2991 | -21 + 5i | 3055 | -21 + 27i |
| 2608 | -15 + 49i | 2672 | -15 + 47i | 2736 | -17 + 49i | 2800 | -17 + 47i | 2864 | -15 + 15i | 2928 | -15 + 17i | 2992 | -17 + 15i | 3056 | -17 + 17i |
| 2609 | -15 + 51i | 2673 | -15 + 45i | 2737 | -17 + 51i | 2801 | -17 + 45i | 2865 | -15 + 13i | 2929 | -15 + 19i | 2993 | -17 + 13i | 3057 | -17 + 19i |
| 2610 | -13 + 49i | 2674 | -13 + 47i | 2738 | -19 + 49i | 2802 | -19 + 47i | 2866 | -13 + 15i | 2930 | -13 + 17i | 2994 | -19 + 15i | 3058 | -19 + 17i |
| 2611 | -13 + 51i | 2675 | -13 + 45i | 2739 | -19 + 51i | 2803 | -19 + 45i | 2867 | -13 + 13i | 2931 | -13 + 19i | 2995 | -19 + 13i | 3059 | -19 + 19i |
| 2612 | -15 + 55i | 2676 | -15 + 41i | 2740 | -17 + 55i | 2804 | -17 + 41i | 2868 | -15 + 9i | 2932 | -15 + 23i | 2996 | -17 + 9i | 3060 | -17 + 23i |
| 2613 | -15 + 53i | 2677 | -15 + 43i | 2741 | -17 + 53i | 2805 | -17 + 43i | 2869 | -15 + 11i | 2933 | -15 + 21i | 2997 | -17 + 11i | 3061 | -17 + 21i |
| 2614 | -13 + 55i | 2678 | -13 + 41i | 2742 | -19 + 55i | 2806 | -19 + 41i | 2870 | -13 + 9i | 2934 | -13 + 23i | 2998 | -19 + 9i | 3062 | -19 + 23i |
| 2615 | -13 + 53i | 2679 | -13 + 43i | 2743 | -19 + 53i | 2807 | -19 + 43i | 2871 | -13 + 11i | 2935 | -13 + 21i | 2999 | -19 + 11i | 3063 | -19 + 21i |
| 2616 | -9 + 49i | 2680 | -9 + 47i | 2744 | -23 + 49i | 2808 | -23 + 47i | 2872 | -9 + 15i | 2936 | -9 + 17i | 3000 | -23 + 15i | 3064 | -23 + 17i |
| 2617 | -9 + 51i | 2681 | -9 + 45i | 2745 | -23 + 51i | 2809 | -23 + 45i | 2873 | -9 + 13i | 2937 | -9 + 19i | 3001 | -23 + 13i | 3065 | -23 + 19i |
| 2618 | -11 + 49i | 2682 | -11 + 47i | 2746 | -21 + 49i | 2810 | -21 + 47i | 2874 | -11 + 15i | 2938 | -11 + 17i | 3002 | -21 + 15i | 3066 | -21 + 17i |
| 2619 | -11 + 51i | 2683 | -11 + 45i | 2747 | -21 + 51i | 2811 | -21 + 45i | 2875 | -11 + 13i | 2939 | -11 + 19i | 3003 | -21 + 13i | 3067 | -21 + 19i |
| 2620 | -9 + 55i | 2684 | -9 + 41i | 2748 | -23 + 55i | 2812 | -23 + 41i | 2876 | -9 + 9i | 2940 | -9 + 23i | 3004 | -23 + 9i | 3068 | -23 + 23i |
| 2621 | -9 + 53i | 2685 | -9 + 43i | 2749 | -23 + 53i | 2813 | -23 + 43i | 2877 | -9 + 11i | 2941 | -9 + 21i | 3005 | -23 + 11i | 3069 | -23 + 21i |
| 2622 | -11 + 55i | 2686 | -11 + 41i | 2750 | -21 + 55i | 2814 | -21 + 41i | 2878 | -11 + 9i | 2942 | -11 + 23i | 3006 | -21 + 9i | 3070 | -21 + 23i |
| 2623 | -11 + 53i | 2687 | -11 + 43i | 2751 | -21 + 53i | 2815 | -21 + 43i | 2879 | -11 + 11i | 2943 | -11 + 21i | 3007 | -21 + 11i | 3071 | -21 + 21i |

Fig. 28

| Value | Scatter | Value | Scatter | Value | Scatter | Value | Scatter | Value | Scatter | Value | Scatter | Value | Scatter |
|---|---|---|---|---|---|---|---|---|---|---|---|---|---|
| 3072 | -65 - 1i | 3136 | -63 - 33i | 3200 | -33 - 63i | 3264 | -33 - 33i | 3328 | -63 - 1i | 3392 | -63 - 31i | 3456 | -33 - 1i | 3520 | -33 - 31i |
| 3073 | -65 - 3i | 3137 | -65 - 29i | 3201 | -33 - 61i | 3265 | -33 - 35i | 3329 | -63 - 3i | 3393 | -63 - 29i | 3457 | -33 - 3i | 3521 | -33 - 29i |
| 3074 | -3 - 65i | 3138 | -61 - 33i | 3202 | -29 - 65i | 3266 | -35 - 33i | 3330 | -61 - 1i | 3394 | -61 - 31i | 3458 | -35 - 1i | 3522 | -35 - 31i |
| 3075 | -67 - 3i | 3139 | -61 - 35i | 3203 | -35 - 61i | 3267 | -35 - 35i | 3331 | -61 - 3i | 3395 | -61 - 29i | 3459 | -35 - 3i | 3523 | -35 - 29i |
| 3076 | -65 - 7i | 3140 | -65 - 25i | 3204 | -33 - 57i | 3268 | -33 - 39i | 3332 | -63 - 7i | 3396 | -63 - 25i | 3460 | -33 - 7i | 3524 | -33 - 25i |
| 3077 | -65 - 5i | 3141 | -65 - 27i | 3205 | -33 - 59i | 3269 | -33 - 37i | 3333 | -63 - 5i | 3397 | -63 - 27i | 3461 | -33 - 5i | 3525 | -33 - 27i |
| 3078 | -67 - 7i | 3142 | -67 - 25i | 3206 | -35 - 57i | 3270 | -35 - 39i | 3334 | -61 - 5i | 3398 | -61 - 25i | 3462 | -35 - 5i | 3526 | -35 - 25i |
| 3079 | -67 - 5i | 3143 | -61 - 37i | 3207 | -35 - 59i | 3271 | -35 - 37i | 3335 | -61 - 7i | 3399 | -61 - 27i | 3463 | -35 - 7i | 3527 | -33 - 27i |
| 3080 | -67 - 65i | 3144 | -57 - 33i | 3208 | -25 - 65i | 3272 | -39 - 33i | 3336 | -57 - 1i | 3400 | -57 - 31i | 3464 | -35 - 11i | 3528 | -39 - 31i |
| 3081 | -7 - 67i | 3145 | -57 - 35i | 3209 | -25 - 67i | 3273 | -39 - 35i | 3337 | -57 - 3i | 3401 | -57 - 29i | 3465 | -39 - 3i | 3529 | -39 - 29i |
| 3082 | -5 - 65i | 3146 | -59 - 33i | 3210 | -27 - 65i | 3274 | -37 - 33i | 3338 | -59 - 1i | 3402 | -59 - 31i | 3466 | -39 - 1i | 3530 | -39 - 29i |
| 3083 | -5 - 67i | 3147 | -59 - 35i | 3211 | -37 - 61i | 3275 | -37 - 35i | 3339 | -59 - 3i | 3403 | -59 - 29i | 3467 | -37 - 3i | 3531 | -37 - 31i |
| 3084 | -71 - 1i | 3148 | -57 - 37i | 3212 | -39 - 59i | 3276 | -37 - 39i | 3340 | -57 - 5i | 3404 | -57 - 25i | 3468 | -37 - 5i | 3532 | -37 - 29i |
| 3085 | -7 - 69i | 3149 | -57 - 39i | 3213 | -39 - 59i | 3277 | -37 - 37i | 3341 | -57 - 7i | 3405 | -57 - 27i | 3469 | -37 - 7i | 3533 | -37 - 25i |
| 3086 | -69 - 7i | 3150 | -59 - 37i | 3214 | -37 - 57i | 3278 | -39 - 37i | 3342 | -59 - 5i | 3406 | -59 - 25i | 3470 | -39 - 5i | 3534 | -39 - 27i |
| 3087 | -69 - 5i | 3151 | -59 - 39i | 3215 | -37 - 59i | 3279 | -37 - 39i | 3343 | -59 - 7i | 3407 | -59 - 27i | 3471 | -37 - 5i | 3535 | -37 - 27i |
| 3088 | -65 - 15i | 3152 | -65 - 17i | 3216 | -33 - 49i | 3280 | -33 - 47i | 3344 | -63 - 15i | 3408 | -63 - 17i | 3472 | -33 - 15i | 3536 | -33 - 17i |
| 3089 | -65 - 13i | 3153 | -65 - 19i | 3217 | -33 - 51i | 3281 | -33 - 45i | 3345 | -63 - 13i | 3409 | -63 - 19i | 3473 | -33 - 13i | 3537 | -33 - 19i |
| 3090 | -67 - 15i | 3154 | -67 - 17i | 3218 | -35 - 49i | 3282 | -35 - 47i | 3346 | -61 - 15i | 3410 | -61 - 17i | 3474 | -35 - 15i | 3538 | -35 - 19i |
| 3091 | -67 - 13i | 3155 | -67 - 19i | 3219 | -35 - 51i | 3283 | -35 - 45i | 3347 | -61 - 13i | 3411 | -61 - 19i | 3475 | -35 - 13i | 3539 | -35 - 19i |
| 3092 | -65 - 9i | 3156 | -65 - 23i | 3220 | -33 - 55i | 3284 | -33 - 41i | 3348 | -63 - 9i | 3412 | -63 - 23i | 3476 | -33 - 9i | 3540 | -33 - 23i |
| 3093 | -65 - 11i | 3157 | -65 - 21i | 3221 | -33 - 53i | 3285 | -33 - 43i | 3349 | -63 - 11i | 3413 | -63 - 21i | 3477 | -33 - 11i | 3541 | -33 - 21i |
| 3094 | -67 - 9i | 3158 | -67 - 23i | 3222 | -35 - 55i | 3286 | -35 - 41i | 3350 | -61 - 9i | 3414 | -61 - 23i | 3478 | -35 - 9i | 3542 | -35 - 23i |
| 3095 | -67 - 11i | 3159 | -67 - 21i | 3223 | -35 - 53i | 3287 | -35 - 43i | 3351 | -61 - 11i | 3415 | -61 - 21i | 3479 | -35 - 11i | 3543 | -35 - 21i |
| 3096 | -71 - 15i | 3160 | -57 - 45i | 3224 | -39 - 49i | 3288 | -39 - 47i | 3352 | -57 - 13i | 3416 | -57 - 17i | 3480 | -39 - 15i | 3544 | -39 - 17i |
| 3097 | -71 - 13i | 3161 | -69 - 17i | 3225 | -39 - 51i | 3289 | -39 - 45i | 3353 | -57 - 15i | 3417 | -57 - 19i | 3481 | -39 - 13i | 3545 | -39 - 19i |
| 3098 | -69 - 15i | 3162 | -69 - 19i | 3226 | -37 - 49i | 3290 | -37 - 47i | 3354 | -59 - 13i | 3418 | -59 - 17i | 3482 | -37 - 15i | 3546 | -37 - 17i |
| 3099 | -69 - 13i | 3163 | -69 - 19i | 3227 | -37 - 51i | 3291 | -37 - 45i | 3355 | -59 - 13i | 3419 | -59 - 19i | 3483 | -37 - 13i | 3547 | -37 - 19i |
| 3100 | -71 - 9i | 3164 | -57 - 41i | 3228 | -39 - 55i | 3292 | -39 - 41i | 3356 | -57 - 9i | 3420 | -57 - 23i | 3484 | -39 - 9i | 3548 | -39 - 23i |

| Value | Scatter | Value | Scatter | Value | Scatter | Value | Scatter | Value | Scatter | Value | Scatter | Value | Scatter |
|---|---|---|---|---|---|---|---|---|---|---|---|---|---|
| 3584 | -1 - 63i | 3648 | -1 - 33i | 3712 | -31 - 63i | 3776 | -31 - 33i | 3840 | -1 - 1i | 3904 | -1 - 31i | 3968 | -31 - 1i |
| 3585 | -1 - 61i | 3649 | -1 - 35i | 3713 | -31 - 61i | 3777 | -31 - 35i | 3841 | -1 - 3i | 3905 | -1 - 29i | 3969 | -31 - 3i |
| 3586 | -3 - 63i | 3650 | -3 - 33i | 3714 | -29 - 63i | 3778 | -29 - 33i | 3842 | -3 - 1i | 3906 | -3 - 31i | 3970 | -29 - 1i |
| 3587 | -3 - 61i | 3651 | -3 - 35i | 3715 | -29 - 61i | 3779 | -29 - 35i | 3843 | -3 - 3i | 3907 | -3 - 29i | 3971 | -29 - 3i |
| 3588 | -1 - 57i | 3652 | -1 - 39i | 3716 | -31 - 57i | 3780 | -31 - 39i | 3844 | -1 - 7i | 3908 | -1 - 25i | 3972 | -31 - 7i |
| 3589 | -1 - 59i | 3653 | -1 - 37i | 3717 | -31 - 59i | 3781 | -31 - 37i | 3845 | -1 - 5i | 3909 | -1 - 27i | 3973 | -31 - 5i |
| 3590 | -3 - 57i | 3654 | -3 - 39i | 3718 | -29 - 57i | 3782 | -29 - 39i | 3846 | -3 - 7i | 3910 | -3 - 25i | 3974 | -29 - 7i |
| 3591 | -3 - 59i | 3655 | -3 - 37i | 3719 | -29 - 59i | 3783 | -29 - 37i | 3847 | -3 - 5i | 3911 | -3 - 27i | 3975 | -29 - 5i |
| 3592 | -7 - 63i | 3656 | -7 - 33i | 3720 | -25 - 63i | 3784 | -25 - 33i | 3848 | -7 - 1i | 3912 | -7 - 31i | 3976 | -25 - 1i |
| 3593 | -7 - 61i | 3657 | -7 - 35i | 3721 | -25 - 61i | 3785 | -25 - 35i | 3849 | -7 - 3i | 3913 | -7 - 29i | 3977 | -25 - 3i |
| 3594 | -5 - 63i | 3658 | -5 - 33i | 3722 | -27 - 63i | 3786 | -27 - 33i | 3850 | -5 - 1i | 3914 | -5 - 31i | 3978 | -27 - 1i |
| 3595 | -5 - 61i | 3659 | -5 - 35i | 3723 | -27 - 61i | 3787 | -27 - 35i | 3851 | -5 - 3i | 3915 | -5 - 29i | 3979 | -27 - 3i |
| 3596 | -7 - 57i | 3660 | -7 - 39i | 3724 | -25 - 57i | 3788 | -25 - 39i | 3852 | -7 - 7i | 3916 | -7 - 25i | 3980 | -25 - 7i |
| 3597 | -7 - 59i | 3661 | -7 - 37i | 3725 | -25 - 59i | 3789 | -25 - 37i | 3853 | -7 - 5i | 3917 | -7 - 27i | 3981 | -25 - 5i |
| 3598 | -5 - 57i | 3662 | -5 - 39i | 3726 | -27 - 57i | 3790 | -27 - 39i | 3854 | -5 - 7i | 3918 | -5 - 25i | 3982 | -27 - 7i |
| 3599 | -5 - 59i | 3663 | -5 - 37i | 3727 | -27 - 59i | 3791 | -27 - 37i | 3855 | -5 - 5i | 3919 | -5 - 27i | 3983 | -27 - 5i |
| 3600 | -1 - 49i | 3664 | -1 - 47i | 3728 | -31 - 49i | 3792 | -31 - 47i | 3856 | -1 - 15i | 3920 | -1 - 17i | 3984 | -31 - 15i |
| 3601 | -1 - 51i | 3665 | -1 - 45i | 3729 | -31 - 51i | 3793 | -31 - 45i | 3857 | -1 - 13i | 3921 | -1 - 19i | 3985 | -31 - 13i |
| 3602 | -3 - 49i | 3666 | -3 - 47i | 3730 | -29 - 49i | 3794 | -29 - 47i | 3858 | -3 - 15i | 3922 | -3 - 17i | 3986 | -29 - 15i |
| 3603 | -3 - 51i | 3667 | -3 - 45i | 3731 | -29 - 51i | 3795 | -29 - 45i | 3859 | -3 - 13i | 3923 | -3 - 19i | 3987 | -29 - 13i |
| 3604 | -1 - 55i | 3668 | -1 - 41i | 3732 | -31 - 55i | 3796 | -31 - 41i | 3860 | -1 - 9i | 3924 | -1 - 23i | 3988 | -31 - 9i |
| 3605 | -1 - 53i | 3669 | -1 - 43i | 3733 | -31 - 53i | 3797 | -31 - 43i | 3861 | -1 - 11i | 3925 | -1 - 21i | 3989 | -31 - 11i |
| 3606 | -3 - 55i | 3670 | -3 - 41i | 3734 | -29 - 55i | 3798 | -29 - 41i | 3862 | -3 - 9i | 3926 | -3 - 23i | 3990 | -29 - 9i |
| 3607 | -3 - 53i | 3671 | -3 - 43i | 3735 | -29 - 53i | 3799 | -29 - 43i | 3863 | -3 - 11i | 3927 | -3 - 21i | 3991 | -29 - 11i |
| 3608 | -7 - 49i | 3672 | -7 - 47i | 3736 | -25 - 49i | 3800 | -25 - 47i | 3864 | -7 - 15i | 3928 | -7 - 17i | 3992 | -25 - 15i |
| 3609 | -7 - 51i | 3673 | -7 - 45i | 3737 | -25 - 51i | 3801 | -25 - 45i | 3865 | -7 - 13i | 3929 | -7 - 19i | 3993 | -25 - 13i |
| 3610 | -5 - 49i | 3674 | -5 - 47i | 3738 | -27 - 49i | 3802 | -27 - 47i | 3866 | -5 - 15i | 3930 | -5 - 17i | 3994 | -27 - 15i |
| 3611 | -5 - 51i | 3675 | -5 - 45i | 3739 | -27 - 51i | 3803 | -27 - 45i | 3867 | -5 - 13i | 3931 | -5 - 19i | 3995 | -27 - 13i |
| 3612 | -7 - 55i | 3676 | -7 - 41i | 3740 | -25 - 55i | 3804 | -25 - 41i | 3868 | -7 - 9i | 3932 | -7 - 23i | 3996 | -25 - 9i |
| 3613 | -7 - 53i | 3677 | -7 - 43i | 3741 | -25 - 53i | 3805 | -25 - 43i | 3869 | -7 - 11i | 3933 | -7 - 21i | 3997 | -25 - 11i |
| 3614 | -5 - 55i | 3678 | -5 - 41i | 3742 | -27 - 55i | 3806 | -27 - 41i | 3870 | -5 - 9i | 3934 | -5 - 23i | 3998 | -27 - 9i |
| 3615 | -5 - 53i | 3679 | -5 - 43i | 3743 | -27 - 53i | 3807 | -27 - 43i | 3871 | -5 - 11i | 3935 | -5 - 21i | 3999 | -27 - 11i |

| Value | Scatter |
|---|---|
| 4032 | -31 - 31i |
| 4033 | -31 - 29i |
| 4034 | -29 - 31i |
| 4035 | -29 - 29i |
| 4036 | -31 - 25i |
| 4037 | -31 - 27i |
| 4038 | -29 - 25i |
| 4039 | -29 - 27i |
| 4040 | -25 - 31i |
| 4041 | -25 - 29i |
| 4042 | -27 - 31i |
| 4043 | -27 - 29i |
| 4044 | -25 - 25i |
| 4045 | -25 - 27i |
| 4046 | -27 - 25i |
| 4047 | -27 - 27i |
| 4048 | -31 - 17i |
| 4049 | -31 - 19i |
| 4050 | -29 - 17i |
| 4051 | -29 - 19i |
| 4052 | -31 - 23i |
| 4053 | -31 - 21i |
| 4054 | -29 - 23i |
| 4055 | -29 - 21i |
| 4056 | -25 - 17i |
| 4057 | -25 - 19i |
| 4058 | -27 - 17i |
| 4059 | -27 - 19i |
| 4060 | -25 - 23i |
| 4061 | -25 - 21i |
| 4062 | -27 - 23i |
| 4063 | -27 - 21i |

Fig. 31

| | | | | | | | | | | | |
|---|---|---|---|---|---|---|---|---|---|---|---|
| 3616 | -15 - 63i | 3680 | -15 - 33i | 3744 | -17 - 63i | 3808 | -17 - 33i | 3872 | -15 - 1i | 3936 | -15 - 31i | 4000 | -17 - 1i | 4064 | -17 - 31i |
| 3617 | -15 - 61i | 3681 | -15 - 35i | 3745 | -17 - 61i | 3809 | -17 - 35i | 3873 | -15 - 3i | 3937 | -15 - 29i | 4001 | -17 - 3i | 4065 | -17 - 29i |
| 3618 | -13 - 63i | 3682 | -13 - 33i | 3746 | -19 - 63i | 3810 | -19 - 33i | 3874 | -13 - 1i | 3938 | -13 - 31i | 4002 | -19 - 1i | 4066 | -19 - 31i |
| 3619 | -13 - 61i | 3683 | -13 - 35i | 3747 | -19 - 61i | 3811 | -19 - 35i | 3875 | -13 - 3i | 3939 | -13 - 29i | 4003 | -19 - 3i | 4067 | -19 - 29i |
| 3620 | -15 - 57i | 3684 | -15 - 39i | 3748 | -17 - 57i | 3812 | -17 - 39i | 3876 | -15 - 7i | 3940 | -15 - 25i | 4004 | -17 - 7i | 4068 | -17 - 25i |
| 3621 | -15 - 59i | 3685 | -15 - 37i | 3749 | -17 - 59i | 3813 | -17 - 37i | 3877 | -15 - 5i | 3941 | -15 - 27i | 4005 | -17 - 5i | 4069 | -17 - 27i |
| 3622 | -13 - 57i | 3686 | -13 - 39i | 3750 | -19 - 57i | 3814 | -19 - 39i | 3878 | -13 - 7i | 3942 | -13 - 25i | 4006 | -19 - 7i | 4070 | -19 - 25i |
| 3623 | -13 - 59i | 3687 | -13 - 37i | 3751 | -19 - 59i | 3815 | -19 - 37i | 3879 | -13 - 5i | 3943 | -13 - 27i | 4007 | -19 - 5i | 4071 | -19 - 27i |
| 3624 | -9 - 63i | 3688 | -9 - 33i | 3752 | -23 - 63i | 3816 | -23 - 33i | 3880 | -9 - 1i | 3944 | -9 - 31i | 4008 | -23 - 1i | 4072 | -23 - 31i |
| 3625 | -9 - 61i | 3689 | -9 - 35i | 3753 | -23 - 61i | 3817 | -23 - 35i | 3881 | -9 - 3i | 3945 | -9 - 29i | 4009 | -23 - 3i | 4073 | -23 - 29i |
| 3626 | -11 - 63i | 3690 | -11 - 33i | 3754 | -21 - 63i | 3818 | -21 - 33i | 3882 | -11 - 1i | 3946 | -11 - 31i | 4010 | -21 - 1i | 4074 | -21 - 31i |
| 3627 | -11 - 61i | 3691 | -11 - 35i | 3755 | -21 - 61i | 3819 | -21 - 35i | 3883 | -11 - 3i | 3947 | -11 - 29i | 4011 | -21 - 3i | 4075 | -21 - 29i |
| 3628 | -9 - 57i | 3692 | -9 - 39i | 3756 | -23 - 57i | 3820 | -23 - 39i | 3884 | -9 - 7i | 3948 | -9 - 25i | 4012 | -23 - 7i | 4076 | -23 - 25i |
| 3629 | -9 - 59i | 3693 | -9 - 37i | 3757 | -23 - 59i | 3821 | -23 - 37i | 3885 | -9 - 5i | 3949 | -9 - 27i | 4013 | -23 - 5i | 4077 | -23 - 27i |
| 3630 | -11 - 57i | 3694 | -11 - 39i | 3758 | -21 - 57i | 3822 | -21 - 39i | 3886 | -11 - 7i | 3950 | -11 - 25i | 4014 | -21 - 7i | 4078 | -21 - 25i |
| 3631 | -11 - 59i | 3695 | -11 - 37i | 3759 | -21 - 59i | 3823 | -21 - 37i | 3887 | -11 - 5i | 3951 | -11 - 27i | 4015 | -21 - 5i | 4079 | -21 - 27i |
| 3632 | -15 - 49i | 3696 | -15 - 47i | 3760 | -17 - 49i | 3824 | -17 - 47i | 3888 | -15 - 15i | 3952 | -15 - 17i | 4016 | -17 - 15i | 4080 | -17 - 17i |
| 3633 | -15 - 51i | 3697 | -15 - 45i | 3761 | -17 - 51i | 3825 | -17 - 45i | 3889 | -15 - 13i | 3953 | -15 - 19i | 4017 | -17 - 13i | 4081 | -17 - 19i |
| 3634 | -13 - 49i | 3698 | -13 - 47i | 3762 | -19 - 49i | 3826 | -19 - 47i | 3890 | -13 - 15i | 3954 | -13 - 17i | 4018 | -19 - 15i | 4082 | -19 - 17i |
| 3635 | -13 - 51i | 3699 | -13 - 45i | 3763 | -19 - 51i | 3827 | -19 - 45i | 3891 | -13 - 13i | 3955 | -13 - 19i | 4019 | -19 - 13i | 4083 | -19 - 19i |
| 3636 | -15 - 55i | 3700 | -15 - 41i | 3764 | -17 - 55i | 3828 | -17 - 41i | 3892 | -15 - 9i | 3956 | -15 - 23i | 4020 | -17 - 9i | 4084 | -17 - 23i |
| 3637 | -15 - 53i | 3701 | -15 - 43i | 3765 | -17 - 53i | 3829 | -17 - 43i | 3893 | -15 - 11i | 3957 | -15 - 21i | 4021 | -17 - 11i | 4085 | -17 - 21i |
| 3638 | -13 - 55i | 3702 | -13 - 41i | 3766 | -19 - 55i | 3830 | -19 - 41i | 3894 | -13 - 9i | 3958 | -13 - 23i | 4022 | -19 - 9i | 4086 | -19 - 23i |
| 3639 | -13 - 53i | 3703 | -13 - 43i | 3767 | -19 - 53i | 3831 | -19 - 43i | 3895 | -13 - 11i | 3959 | -13 - 21i | 4023 | -19 - 11i | 4087 | -19 - 21i |
| 3640 | -9 - 49i | 3704 | -9 - 47i | 3768 | -23 - 49i | 3832 | -23 - 47i | 3896 | -9 - 15i | 3960 | -9 - 17i | 4024 | -23 - 15i | 4088 | -23 - 17i |
| 3641 | -9 - 51i | 3705 | -9 - 45i | 3769 | -23 - 51i | 3833 | -23 - 45i | 3897 | -9 - 13i | 3961 | -9 - 19i | 4025 | -23 - 13i | 4089 | -23 - 19i |
| 3642 | -11 - 49i | 3706 | -11 - 47i | 3770 | -21 - 49i | 3834 | -21 - 47i | 3898 | -11 - 15i | 3962 | -11 - 17i | 4026 | -21 - 15i | 4090 | -21 - 17i |
| 3643 | -11 - 51i | 3707 | -11 - 45i | 3771 | -21 - 51i | 3835 | -21 - 45i | 3899 | -11 - 13i | 3963 | -11 - 19i | 4027 | -21 - 13i | 4091 | -21 - 19i |
| 3644 | -9 - 55i | 3708 | -9 - 41i | 3772 | -23 - 55i | 3836 | -23 - 41i | 3900 | -9 - 9i | 3964 | -9 - 23i | 4028 | -23 - 9i | 4092 | -23 - 23i |
| 3645 | -9 - 53i | 3709 | -9 - 43i | 3773 | -23 - 53i | 3837 | -23 - 43i | 3901 | -9 - 11i | 3965 | -9 - 21i | 4029 | -23 - 11i | 4093 | -23 - 21i |
| 3646 | -11 - 55i | 3710 | -11 - 41i | 3774 | -21 - 55i | 3838 | -21 - 41i | 3902 | -11 - 9i | 3966 | -11 - 23i | 4030 | -21 - 9i | 4094 | -21 - 23i |
| 3647 | -11 - 53i | 3711 | -11 - 43i | 3775 | -21 - 53i | 3839 | -21 - 43i | 3903 | -11 - 11i | 3967 | -11 - 21i | 4031 | -21 - 11i | 4095 | -21 - 21i |

Fig. 33
(a) 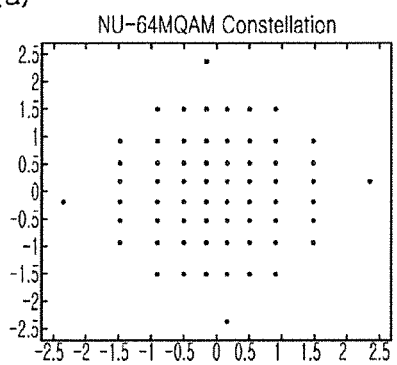
(b) 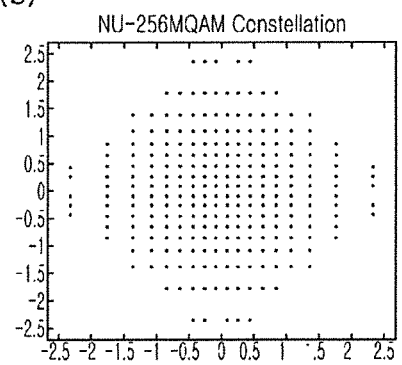
(c) 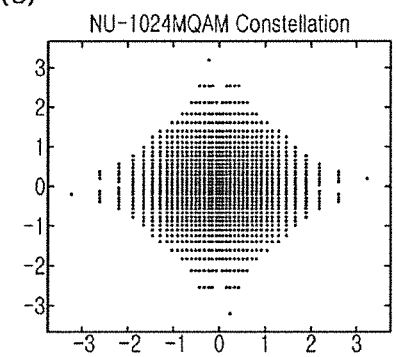
(d) 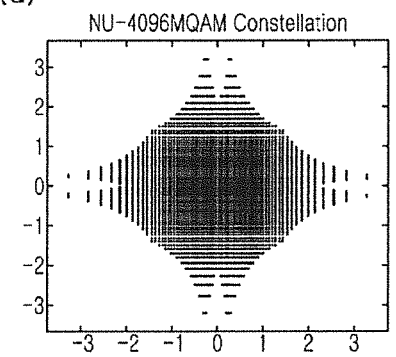
Fig. 34
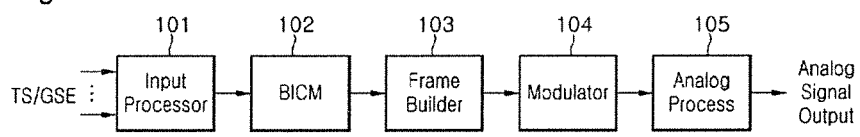

Fig. 36

| TS/GS (2 bits) | SIS/MIS (1 bit) | CCM/ACM (1 bit) | ISSYI (1 bit) | NPD (1bit) | EXT (2bits) |
|---|---|---|---|---|---|
| 00 = GFPS<br>11 = TS<br>01 = GCS<br>10 = GSE | 1 = single<br>0 = multiple | 1 = CCM<br>0 = ACM | 1 = active<br>0 = not-active | 1= active<br>0 = not-active | Reserved for future use |

| Field | Size (Bytes) | Description |
|---|---|---|
| MATYPE | 2 | As described above |
| UPL | 2 | User Packet Length in bits, in the range [0,65535] |
| DFL | 2 | Data Field Length in bits, in the range [ 0,53760] |
| SYNC | 1 | A copy of the User Packet Sync-byte |
| SYNCD | 2 | The distance in bits from the beginning of the DATA FIELD to the first complete UP of the data field. SYNCD=$0_L$ means that the first UP is aligned to the beginning of the Data Field. SYNCD = $65535_D$ means that no UP starts in the DATA FIELD. |
| CRC-8 MODE | 1 | The XOR of the CRC-8 (1-byte) field with the MODE field (1-byte). CRC-8 is the error detection code applied to the first 9 bytes of the BBHEADER.<br>MODE (8 bits) shall be:<br>• 0, Normal Mode<br>• 1, High Efficiency Mode<br>• Other values : reserved for future use. |

Fig. 39

| Capacity (bit/s/Hz) | | | Case 1 Modulation | Case 2 Modulation |
|---|---|---|---|---|
| 6 | 1/2 | 3.0 | NU-MQAM | NU-QAM |
| | 2/3 | 4.0 | NU-MQAM | NU-QAM |
| | 3/4 | 4.5 | NU-MQAM | NU-MQAM |
| | 4/5 | 4.8 | MQAM | MQAM |
| | 5/6 | 5.0 | MQAM | MQAM |
| | 8/9 | 5.3 | MQAM | MQAM |
| | 9/10 | 5.4 | MQAM | MQAM |
| 8 | 1/2 | 4.0 | NU-MQAM | NU-QAM |
| | 2/3 | 5.3 | NU-MQAM | NU-QAM |
| | 3/4 | 6.0 | NU-MQAM | NU-MQAM |
| | 4/5 | 6.4 | NU-MQAM | NU-MQAM |
| | 5/6 | 6.7 | MQAM | MQAM |
| | 8/9 | 7.1 | MQAM | MQAM |
| | 9/10 | 7.2 | MQAM | MQAM |
| 10 | 1/2 | 5.0 | NU-MQAM | NU-QAM |
| | 2/3 | 6.7 | NU-MQAM | NU-QAM |
| | 3/4 | 7.5 | NU-MQAM | NU-MQAM |
| | 4/5 | 8.0 | NU-MQAM | NU-MQAM |
| | 5/6 | 8.3 | NU-MQAM | NU-MQAM |
| | 8/9 | 8.9 | MQAM | MQAM |
| | 9/10 | 9.0 | MQAM | MQAM |
| 12 | 1/2 | 6.0 | NU-MQAM | NU-QAM |
| | 2/3 | 8.0 | NU-MQAM | NU-QAM |
| | 3/4 | 9.0 | NU-MQAM | NU-MQAM |
| | 4/5 | 9.6 | NU-MQAM | NU-MQAM |
| | 5/6 | 10.0 | NU-MQAM | NU-MQAM |
| | 8/9 | 10.7 | MQAM | MQAM |
| | 9/10 | 10.8 | MQAM | MQAM |

Fig. 40

| Capacity (bit/s/Hz) | | | Case 1 Modulation | Case 2 Modulation | Case 2 Modulation |
|---|---|---|---|---|---|
| 2 | 1/2 | 3.0 | QAM | QAM | QAM |
| | 2/3 | 4.0 | QAM | QAM | QAM |
| | 3/4 | 4.5 | QAM | QAM | QAM |
| | 4/5 | 4.8 | QAM | QAM | QAM |
| | 5/6 | 5.0 | QAM | QAM | QAM |
| | 8/9 | 5.3 | QAM | QAM | QAM |
| | 9/10 | 5.4 | QAM | QAM | QAM |
| 4 | 1/2 | 3.0 | QAM | QAM | QAM |
| | 2/3 | 4.0 | QAM | QAM | QAM |
| | 3/4 | 4.5 | QAM | QAM | QAM |
| | 4/5 | 4.8 | QAM | QAM | QAM |
| | 5/6 | 5.0 | QAM | QAM | QAM |
| | 8/9 | 5.3 | QAM | QAM | QAM |
| | 9/10 | 5.4 | QAM | QAM | QAM |
| 6 | 1/2 | 3.0 | QAM | QAM | QAM |
| | 2/3 | 4.0 | QAM | QAM | QAM |
| | 3/4 | 4.5 | QAM | QAM | QAM |
| | 4/5 | 4.8 | QAM | QAM | QAM |
| | 5/6 | 5.0 | QAM | QAM | QAM |
| | 8/9 | 5.3 | QAM | QAM | QAM |
| | 9/10 | 5.4 | QAM | QAM | QAM |
| 8 | 1/2 | 4.0 | QAM | QAM | QAM |
| | 2/3 | 5.3 | QAM | QAM | QAM |
| | 3/4 | 6.0 | QAM | QAM | QAM |
| | 4/5 | 6.4 | QAM | QAM | QAM |
| | 5/6 | 6.7 | QAM | QAM | QAM |
| | 8/9 | 7.1 | QAM | QAM | QAM |
| | 9/10 | 7.2 | QAM | QAM | QAM |
| 10 | 1/2 | 5.0 | NU-MQAM | NU-QAM | MQAM |
| | 2/3 | 6.7 | NU-MQAM | NU-QAM | MQAM |
| | 3/4 | 7.5 | NU-MQAM | NU-MQAM | MQAM |
| | 4/5 | 8.0 | NU-MQAM | NU-MQAM | MQAM |
| | 5/6 | 8.3 | NU-MQAM | NU-MQAM | MQAM |
| | 8/9 | 8.9 | MQAM | MQAM | MQAM |
| | 9/10 | 9.0 | MQAM | MQAM | MQAM |
| 12 | 1/2 | 6.0 | NU-MQAM | NU-QAM | MQAM |
| | 2/3 | 8.0 | NU-MQAM | NU-QAM | MQAM |
| | 3/4 | 9.0 | NU-MQAM | NU-MQAM | MQAM |
| | 4/5 | 9.6 | NU-MQAM | NU-MQAM | MQAM |
| | 5/6 | 10.0 | NU-MQAM | NU-MQAM | MQAM |
| | 8/9 | 10.7 | MQAM | MQAM | MQAM |
| | 9/10 | 10.8 | MQAM | MQAM | MQAM |

Fig. 49

| Delay (µs) | 0.2 | 0.4 | 0.8 | 1.2 | 2.5 | 15 |
|---|---|---|---|---|---|---|
| Att. (dB) | −11 | −14 | −17 | −23 | −32 | −40 |

Negligible Delay path

Fig. 51
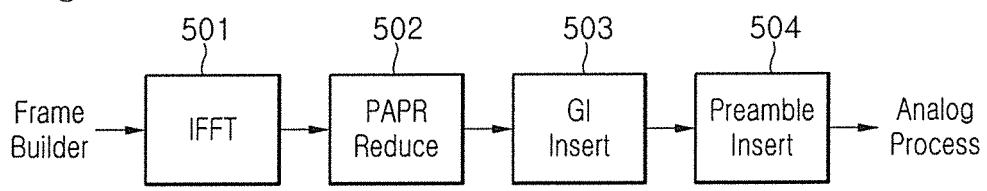
[Fig. 52]
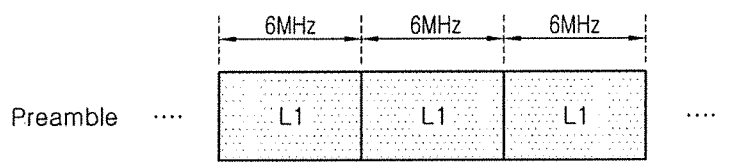
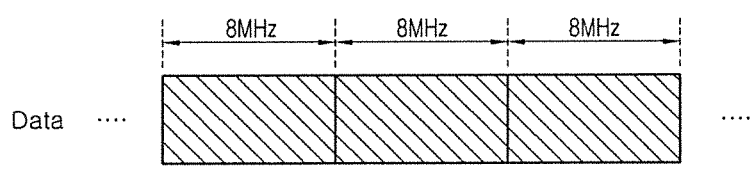

APPARATUS FOR TRANSMITTING AND RECEIVING A SIGNAL AND METHOD OF TRANSMITTING AND RECEIVING A SIGNAL

This application is a Continuation of U.S. application Ser. No. 14/480,094 filed Sep. 8, 2014, which is a Continuation of U.S. application Ser. No. 13/941,148 filed Jul. 12, 2013 (now issued as U.S. Pat. No. 8,867,640), which is a Continuation of U.S. application Ser. No. 12/922,156 filed Sep. 10, 2010 (now issued as U.S. Pat. No. 8,503,549), which is a 35 U.S.C. §371 National Stage entry of International Application No. PCT/KR2009/002503 filed May 12, 2009, and claims priority to U.S. Provisional Application No. 61/107,329 filed Oct. 21, 2008, all of which are hereby incorporated by reference in their entireties as if fully set forth herein.

TECHNICAL FIELD

The present invention relates to a method for transmitting and receiving a signal and an apparatus for transmitting and receiving a signal, and more particularly, to a method for transmitting and receiving a signal and an apparatus for transmitting and receiving a signal, which are capable of improving data transmission efficiency.

BACKGROUND ART

As a digital broadcasting technology has been developed, users have received a high definition (HD) moving image. With continuous development of a compression algorithm and high performance of hardware, a better environment will be provided to the users in the future. A digital television (DTV) system can receive a digital broadcasting signal and provide a variety of supplementary services to users as well as a video signal and an audio signal.

Digital Video Broadcasting (DVB)-C2 is the third specification to join DVB's family of second generation transmission systems. Developed in 1994, today DVB-C is deployed in more than 50 million cable tuners worldwide. In line with the other DVB second generation systems, DVB-C2 uses a combination of Low-density parity-check (LDPC) and BCH codes. This powerful Forward Error correction (FEC) provides about 5 dB improvement of carrier-to-noise ration over DVB-C. Appropriate bit-interleaving schemes optimize the overall robustness of the FEC system. Extended by a header, these frames are called Physical Layer Pipes (PLP). One or more of these PLPs are multiplexed into a data slice. Two dimensional interleaving (in the time and frequency domains) is applied to each slice enabling the receiver to eliminate the impact of burst impairments and frequency selective interference such as single frequency ingress.

DISCLOSURE OF INVENTION

Technical Problem

With the development of these digital broadcasting technologies, a requirement for a service such as a video signal and an audio signal increased and the size of data desired by users or the number of broadcasting channels gradually increased.

TECHNICAL SOLUTION

Accordingly, the present invention is directed to a method for transmitting and receiving a signal and an apparatus for transmitting and receiving a signal that substantially obviate one or more problems due to limitations and disadvantage of the related art.

An object of the present invention is to provide a method of transmitting broadcasting signal to a receiver having data for service and preamble data, the method comprising: mapping bits of preamble data into preamble data symbols and bits of data into data symbols; building at least one data slice based on the data symbols: building a signal frame based on the preamble data symbols and the data slice; modulating the signal frame by an Orthogonal Frequency Division Multiplexing (OFDM) method; and transmitting the modulated signal frame, wherein the preamble data symbols are divided into at least one layer 1 (L1) blocks, bandwidth of the L1 block corresponding to a number of active subcarriers assigned to a single channel.

Another aspect of the present invention provides a method of receiving broadcasting signal, the method comprising; demodulating received signals by use of an Orthogonal Frequency Division Multiplexing (OFDM) method; detecting a signal frame from the demodulated signals, the signal frame comprising preamble symbols and data symbols; demapping into bits for the preamble symbols and bits for the data symbols; and decoding the bits for the preamble symbols by a shortened and a Punctured LDPC (Low Density Parity Check) decoding scheme, wherein the preamble symbols are divided at least one Layer 1 (L1) blocks, bandwidth of the L1 block corresponding to a number of active subcarriers assigned to a single channel.

Yet another aspect of the present invention provides a transmitter of transmitting broadcasting signal having data for service and preamble data to a receiver, the transmitter comprising: a mapper configured to map bits of preamble data into preamble data symbols and bits of data into data symbols; a data slice builder configured to build at least one data slice based on the data symbols; a frame builder configured to build a signal frame based on the preamble data symbols and the data slice; a modulator configured to Modulate the signal frame by an Orthogonal Frequency Division Multiplexing (OFDM) method; and a transmission unit configured to transmit the modulated signal frame, wherein the transmitter is configured to process signals wherein the preamble data symbols are divided into at least one layer 1 (L1) blocks, bandwidth of the L1 block corresponding to a number of active sub-carriers assigned to a single channel.

Yet another aspect of the present invention provides a receiver of receiving broadcasting signal, the receiver comprising: a demodulator configured to demodulate received signals by use of an Orthogonal Frequency Division Multiplexing (OFDM) method; a frame parser configured to obtain a signal frame from the demodulated signals, the signal frame comprising preamble symbols and data symbols, a demapper configured to demap the obtained signal frame into bits for the preamble symbols and bite for the data symbols; and a decoder configured to decode the bits for the preamble symbols by a shortened and punctured LDPC (low density parity check) decoding scheme, wherein the receiver is configured to process signals wherein the preamble symbols are divided into at least one Layer 1 (L1) blocks, bandwidth of the L1 block corresponding to a number of active subcarriers assigned to a single channel.

BRIEF DESCRIPTION OF DRAWINGS

The accompanying drawings, which are included to provide a further understanding of the invention, and are incorporated in and constitute a part of this application, illustrate embodiment(s) of the invention and together with the description serve to explain the principle of the invention. In the drawing:

FIG. 6 is a method of modifying QAM using Reflected pair of BRGC.

FIGS. 8-9 are an example of modified 64-QAM using Reflected Pair of BRGC.

FIGS. 10-11 are an example of modified 256-QAM using Reflected Pair of BRGC.

FIGS. 12-13 are an example of modified 1024-QAM using Reflected Pair of BRGC (0~511).

FIGS. 14-15 are an example of modified 1024-QAM using Reflected Pair of BRGC (512~1023).

Figure 17:
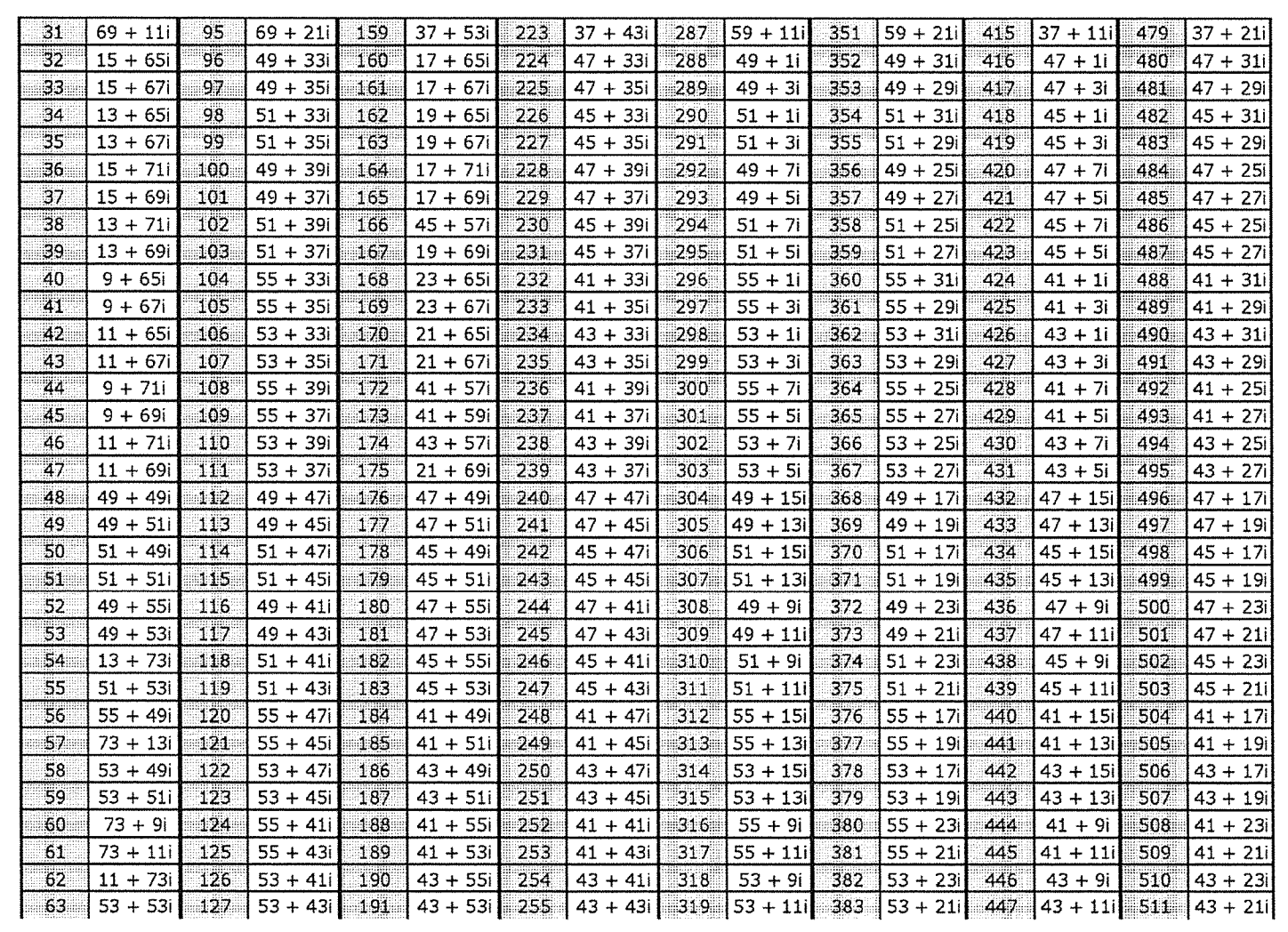

FIGS. 16-17 are an example of modified 4096-QAM using Reflected Pair of BRGC (0~511).

FIGS. 18-19 are an example of modified 4096-QAM using Reflected Pair of BRGC (512~1023).

FIGS. 20-21 are an example of modified 4096-QAM using Reflected Pair of BRGC (1024~1535).

FIGS. 22-23 are an example of modified 4096-QAM using Reflected Pair of BRGC (1536~2047).

FIGS. 24-25 are an example of modified 4096-QAM using Reflected Pair of BRGC (2048~2559).

FIGS. 26-27 are an example of modified 4096-QAM using Reflected Pair of BRGC (2560~3071).

Figure 29:
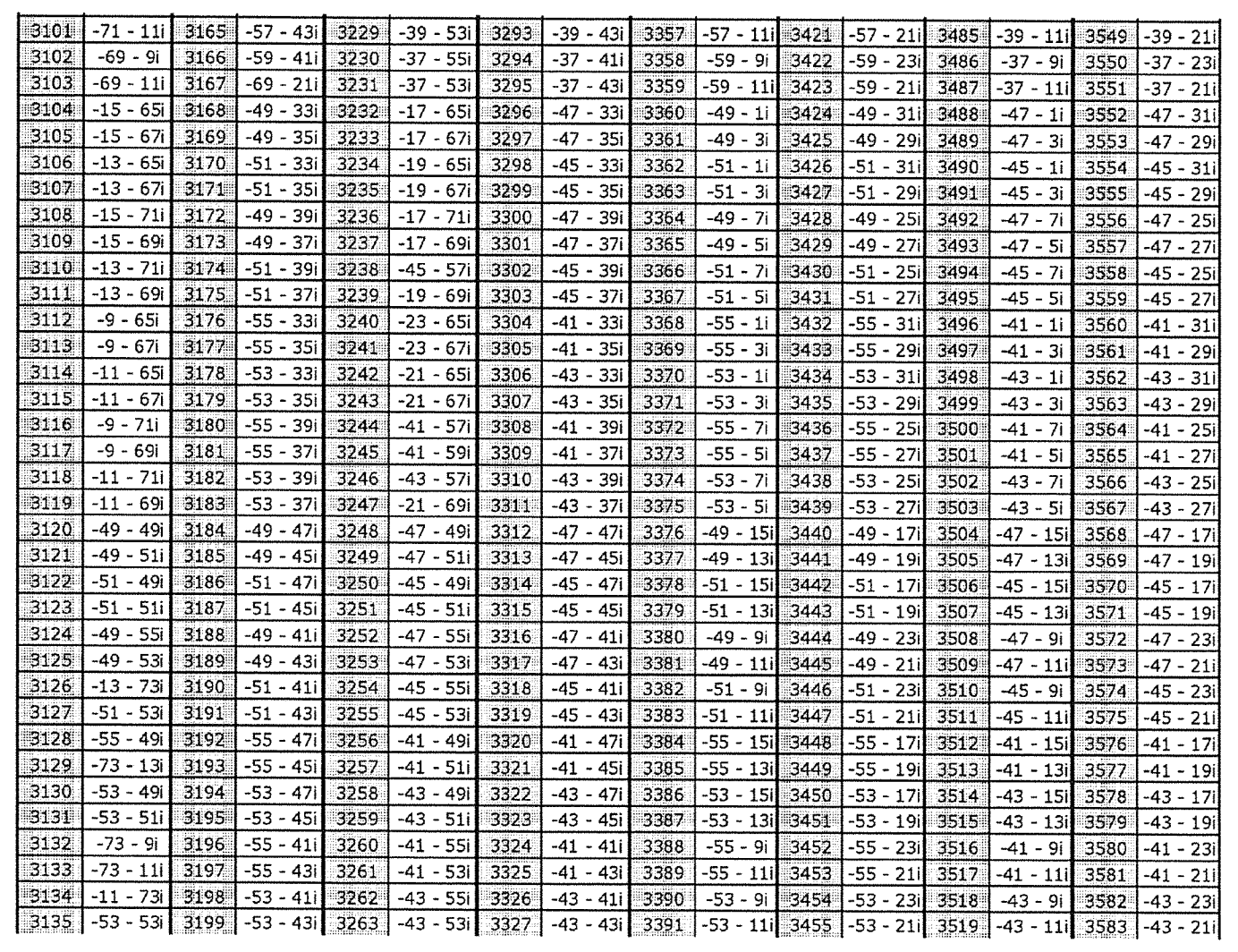

FIGS. 28-29 are an example of modified 4096-QAM using Reflected Pair of BRGC (3072~3583).

FIGS. 30-31 are an example of modified 4096-QAM using Reflected Pair of BRGC (3584~4095).

FIG. 33 is an example of transformation of MQAM into Non-uniform constellation.

FIG. 34 is an example of digital transmission system.

FIG. 36 is an information that can be included in Base band (BB).

FIG. 39 is an example of applying various constellations.

FIG. 40 is another example of cases where compatibility between conventional systems is considered.

FIG. 49 is an example of cable channel delay profile.

FIG. 51 is an example of modulator based on OFDM.

FIG. 52 is an example of preamble structure.

BEST MODE FOR CARRYING OUT THE INVENTION

Reference will now be made in detail to the preferred embodiments of the present invention, examples of which are illustrated in the accompanying drawings. Wherever possible, the same reference numbers will be used throughout the drawings to refer to the same or like parts.

In the following description, the term "service" is indicative of either broadcast contents which can be transmitted/received by the signal transmission/reception apparatus.

Figure 1:
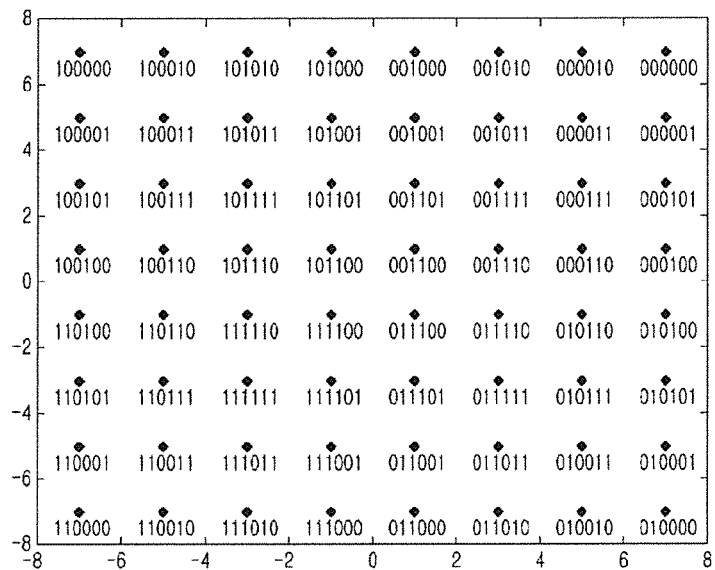
FIG. 1 is an example of 64-Quadrature amplitude modulation (QAM) used in European DVB-T.

Quadrature amplitude modulation (QAM) using Binary Reflected Gray Code (BRGC) is used as modulation in a broadcasting transmission environment where conventional Bit Interleaved Coded Modulation (BICM) is used. FIG. 1 shows an example of 64-QAM used in European DVB-T.

Figure 2:
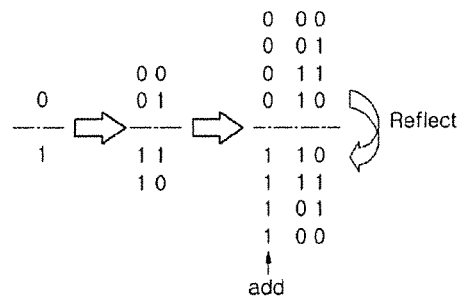
FIG. 2 is a method of Binary Reflected Gray Code (BRGC).

BRGC can be made using the method shown in FIG. 2. An n bit BRGC can be made by adding a reverse code of (n−1) bit BRGC (i.e., reflected code) to a back of (n−1) bit, by adding 0s to a front of original (n−1) bit BRGC, and by adding 1s to a front of reflected code. The BRGC code made by this method has a Hamming distance between adjacent codes of one (1). In addition, when BRGC is applied to QAM, the Hamming distance between a point and the four points which are most closely adjacent to the point, is one (1) and the Hamming distance between the point and another four points which are second most closely adjacent to the point, is two (2). Such characteristics of Hamming distances between a specific constellation point and other adjacent points can be dubbed as Gray mapping rule in QAM.

Figure 3:
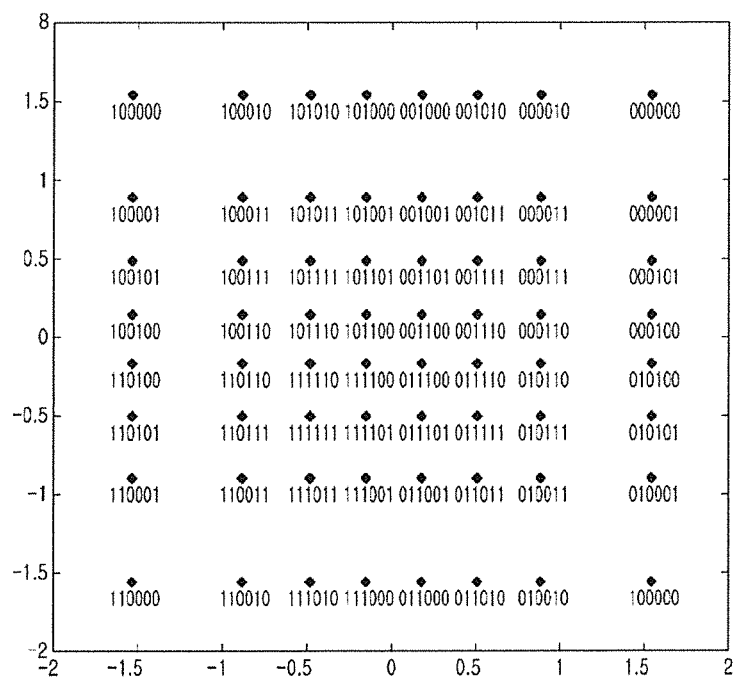
FIG. 3 is an output close to Gaussian by modifying 64-QAM used in DVB-T.

To make a system robust against Additive White Gaussian Noise (AWGN), distribution of signals transmitted from a transmitter can be made close to Gaussian distribution. To be able to do that, locations of points in constellation can be modified. FIG. 3 shows an output close to Gaussian by modifying 64-QAM used in DVB-T. Such constellation can be dubbed as Non-uniform QAM (NU-QAM).

To make a constellation of Non-uniform QAM, Gaussian Cumulative Distribution Function (CDF) can be used. In case of 64, 256, or 1024 QAM, i.e., $2^N$ AMs, QAM can be divided into two independent N-PAM. By dividing Gaussian CDF into N sections of identical probability and by allowing a signal point in each section to represent the section, a constellation having Gaussian distribution can be made. In other words, coordinate xj of newly defined non-uniform N-PAM can be defined as follows:

$$\int_{-\infty}^{x_j} \frac{1}{\sqrt{2\pi}} e^{-\frac{x^2}{2}} dx = p_j, P_j \in \left\{ \frac{1}{2N}, \frac{3}{2N}, \cdots, \frac{2N-1}{2N} \right\}$$ (Eq. 1)

FIG. 3 is an example of transforming 64QAM of DVB-T into NU-64QAM using the above methods. FIG. 3 represents a result of modifying coordinates of each I axis and Q axis using the above methods and mapping the previous constellation points to newly defined coordinates. In case of 32, 128, or 512 QAM, i.e., cross QAM, which is not 2^N QAM, by modifying Pj appropriately, a new coordinate can be found.

Figure 4:
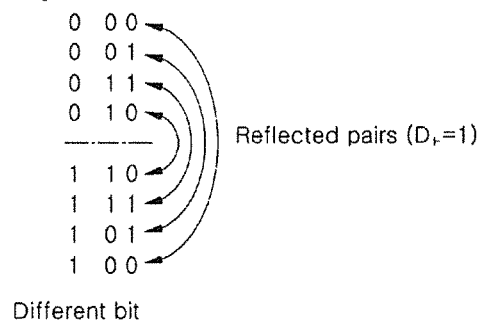
FIG. 4 is Hamming distance between Reflected pair in BRGC.
Figure 5:
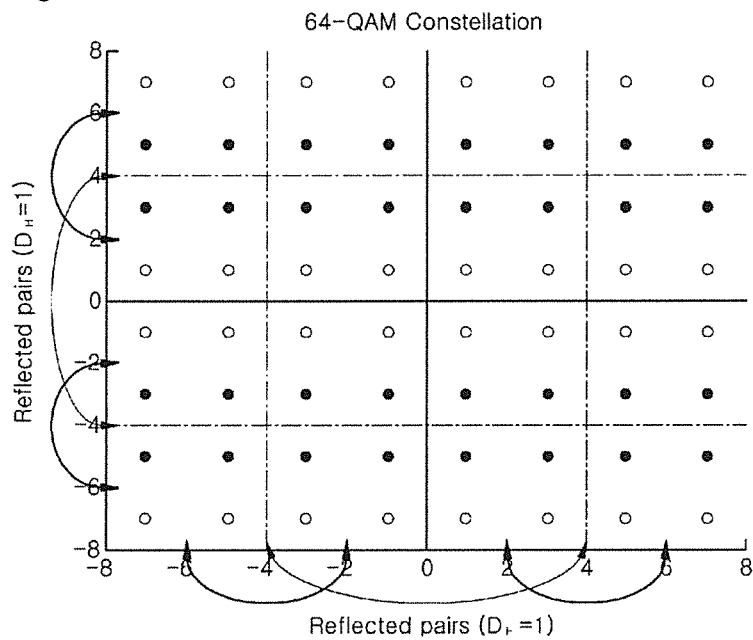
FIG. 5 is characteristics in QAM where Reflected pair exists for each 1 axis and Q axis.

One embodiment of the present invention can modify QAM using BRGC by using characteristics of BRGC. As shown in FIG. 4, the Hamming distance between Reflected pair in BRGC is one because it differs only in one bit which is added to the front of each code. FIG. 5 shows the characteristics in QAM where Reflected pair exists for each I axis and Q axis. In this figure, Reflected pair exists on each side of the dotted black line.

By using Reflected pairs existing in QAM, an average power of a QAM constellation cars be lowered while keeping Gray mapping rule in QAM. In other words, in a constellation where an average power is normalized as 1, the minimum Euclidean distance in the constellation can be increased. When this modified QAM is applied to broadcasting or communication systems, it is possible to implement either a more noise-robust system using the same energy as a conventional system or a system with the same performance as a conventional system but which uses less energy.

FIG. 6 shows a method of modifying QAM using Reflected pair of BRGC. FIG. 6a shows a constellation and FIG. 6b shows a flowchart for modifying QAM using Reflected pair of BRGC. First, a target point which has the highest power among constellation points needs to be found. Candidate points are points where that target point can move and are the closest neighbor points of the target point's reflected pair. Then, an empty point (i.e., a point which is not yet taken by other points) having the smallest power needs to be found among the candidate points and the power of the target point and the power of a candidate point are compared. If the power of the candidate point is smaller, the target point moves to the candidate point. These processes are repeated until an average power of the points on constellation reaches a minimum while keeping Gray mapping rule.

Figure 7:
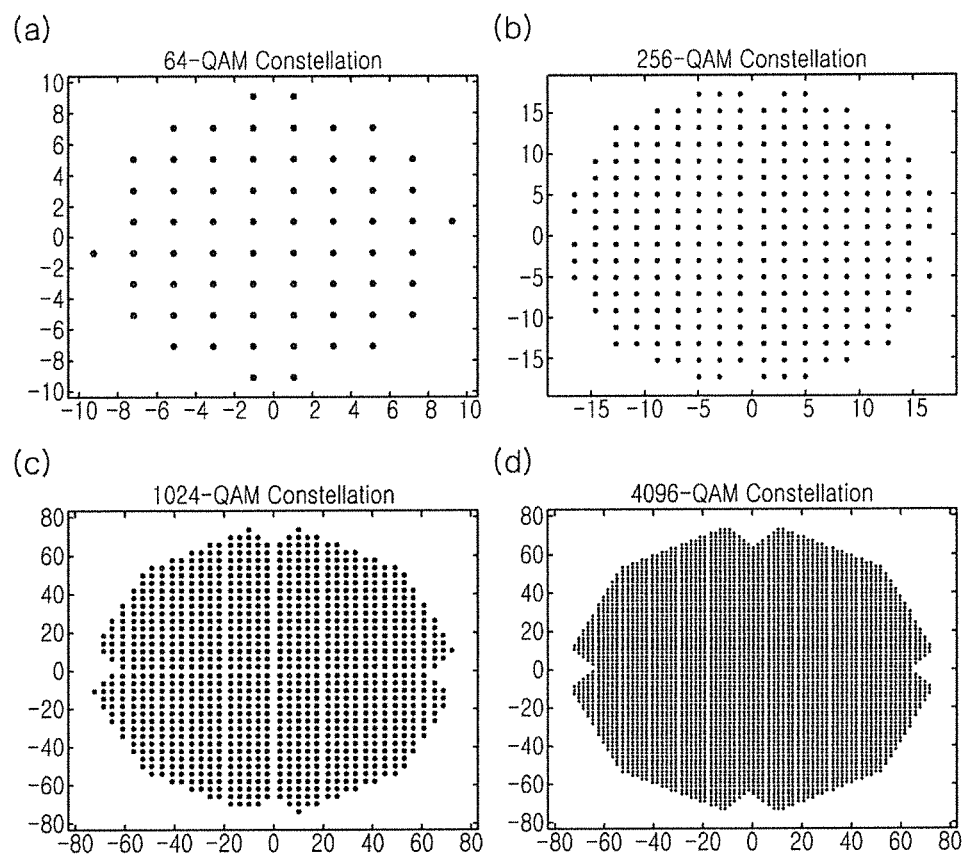
FIG. 7 is an example of modified 64/256/1024/4096-QAM.

FIG. 7 shows an example of modified 64/256/1024/4096-QAM. The Gray mapped valises correspond to FIGS. 8~31 respectively. In addition to these examples, other types of modified QAM which enables identical power optimization can be realized. This is because a target point can move to multiple candidate points. The suggested modified QAM can be applied to, not only the 64/256/1024/4096-QAM, but also cross QAM, a bigger size QAM, or modulations using other BRGC other than QAM.

Figure 32:
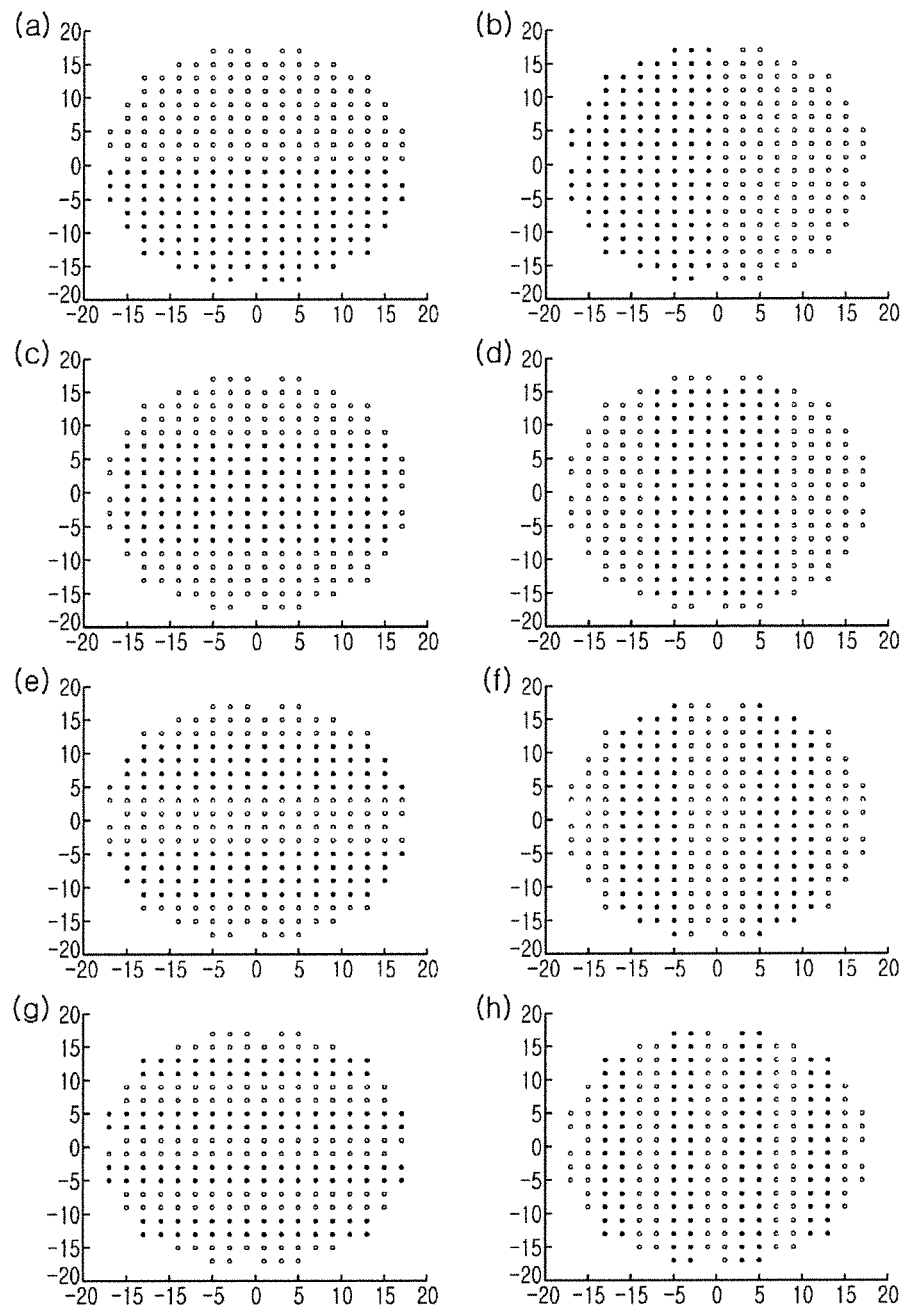
FIG. 32 is an example of Bit mapping of Modified-QAM where 256-QAM is modified using BRGC.

FIG. 32 shows an example of Bit mapping of Modified-QAM where 256-QAM is modified using BRGC. FIG. 32a and FIG. 32b show mapping of Most Significant Bits (MSB). Points designated as filled circles represent mappings of ones and points designated as blank circles represent mappings of zeros. In a same manner, each bit is mapped as shown in figures from (a) through (h) in FIG. 32, until Least Significant Bits (LSB) am mapped. As shown in FIG. 32, Modified-QAM can enable bit decision using only I or Q axes as conventional QAM, except for a bit which is next to MSB (FIG. 32c and FIG. 32d). By using these characteristics, a simple receiver can be made by partially modifying a receiver far QAM. An efficient receiver can be implemented by checking both I and Q values only when determining bit next to MSB and by calculating only I or Q for the rest of bits. This method can be applied to Approximate LLR, Exact LLR, or Hard decision.

By using the Modified-QAM or MQAM, which uses the characteristics of above BRGC, Non-uniform constellation or NU-MQAM can be made. In the above equation where Gaussian CDF is used, Pj can be modified to fit MQAM. Just like QAM, in MQAM, two PAMs having I axis and Q axis can be considered. However, unlike QAM where a number of points corresponding to a value of each PAM axis are identical, the number of points changes in MQAM. If a number of points that corresponds to jth value of PAM is defined as nj in a MQAM where a total of M constellation points exist, then Pj can be defined as follows;

$$\int_{-\infty}^{x_j} \frac{1}{\sqrt{2\pi}} e^{-\frac{x^2}{2}} dx = P_j$$ (Eq. 2)

$$P_j = \frac{\sum_{i=0}^{i=j-1} n_i + \frac{n_j}{2N}}{M}, n_0 = 0$$

By using the newly defined Pj, MQAM can be transformed, into Non-uniform constellation, Pj can be defiend as follows for the example of 256-MQAM.

$$P_j \in \left\{ \frac{2.5}{256}, \frac{10}{256}, \frac{22}{256}, \frac{36}{256}, \frac{51}{256}, \frac{67}{256}, \frac{84}{256}, \frac{102}{256}, \frac{119.5}{256}, \right.$$
$$\left. \frac{136.5}{256}, \frac{154}{256}, \frac{172}{256}, \frac{189}{256}, \frac{205}{256}, \frac{220}{256}, \frac{234}{256}, \frac{246}{256}, \frac{253.5}{256} \right\}$$

FIG. 33 is an example of transformation of MQAM into Non-uniform constellation. The NU-MQAM made using these methods can retain characteristics of MQAM receivers with modified coordinates of each PAM. Thus, an efficient receiver can be implemented. In addition, a more noise-robust system than the previous NU-QAM can be implemented. For a more efficient broadcasting transmission system, hybridizing MQAM and NU-MQAM is possible. In other words, a more noise-robust system can be implemented by using MQAM for an environment where an error correction code with high code rate is used and by using NU-MQAM otherwise. For such a case, a transmitter can let a receiver have information of code rate of an error correction code currently used and a kind of modulation currently used such that the receiver can demodulate according to the modulation currently used.

FIG. 34 shows an example of digital transmission system. Inputs can comprise a number of MPEG-TS streams or GSE (General Stream Encapsulation) streams. An input processor module 101 can add transmission parameters to input stream and perform scheduling for a BICM module 102. The BICM module 102 can add redundancy and interleave data for transmission channel error correction. A frame builder 103 can build frames by adding physical layer signaling information and pilots. A modulator 104 can perform modulation on input symbols in efficient methods. An analog processor 105 can perform various processes for converting input digital signals into output analog signals.

Figure 35:
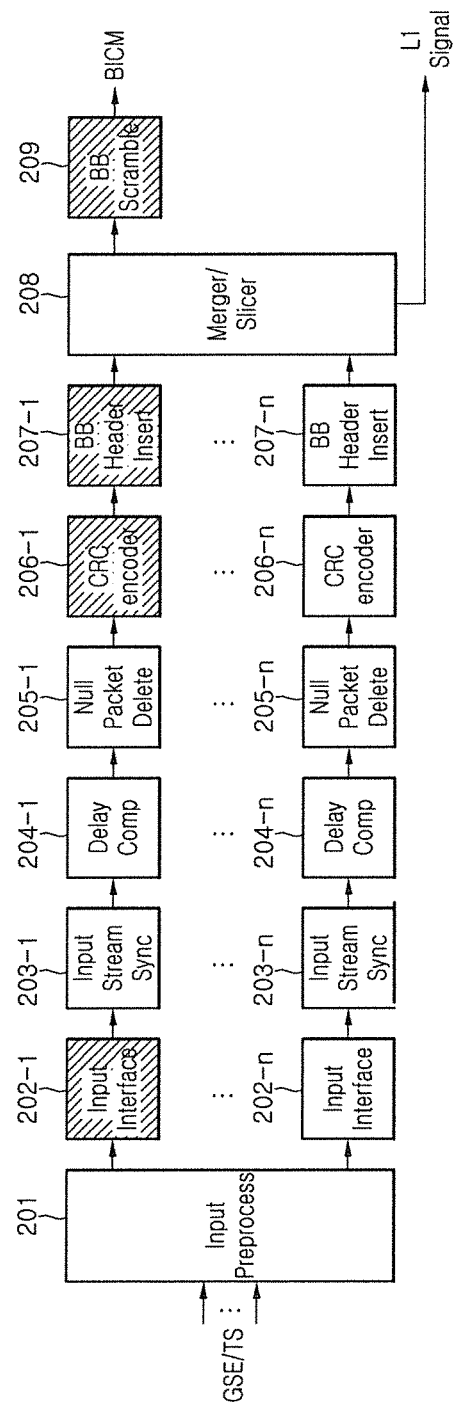
FIG. 35 is an example of an input processor.

FIG. 35 shows an example of an input processor. Input MPEG-TS or GSE stream can be transformed by input preprocessor into a total of n streams which will be independently processed. Each of those streams can be either a complete TS frame which includes multiple service components or a minimum TS frame which includes service component (i.e., video or audio). In addition, each of those streams can be a GSE stream which transmits either multiple services or a single service.

Input interface module 202-1 can allocate a number of input bits equal to the maximum data field capacity of a Baseband (BB) frame. A padding may be inserted to complete the LDPC/BCH code block capacity. The input stream sync module 203-1 can provide a mechanism to regenerate, in the receiver, the clock of the Transport Stream (or packetized Generic Stream), in order to guarantee end-to-end constant bit rates and delay.

In order to allow the Transport Stream recombining without requiring additional memory in the receiver, the input Transport Streams are delayed by delay compensators 204-1~n considering interleaving parameters of the data PLPs in a group and the corresponding common PLP. Null packet deleting modules 205-1~n can increase transmission efficiency by removing inserted null packet for a case of VBR (variable bit rate) service. Cyclic Redundancy Check (CRC) encoder modules 206-1~n can add CRC parity to increase transmission reliability of BB frame, BB header inserting modules 207-1~n can add BB frame header at a beginning portion of BB frame. Information that can be included in BB header is shown in FIG. 36.

A Merger/slicer module 208 can perform BB frame slicing from each PLP, merging BB frames from multiple PLPs, and scheduling each BB frame within a transmission frame. Therefore, the merger/slicer module 208 can output L1 signaling information which relates to allocation of PLP in frame. Lastly, a BB scrambler module 209 can randomize input bitstreams to minimize correlation between bits within bitstreams. The modules in shadow in FIG. 35 are modules used when transmission system uses a single PLP, the other modules in FIG. 35 are modules used when the transmission device uses multiple PLPs.

Figure 37:
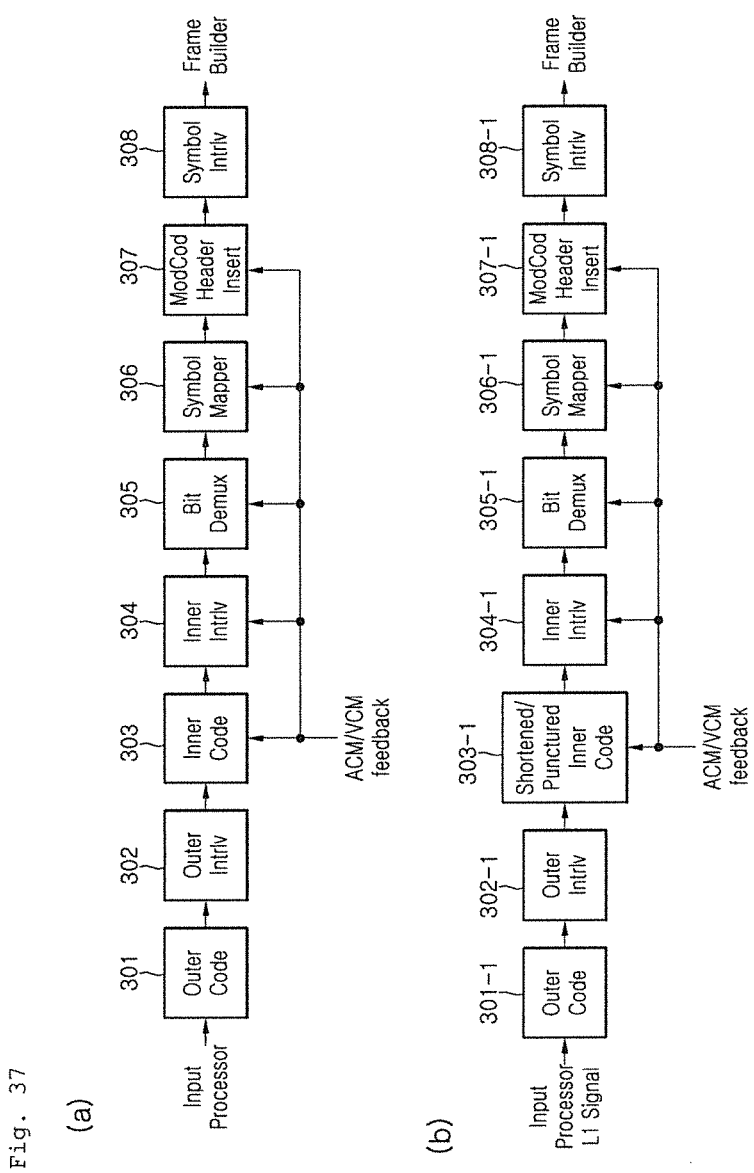
FIG. 37 is an example of BICM.

FIG. 37 shows an example of BICM module. FIG. 37a shows data path and FIG. 37b shows L1 path of BICM module. An outer coder module 301 and an inner coder module 303 can add redundancy to input bitstreams for error correction. An outer interleaver module 302 and an inner interleaver module 304 can interleave bits to prevent burst error. The Outer interleaver module 302 can be omitted if the BICM is specifically for DVB-C2. A bit demux module 305 can control reliability of each bit output from the inner interleaver module 304. A symbol mapper module 306 can map input bitstreams into symbol streams. At this time, it is possible to use any of a conventional QAM, an MQAM which uses the aforementioned BRGC for performance improvement, an NU-QAM which uses Non-uniform modulation, or an NU-MQAM which uses Non-uniform modulation applied BRGC for performance improvement. To construct a system which is more robust against noise, combinations of modulations using MQAM and/or NU-MQAM depending on the code rate of the error correction code and the constellation capacity can be considered. At this time, the Symbol mapper module 306 can use a proper constellation according to the code rate and constellation, capacity. FIG. 39 shows an example of such combinations.

Case 1 shows an example of using only NU-MQAM at low code rate for simplified system implementation. Case 2 shows an example of using optimized constellation at each code rate. The transmitter can send information about the code rate of the error correction code and the constellation capacity to the receiver such that the receiver can use an appropriate constellation. FIG. 40 shows another example of cases where compatibility between conventional systems is considered. In addition to the examples, further combinations for optimizing the system am possible.

The ModCod Header inserting module 307 shown in FIG. 37 can take Adaptive coding and modulation (ACM)/Variable coding and modulation (VCM) feedback information and add parameter information used in coding and modulation to a FEC block as header. The Modulation type/Coderate (ModCod) header can include the following information;

*FEC type (1 bits)-long or short LDPC
*Coderate (3 bits)
*Modulation (3 bits)-up-to 64 K QAM
*PLP identifier (8 bits)

The Symbol interleaver module 308 can perform interleaving in symbol domain to obtain additional interleaving effects. Similar processes performed on data path can be performed on L1 signaling path but with possibly different parameters (301-1~308-1). At this point, a shortened/punctured code module (303-1) can be used for inner code.

Figure 38:
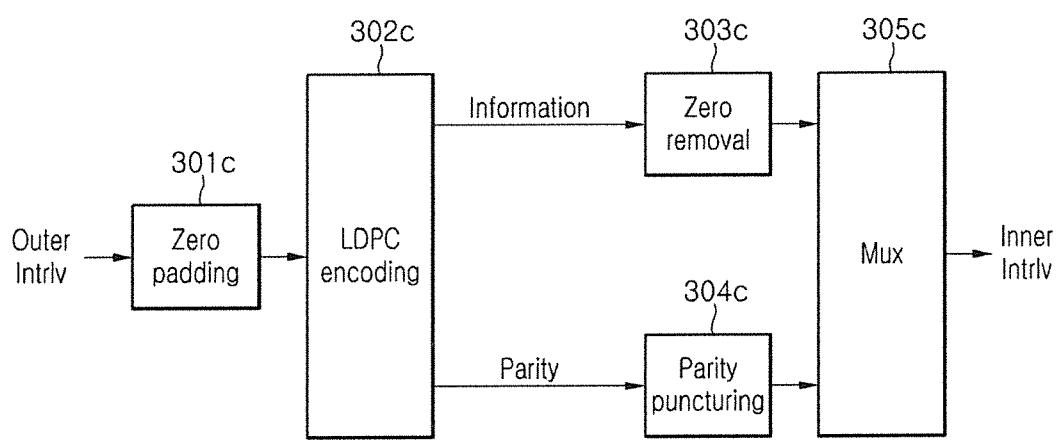
FIG. 38 is an example of shortened/punctured encoder.

FIG. 38 shows an example of LDPC encoding using shortening/puncturing. Shortening process can be performed on input blocks which have less bits than a required number of bits for LDPC encoding as many zero bits required for LDPC encoding can be padded (301c). Zero Padded input bitstreams can have parity bits through LDPC encoding (302c). At this time, for bitstreams that correspond to original bitstreams, zeros can be removed (303c) and for parity bitstreams, puncturing (304c) can be performed according to code-rates. These processed information bitstreams and parity bitstreams can be multiplexed into original sequences and outputted (305c).

Figure 41:
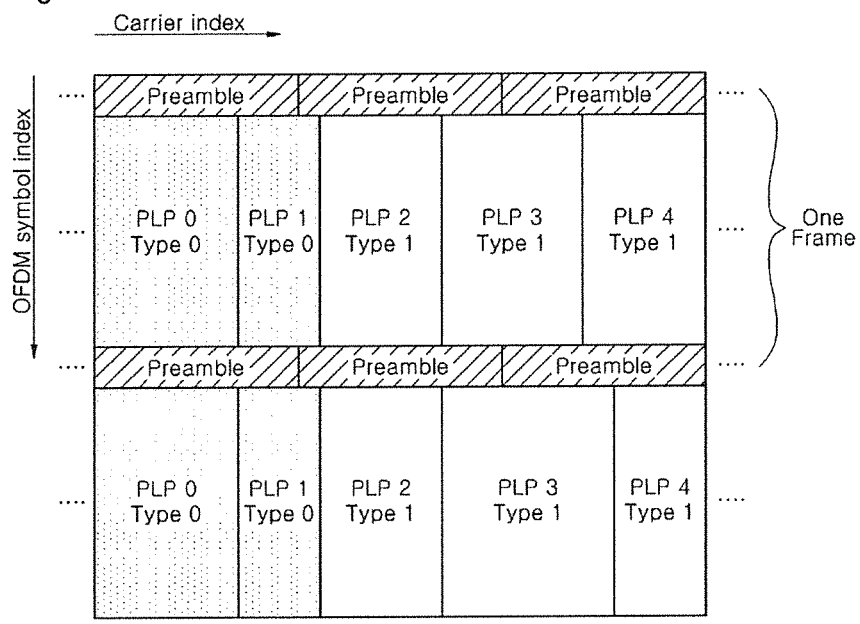
FIG. 41 is a frame structure which comprises preamble for L1 signaling and data symbol for PLP data.

FIG. 41 shows a frame structure which comprises preamble for L1 signaling and data symbol for PLP data. It can be seen that preamble and data symbols are cyclically generated, using one frame as a unit. Data symbols comprise PLP type 0 which is transmitted using a fixed modulation/coding and PLP type 1 which is transmitted using a variable modulation/coding. For PLP type 0, information such as modulation, FEC type, and FEC code rate are transmitted in preamble (see FIG. 42 Frame header insert 401). For PLP type 1, corresponding information can be transmitted in FEC block header of a data symbol (see FIG. 37 ModCod header insert 307). By the separation of PLP types, ModCod overhead can be reduced by 3~4% from a total transmission rate, for PLP type0 which is transmitted at a fixed bit rate. At a receiver, for fixed modulation/coding PLP of PLP type 0. Frame header remover r401 shown in FIG. 63 can extract information on Modulation and FEC code rate and provide the extracted information to a BICM decoding module. For variable modulation/coding PLP of PLP type 1, ModCod extracting modules, r307 and r307-1 shown in FIG. 64 can extract and provide the parameters necessary for BICM decoding.

Figure 42:
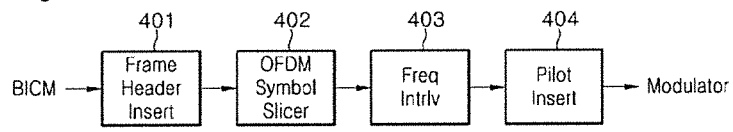
FIG. 42 is an example of frame builder.

FIG. 42 shows an example of a frame builder. A frame header inserting module 401 can form a frame from input symbol streams and can add frame header at front of each transmitted frame. The frame header can include the following information:

*Number of bonded channels (4 bits)
*Guard interval (2 bits)
*PAPR (2 bits)
*Pilot pattern (2 bits)
*Digital System identification (16 bits)
*Frame identification (16 bits)
*Frame length (16 bits) number of Orthogonal Frequency Division Multiplexing (OFDM) symbols per frame
*Superframe length (16 bits) number of frames per superframe
*number of PLPs (8 bits)
*for each PLP
PLP Identification (8 bits)
Channel bonding id (4 bits)
PLP start (9 bits)
PLP type (2 bits)—common PLP or others
PLP payload type (5 bits)
MC type (1 bit)—fixed/variable modulation & coding
if MC type=fixed modulation & coding
FEC type (1 bits)—long or short LDPC
Coderate (3 bits)
Modulation (3 bits)—up-to 64 K QAM
end if;
Number of notch channels (2 bits)
for each notch
Notch start (9 bits)
Notch width (9 bits)
end for;
PLP width (9 bits)—max number of FEC blocks of PLP
PLP time interleaving type (2 bits)
end for;
*CRC-32 (32 bits)

Channel bonding environment is assumed for L1 information transmitted in Frame header and data that correspond to each data slice is defined as PLP. Therefore, information such as PLP identifier, channel bonding identifier, and PLP start address are required for each channel used in bonding. One embodiment of this invention suggests transmitting ModCod field in FEC frame header if PLP type supports variable modulation/coding and transmitting ModCod field in Frame header if PLP type supports fixed modulation/coding to reduce signaling overhead. In addition, if a Notch band exists for each PLP, by transmitting the start address of the Notch and its width, decoding corresponding carriers at the receiver can become unnecessary.

Figure 43:
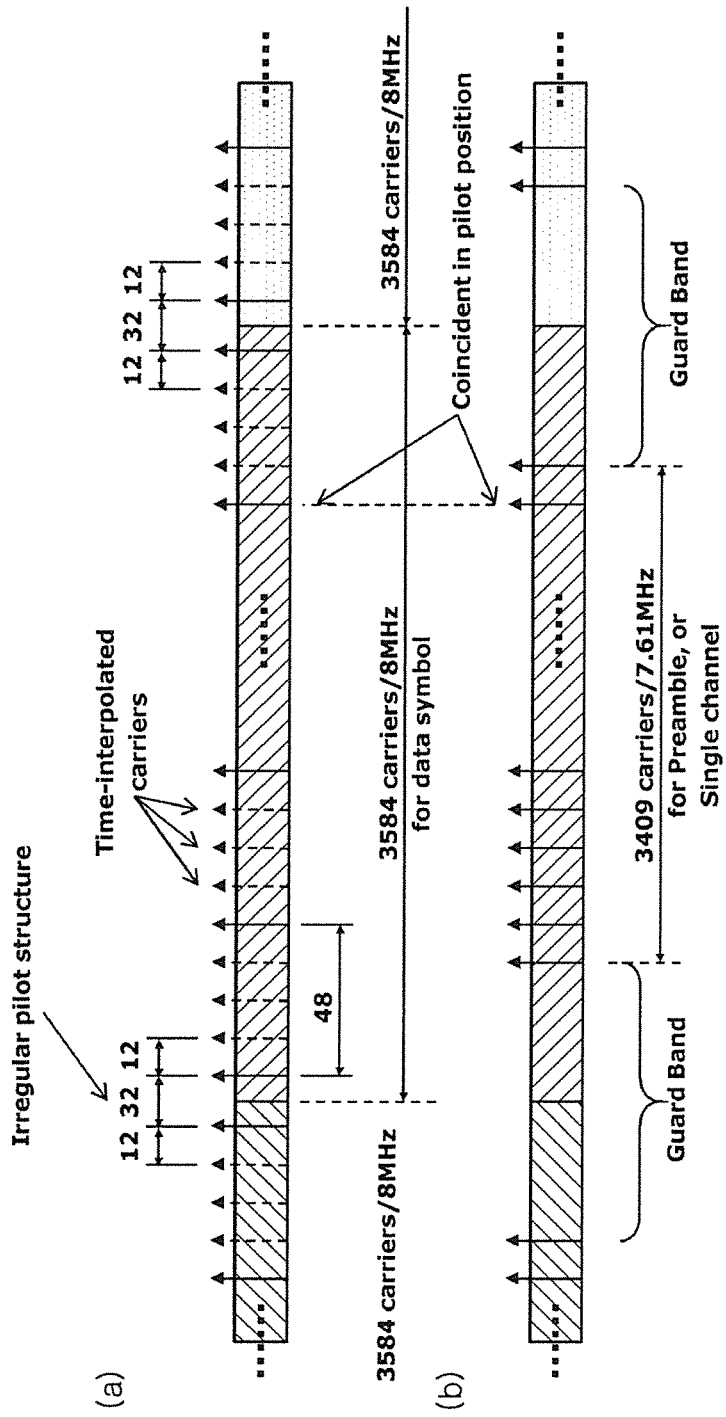
FIG. 43 is an example of pilot insert (404) shown in FIG. 4.

FIG. 43 shows an example of Pilot Pattern 5 (PP5) applied in a channel bonding environment. As shown, if SP positions are coincident with preamble pilot positions, irregular pilot structure can occur.

FIG. 43a shows an example of pilot inserting module 404 as shown in FIG. 42. As represented in FIG. 43, if a single frequency band (for example, 8 MHz) is used, the available bandwidth is 7.61 MHz, but if multiple frequency bands are bonded, guard bands can be removed, thus, frequency efficiency can increase greatly. FIG. 43b is an example of preamble inserting module 504 as shown in FIG. 51 that is transmitted at the front part of the frame and even with channel bonding, the preamble has repetition rate of 7.61 MHz, which is bandwidth of L1 block. This is a structure considering the bandwidth of a tuner which performs initial channel scanning.

Pilot Patterns exist for both Preamble and/Data Symbols. For data symbol, scattered pilot (SP) patterns can be used. Pilot Pattern 5 (PP5) and Pilot Pattern 7 (PP7) of T2 can be good candidates for frequency-only interpolation. PP5 has x=12, y=4, z=48 for GI=1/64 and PP7 has x=24, y=4, z=96 for GI=1/128. Additional time-interpolation is also possible for a better channel estimation. Pilot patterns for preamble can cover all possible pilot positions for initial channel acquisition. In addition, preamble pilot positions should be coincident with SP positions and a single pilot pattern for both the preamble and the SP is desired. Preamble pilots could also be used for time-interpolation and every preamble could have an identical pilot pattern. These requirements are important for C2 detection in scanning and necessary for frequency offset estimation with scrambling sequence correlation. In a channel bonding environment, the coincidence in pilot positions should also be kept for channel bonding because irregular pilot structure may degrade interpolation performance.

In detail, if a distance z between scattered pilots (SPs) in an OFDM symbol is 48 and if a distance y between SPs corresponding to a specific SP carrier along the time axis is 4, an effective distance x after time interpolation becomes 12. This is when a guard interval (GI) fraction is 1/64. If GI fraction is 1/128, x=24, y=4, and z=96 can be used. If channel bonding is used, SP positions can be made coincident with preamble pilot positions by generating non-continuous points in scattered pilot structure.

At this time, preamble pilot positions can be coincident with every SP positions of data symbol. When channel bonding is used, data slice where a service is transmitted, cast be determined regardless of 8 MHz bandwidth granularity. However, for reducing overhead for data slice addressing, transmission starting from SP position and ending at SP position can be chosen.

Figure 62:
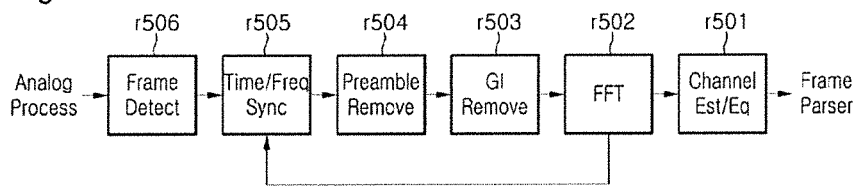
FIG. 62 is an example of demodulator.

When a receiver receives such SPs, if necessary, channel estimation module r501 shown in FIG. 62 can perform time interpolation to obtain pilots shown in dotted lines in FIG. 43 and perform frequency interpolation. At this time, for non-continuous points of which intervals are designated as 32 in FIG. 43, either performing interpolations on left and right separately or performing interpolations on only one side then performing interpolation on the other side by using the already interpolated pilot positions of which interval is 12 as a reference point can be implemented. At this time, data slice width can vary within 7.61 MHz, thus, a receiver can minimize power consumption by performing channel estimation and decoding only necessary subcarriers.

Figure 44:
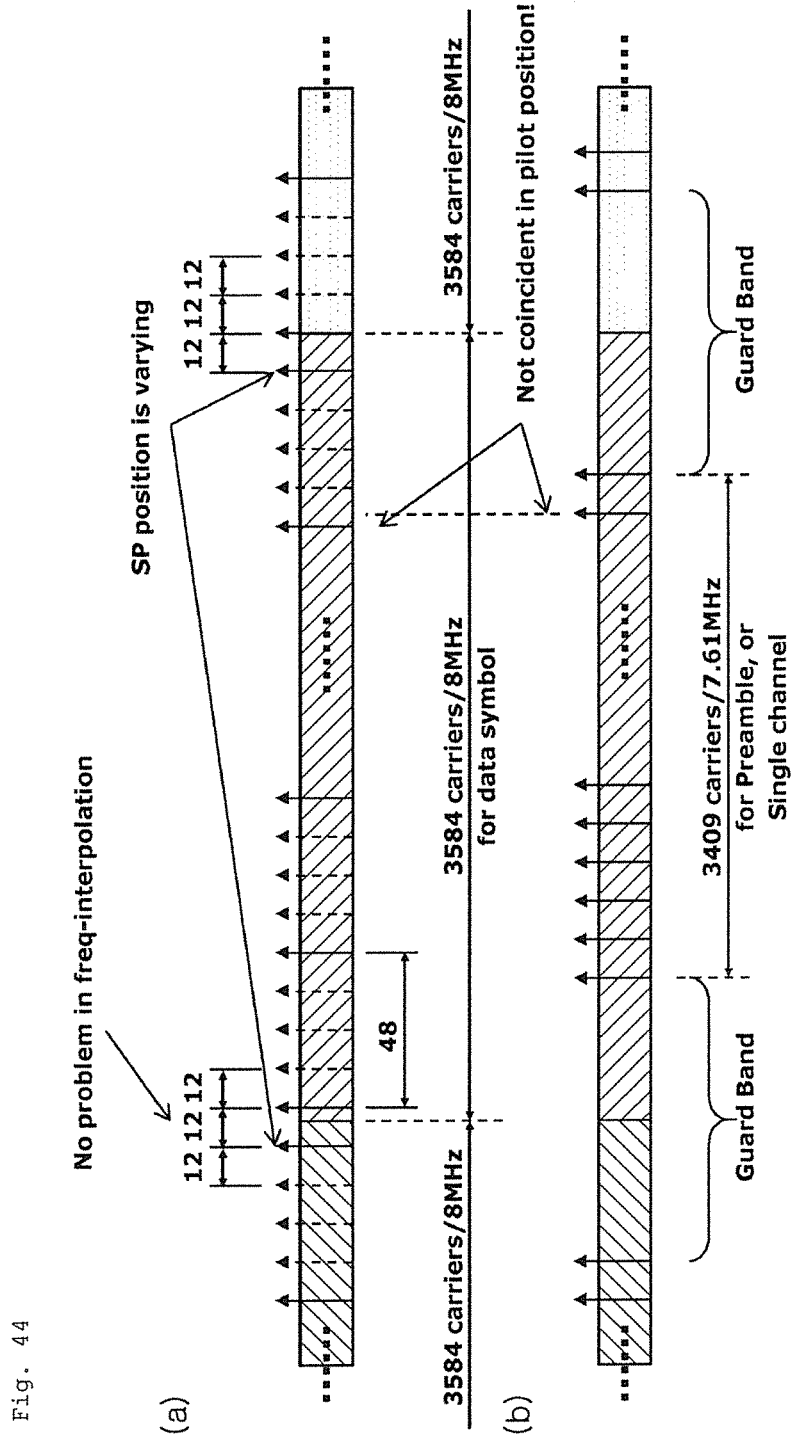
FIG. 44 is a structure of SP.

FIG. 44 shows another example of PP5 applied in channel tending environment or a structure of SP for maintaining effective distance x as 12 to avoid irregular SP structure shown in FIG. 43 when channel bonding is used. FIG. 44a is a structure of SP for data symbol and FIG. 44b is a structure of SP tor preamble symbol.

As shown, if SP distance is kept consistent in case of channel bonding, there will be no problem in frequency interpolation but pilot positions between data symbol and preamble may not be coincident. In other words, this structure does not require additional channel estimation for an irregular SP structure, however, SP positions used in channel bonding and preamble pilot positions become different for each channel.

Figure 45:
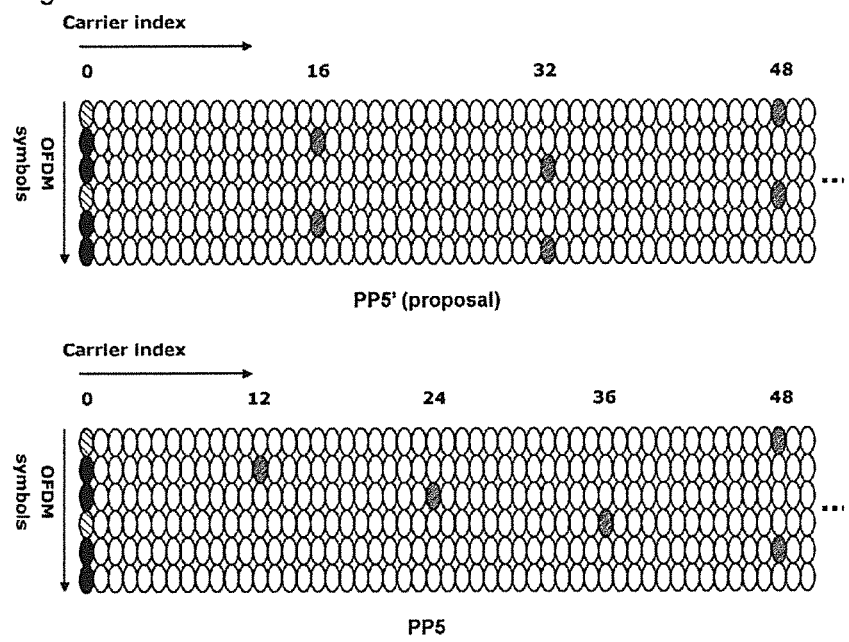
FIG. 45 is a new SP structure or Pilot Pattern (PP) 5.

FIG. 45 shows a new SP structure or PP5 to provide a solution to the two problems aforementioned in channel bonding environment. Specifically, a pilot distance of x=16 can solve those problems. To preserve pilot density or to maintain the same overhead, a PP5' can have x=16, y=3, z=48 for GI=1/64 and a PP7' can have x=16, y=6, z=96 for GI=1/128. Frequency-only interpolation capability can still be maintained. Pilot positions are depicted in FIG. 45 for comparison with PP5 structure.

Figure 46:
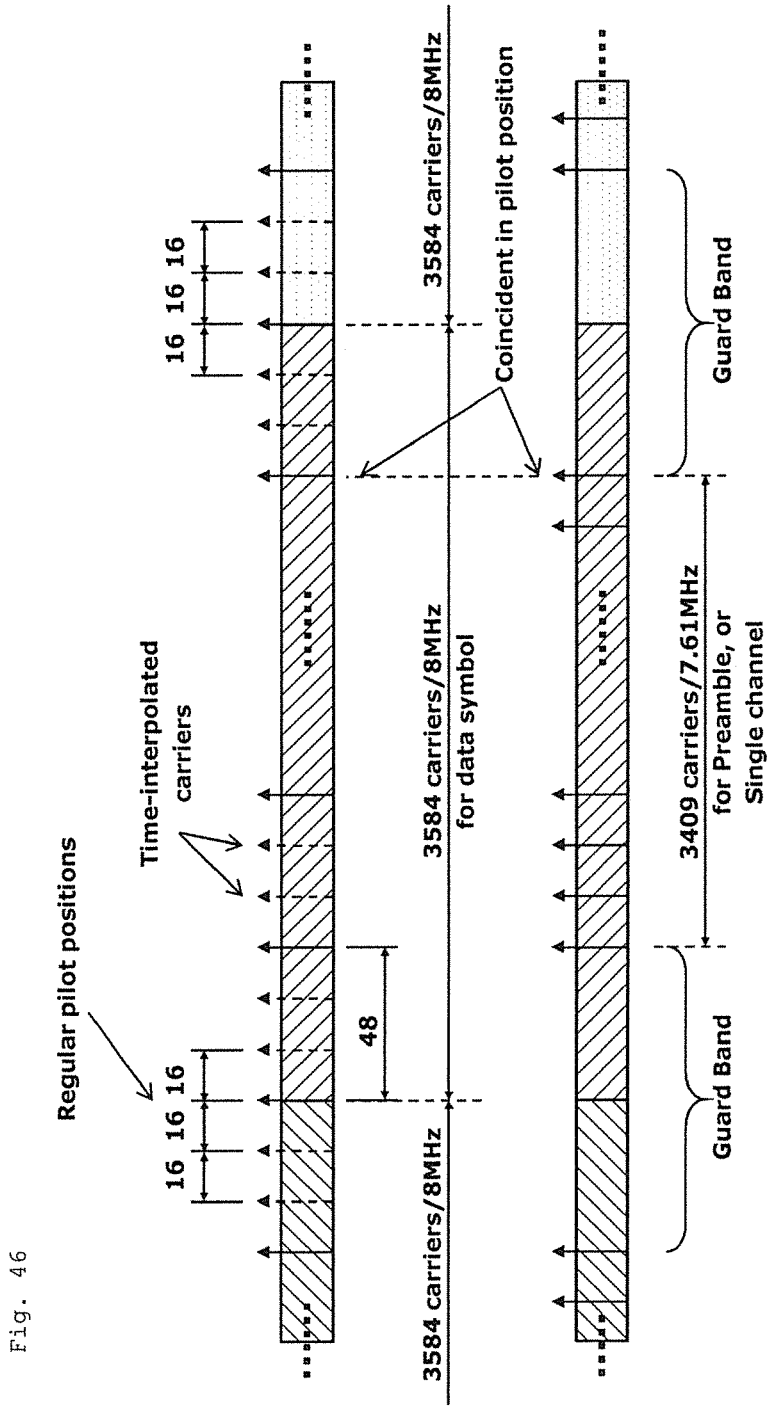
FIG. 46 is a suggested PP5' structure.

FIG. 46 shows an example of a new SP Pattern of PP5 structure in channel or channel bonding is used, an effective pilot distance x=16 can be provided. In addition, because SP positions can be made coincident with preamble pilot positions, channel estimation deterioration caused by SP irregularity or non-coincident SP positions can be avoided. In other words, no irregular SP position exists for freq-interpolator and coincidence between preamble and SP positions is provided.

Consequently, the proposed new SP patterns can be advantageous in that single SP pattern can be used for both single and bonded channel; no irregular pilot structure can be caused, thus a good channel estimation is possible; both preamble and SP pilot positions can be kept coincident; pilot density can be kept the same as for PP5 and PP7 respectively; and Frequency-only interpolation capability can also be preserved.

In addition, the preamble, the preamble structure can meet the requirements such as preamble pilot positions should cover all possible SP positions for initial channel acquisition; maximum number of carriers should be 3409 (7.61 MHz) for initial scanning; exactly same pilot patterns and scrambling sequence should be used for C2 detection; and no detection-specific preamble like P1 in T2 in required.

In terms of relation with frame structure, data slice position granularity may be modified to 16 carriers rather than 12, thus, less position addressing overhead can occur and no other problem, regarding data slice condition, Null slot condition etc can be expected.

Therefore, at channel estimation module r501 of FIG. 62, pilots in every preamble can be used when time interpolation of SP of data symbol is performed. Therefore, channel acquisition and channel estimation at the frame boundaries can be improved.

Now, regarding requirements related to the preamble and the pilot structure, there is consensus in that positions of preamble pilots and SPs should coincide regardless of channel bonding; the number of total carriers in L1 block should be dividable by pilot distance to avoid irregular structure at band edge; L1 blocks should be repeated in frequency domain; and L1 blocks should always be decodable in arbitrary tuner window position. Additional requirements would be that pilot positions and patterns should be repeated by period of 8 MHz; correct carrier frequency offset should be estimated without channel bonding knowledge; and L1 decoding (re-ordering) is impossible before the frequency offset is compensated.

Figure 47:
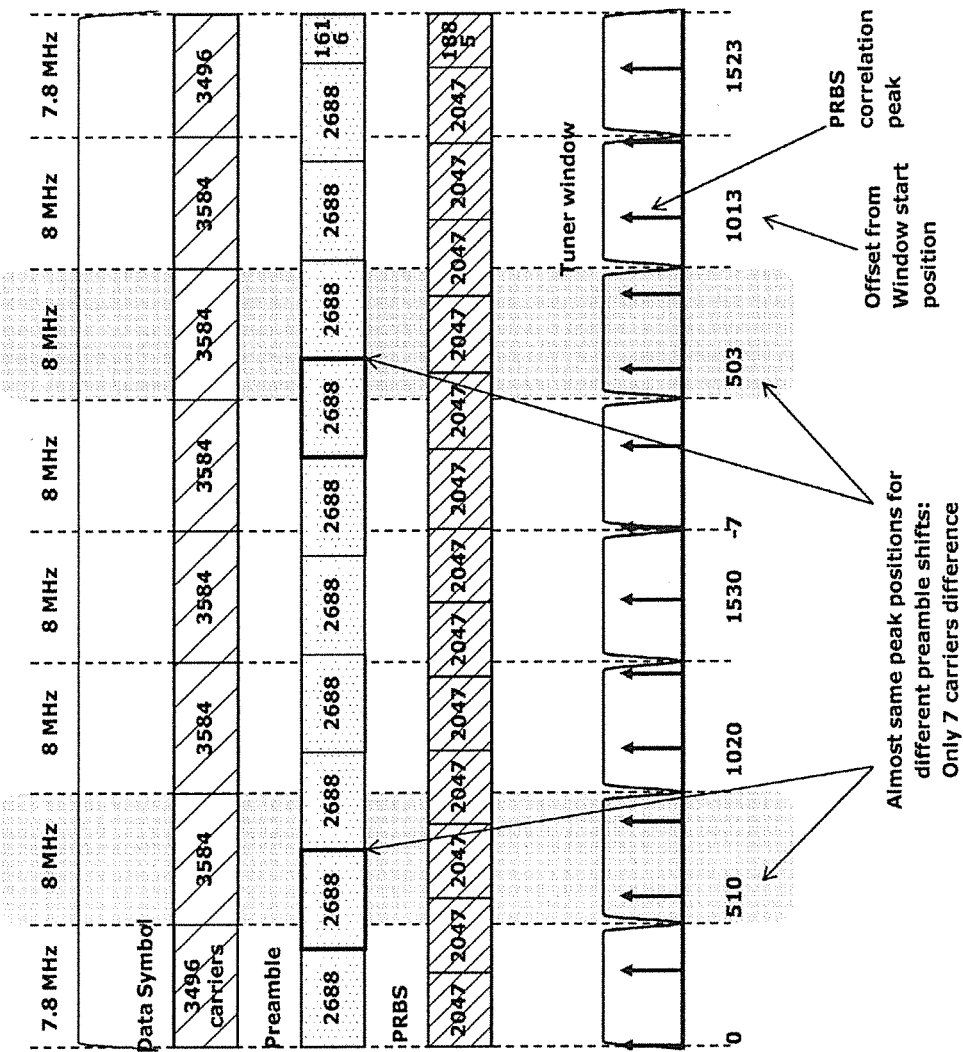
FIG. 47 is a relationship between data symbol and preamble.
Figure 53:
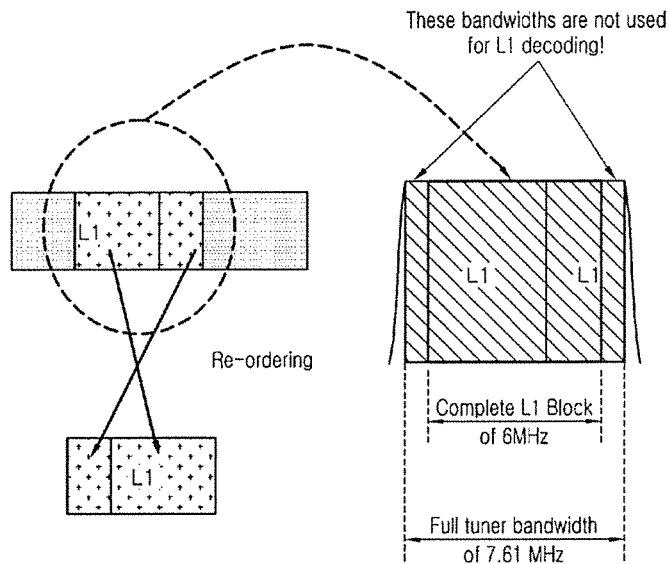
FIG. 53 is an example of Preamble decoding.

FIG. 47 shows a relationship between data symbol and preamble when preamble structures as shown in FIG. 52 and FIG. 53 are used. L1 block can be repeated by period of 6 MHz, for L1 decoding, both frequency offset and Preamble shift pattern should be found. L1 decoding is not possible in arbitrary tuner position without channel bonding information and a receiver cannot differentiate between preamble shift value and frequency offset.

Figure 63:
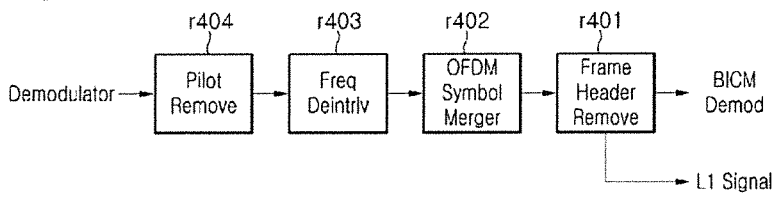
FIG. 63 is an example of frame parser.

Thus, a receiver, specifically for Frame header remover r401 shown in FIG. 63 to perform L1 signal decoding, channel bonding structure needs to be obtained. Because preamble shift amount expected at two vertically shadowed regions in FIG. 47 is known, time/freq synchronizing module r505 in FIG. 62 can estimate carrier frequency offset. Based on the estimation, L1 signaling path (r308-1~r301-1) in FIG. 64 can decode L1.

Figure 48:
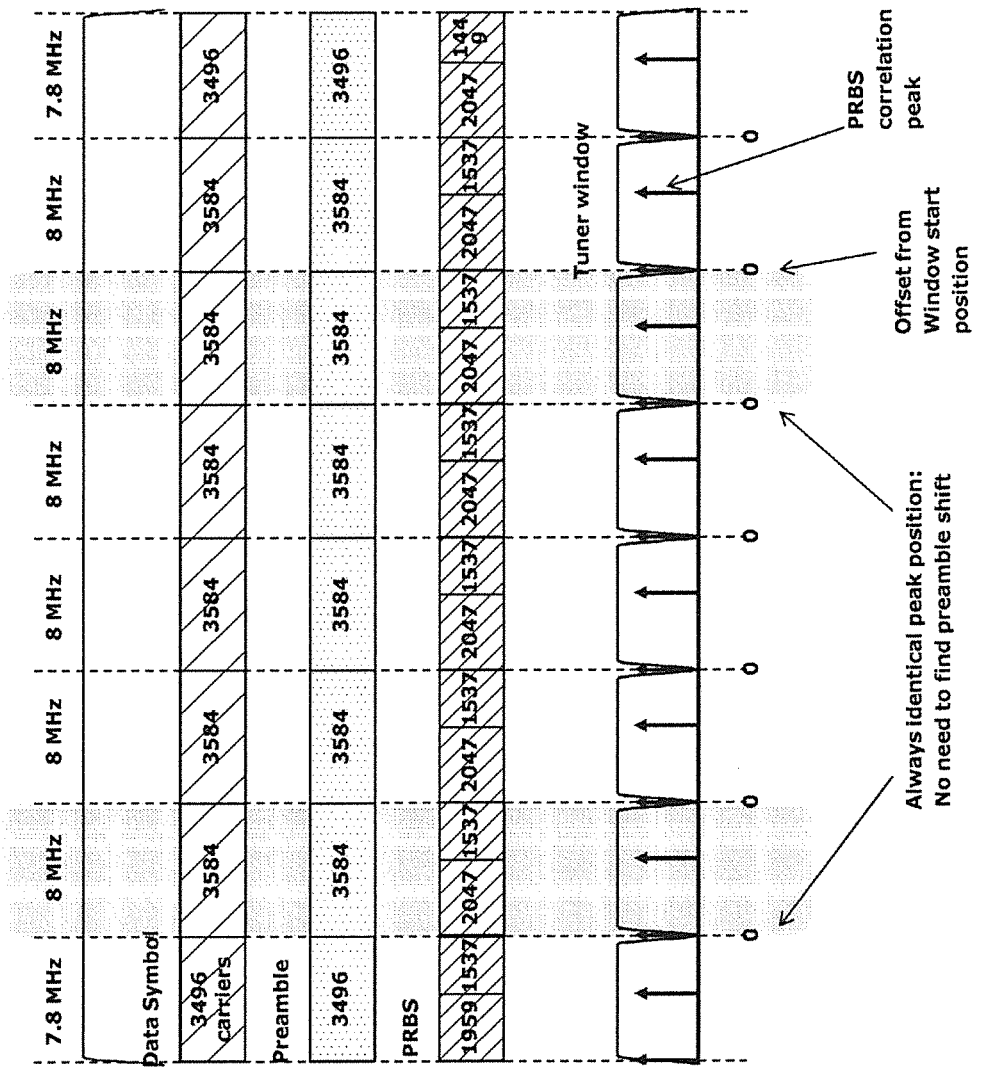
FIG. 48 is another relationship between data symbol and preamble.
Figure 55:
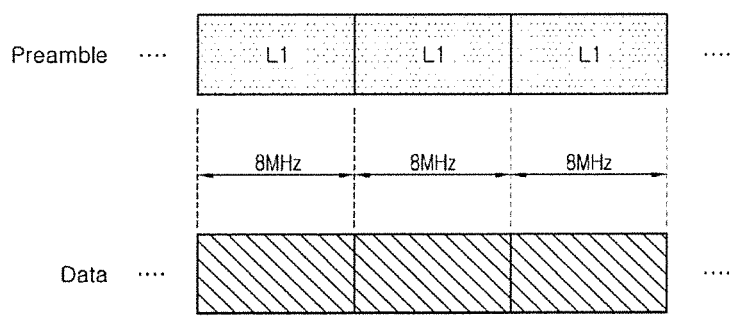
FIG. 55 is another example of preamble structure.

FIG. 48 shows a relationship between data symbol and preamble when the preamble structure as shown in FIG. 55 is used. L1 block can be repeated by period of 8 MHz. For L1 decoding, only frequency offset needs to be found and channel bonding knowledge may not be required. Frequency offset can be easily estimated by using known Pseudo Random Binary Sequence (PRBS) sequence. As shown in FIG. 48, preamble and data symbols are aligned, thus, additional sync search can become unnecessary. Therefore, for a receiver, specifically for the Frame header remover module r401 shown in FIG. 63, it is possible that only correlation peak with pilot scrambling sequence needs to be obtained to perform L1 signal decoding. The time/freq synchronizing module r505 in FIG. 62 can estimate carrier frequency offset from peak position.

FIG. 49 shows an example of cable channel delay profile.

From the point of view of pilot design, current GI already over-protects delay spread of cable channel. In the worst case, redesigning the channel model can be an option. To repeat the pattern exactly every 8 MHz, the pilot distance should be a divisor of 3584 carriers (z=32 or 56). A pilot density of z=32 can increase pilot overhead, thus, z=56 can be chosen. Slightly less delay coverage may not be an important in cable channel. For example, it can be 8 µs for PP5' and 4 µs for PP7' compared to 9.3 µs (PP5) and 4.7 µs (PP7). Meaningful delays can be covered by both pilot patterns even in a worst case. For preamble pilot position, no more than all SP positions in data symbol are necessary.

If the −40 dB delay path can be ignored, actual delay spread can become 2.5 us, 1/64 GI=7 µs, of 1/128 GI=3.5 µs. This shows that pilot distance parameter, z=56 can be a good enough value. In addition, z=56 can be a convenient value for structuring pilot pattern that enables preamble structure shown in FIG. 48.

Figure 50:
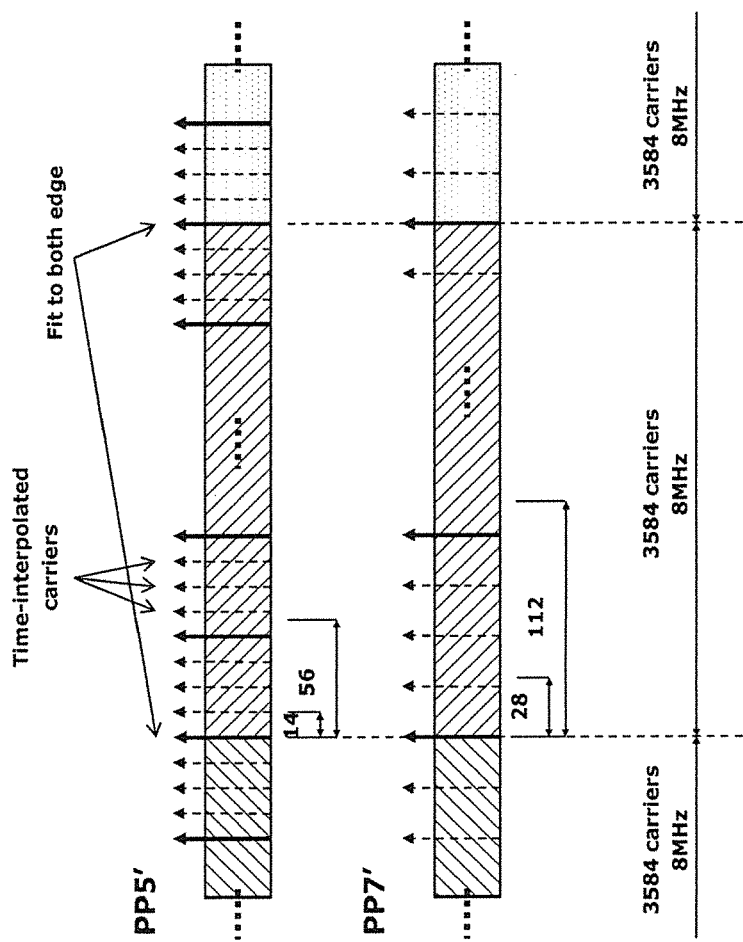
FIG. 50 is scattered pilot structure that uses z=56 and z=112.

FIG. 50 shows scattered pilot structure that uses z=56 and z=112 which is constructed at pilot inserting module 404 in FIG. 42. PP5' (x=14, y=4, z=56) and PP7' (x=28, y=4, z=112) are proposed. Edge carriers could be inserted for closing edge.

As shown in FIG. 50, pilots are aligned at 8 MHz from each edge of the band, every pilot position and pilot structure can be repeated every 8 MHz. Thus, this structure can support the preamble structure shown in FIG. 48. In addition, a common pilot structure between preamble and data symbols can be used. Therefore, channel estimation module r501 in FIG. 62 can perform channel estimation using interpolation on preamble and data symbols because no irregular pilot pattern can occur, regardless of window position which is decided by data slice locations. At this time, using only frequency interpolation can be enough to compensate channel distortion from delay spread. If time interpolation is performed additionally, more accurate channel estimation can be performed.

Consequently, in the new proposed pilot pattern, pilot position and pattern can be repeated based on a period of 8 MHz. A single pilot pattern can be used for both preamble and data symbols, L1 decoding can always be possible without channel bonding knowledge. In addition, the proposed pilot pattern may not affect commonality with T2 because the same pilot strategy of scattered pilot pattern can be used; T2 already used 8 different pilot patterns; and no significant receiver complexity can be increased by modified pilot patterns. For a pilot scrambling sequence, the period of PRBS can be 2047 (m-sequence); PRBS generation can be reset every 8 MHz, of which the period of 3584; pilot repetition rate of 56 can be also co-prime with 2047; and no PAPR issue can be expected.

FIG. 51 shows an example of a modulator based on OFDM. Input symbol streams can be transformed into time domain by IFFT module 501. If necessary, peak-to-average power ratio (PAPR) can be reduced at PAPR reducing module 502. For PAPR methods, Active constellation extension (ACE) or tone reservation can be used. GI inserting module 503 can copy a last part of effective OFDM symbol to fill guard interval in a form of cyclic prefix.

Preamble inserting module 504 can insert preamble at the front of each transmitted frame such that a receiver can detect digital signal, frame and acquire time/freq offset acquisition. At this time, the preamble signal can perform physical layer signaling such as FFT size (3 bits) and Guard interval size (3 bits). The Preamble inserting module 504 can be omitted if the modulator is specifically for DVB-C2.

FIG. 52 shows an example of a preamble structure for channel bonding, generated at preamble inserting module 504 in FIG. 51. One complete L1 block: should be "always decodable" in any arbitrary 7.61 MHz tuning window position and no loss of L1 signaling regardless of tuner window position should occur. As shown, L1 blocks can be repeated in frequency domain by period of 6 MHz. Data symbol can be channel bonded for every 8 MHz. If, for L1 decoding, a receiver uses a tuner such as the tuner r603 represented in FIG. 61 which uses a bandwidth of 7.61 MHz, the Frame header remover r401 in FIG. 63 needs to rearrange the received cyclic shifted L1 block (FIG. 53) to its original form. This rearrangement is possible because L1 block is repeated for every 6 MHz block, FIG. 53a can be reordered into FIG. 53b.

Figure 54:
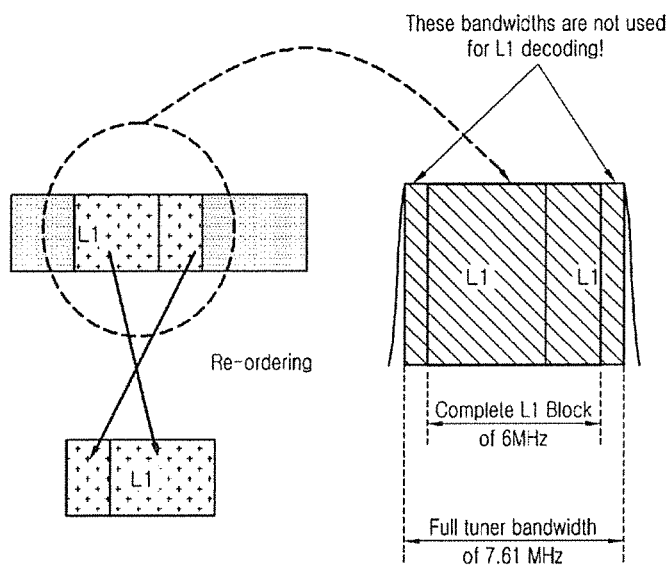
FIG. 54 is a process for designing more optimized preamble.

FIG. 54 shows a process for designing a more optimized preamble. The preamble structure of FIG. 52 uses only 6 MHz of total tuner bandwidth 7.61 MHz for L1 decoding. In terms of spectrum efficiency, tuner bandwidth 7.61 MHz is not fully utilized. Therefore, there can be further optimization in spectrum efficiency.

Figure 57:
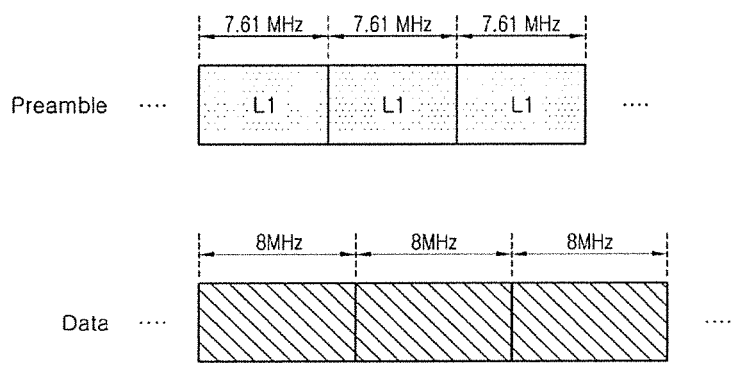
FIG. 57 is an example of Preamble structure.

FIG. 55 shows another example of preamble structure or preamble symbols structure for full spectrum efficiency, generated at Frame Header Inserting module 401 in FIG. 42. Just like data symbol, L1 blocks can be repeated in frequency domain by period of 8 MHz. One complete L1 block is still "always decodable" in any arbitrary 7.61 MHz tuning window position. After tuning, the 7.61 MHz data can be regarded as a virtually punctured code. Having exactly the same bandwidth for both the preamble and data symbols and exactly the same pilot structure for both the preamble and data symbols can maximize spectrum efficiency. Other features such as cyclic shifted property and not sending L1 block in case of no data slice can be kept unchanged. In other words, the bandwidth of preamble symbols can be identical with the bandwidth of data symbols or, as shown in FIG. 57, the bandwidth of the preamble symbols can be the bandwidth of the tuner (here, it's 7.61 MHz). The tuner bandwidth can be defined as a bandwidth that corresponds to a number of total active carriers when a single channel is used. That is, the bandwidth of the preamble symbol can correspond to the number of total active darners (here, it's 7.61 MHz).

The number of active earners per channel, can fee different depending upon the counting method as any skilled person in the art would appreciate. That is, in FIG. 46, 3409 active carriers per single channel corresponding to bandwidth of 7.61 MHz are transmitted. However, if not counting either of channel edges, it can be said that the number of carriers per single channel is 3408.

Figure 56:
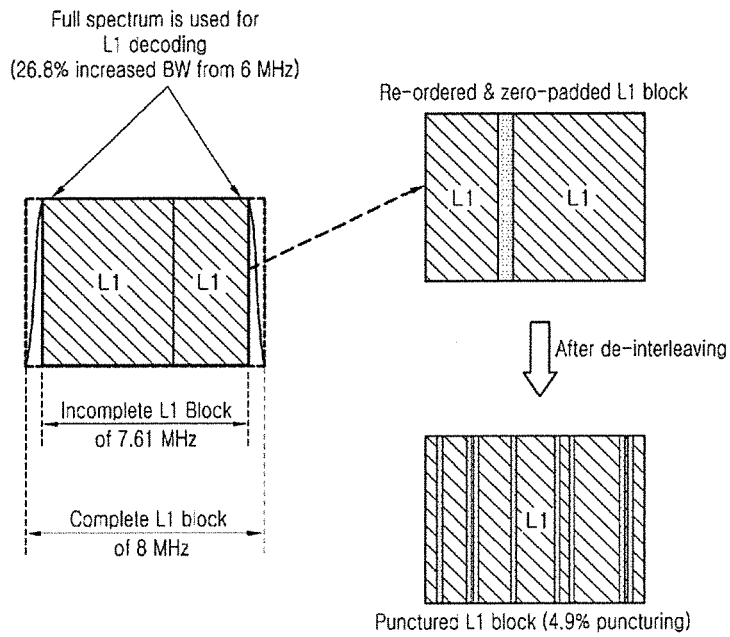
FIG. 56 is another example of Preamble decoding.

FIG. 56 shows a virtually punctured code. The 7.61 MHz data among the 8 MHz L1 block can be considered as punctured coded. When a tuner r603 shown in FIG. 61 uses 7.61 MHz bandwidth for L1 decoding. Frame header remover r401 in FIG. 63 needs to rearrange received, cyclic shifted L1 block into original form as shown in FIG. 56. At this time, L1 decoding is performed using the entire bandwidth of the tuner. Once the L1 block is rearranged, a spectrum of the rearranged L1 block can have a blank region within the spectrum as shown in upper right side of FIG. 56 because an original size of L1 block is 8 MHz bandwidth.

Figure 64:
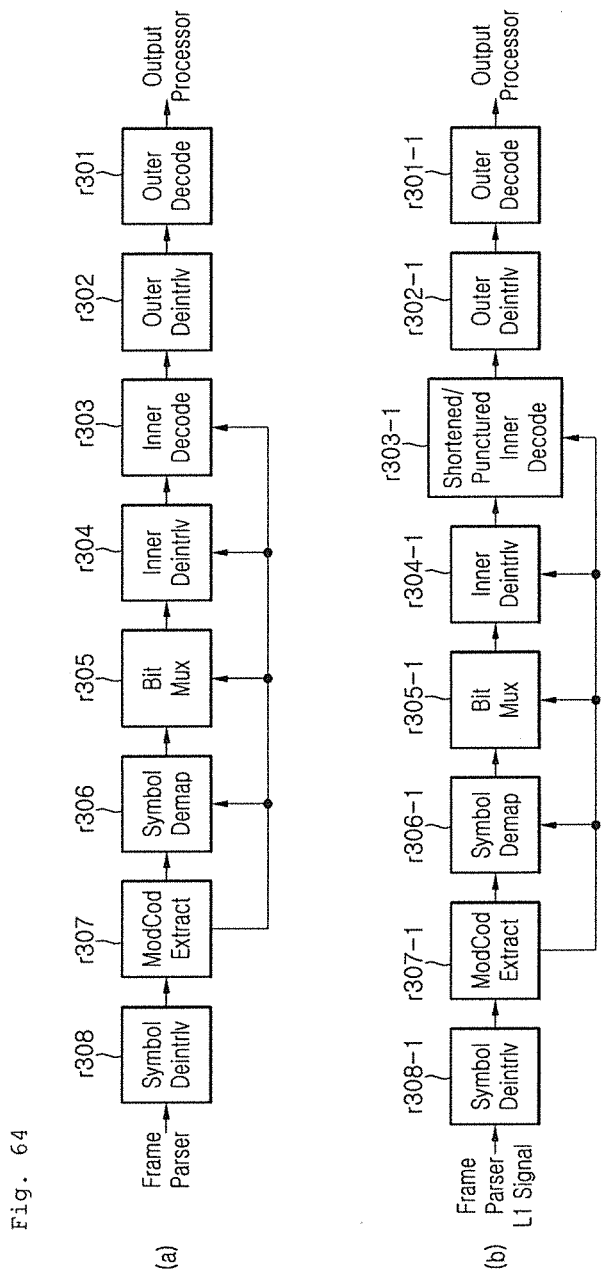
FIG. 64 is an example of BICM demodulator.

Once the blank region is zero padded, either after deinterleaving in symbol domain by the freq, deinterleaver r403 in FIG. 63 or by the symbol deinterleaver r308-1 in FIG. 64 or after deinterleaving in bit domain by the symbol demapper r306-1, bit mux r305-1, and inner deinterleaver r304-1 in FIG. 64, the block can have a form which appears to be punctured as shown in lower right side of FIG. 56.

This L1 block can be decoded at the punctured/shortened decode module r303-1 in FIG. 64. By using these preamble structure, the entire tuner bandwidth can be utilized, thus spectrum efficiency and coding gain can be increased. In addition, an identical bandwidth and pilot structure can be used for the preamble and data symbols.

Figure 58:
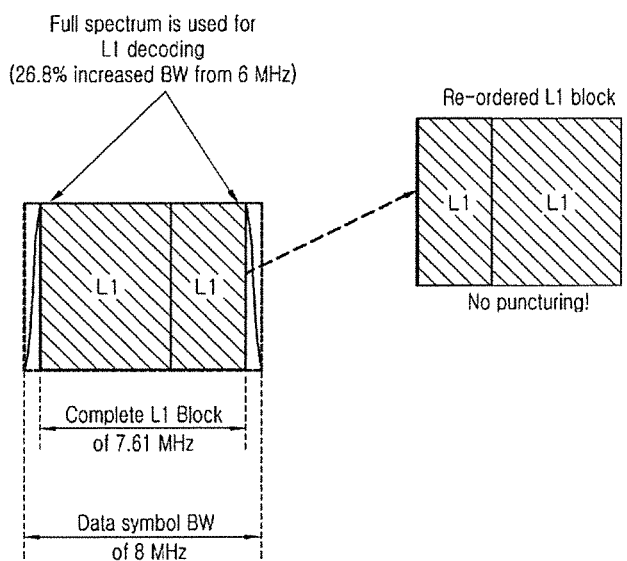
FIG. 58 is an example of L1 decoding.

In addition, if the preamble bandwidth or the preamble symbols bandwidth is set as a tuner bandwidth as shown in FIG. 58, it's 7.61 MHz in the example), a complete L1 block can be obtained after rearrangement even without puncturing. In other words, for a frame having preamble symbols, wherein the preamble symbols have at least one layer 1 (L1) block, it can be said, the L1 block has 3408 active subcarriers and the 3408 active subcarriers correspond to 7.61 MHz of 8 MHz Radio Frequency (RF) band.

Thus, spectrum efficiency and L1 decoding performance can be maximized. In other words, at a receiver, decoding can be performing only deinterleaving in the symbol domain.

Consequently, the proposed new preamble structure can be advantageous in that it's fully compatible with previously used preamble except that the bandwidth is different; L1 blocks are repeated by period of 8 MHz; L1 block can be always decodable regardless of tuner window position; Full tuner bandwidth can be used for L1 decoding; maximum spectrum efficiency can guarantee more coding gain; incomplete L1 block can be considered as punctured coded; simple and same pilot structure can be used for both preamble and data; and identical bandwidth can be used for both preamble and data.

Figure 59:
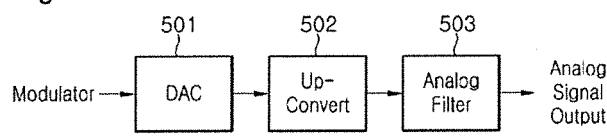
FIG. 59 is an example of analog processor.

FIG. 59 shows an example of an analog processor. A ADC module 601 can convert digital signal input into analog signal. After transmission frequency bandwidth is up-converted (602) and analog filtered (603) signal can be transmitted.

Figure 60:
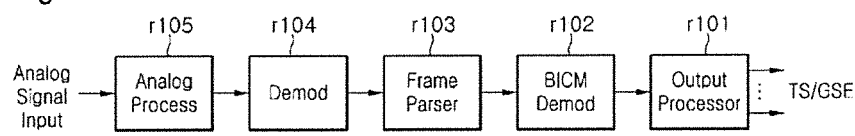
FIG. 60 is an example of digital receiver system.

FIG. 60 shows an example of a digital receiver system. Received signal is converted into digital signal at an analog process module r105. A demodulator r104 can convert the signal into data in frequency domain. A frame parser r103 can remove pilots and headers and enable selection of service information that needs to be decoded. A BICM demodulator r102 can correct errors in the transmission channel. An output processor r101 can restore the originally transmitted service stream and timing information.

Figure 61:
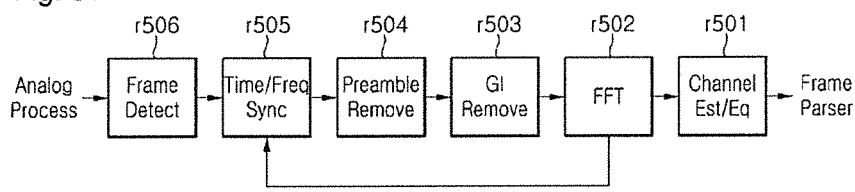
FIG. 61 is an example of analog processor used at receiver.

FIG. 61 shows an example of analog processor used at the receiver. A Tuner/AGC module r603 can select desired frequency bandwidth from received signal. A down converting module r602 can restore baseband. An ADC module r601 cast convert analog signal into digital signal.

FIG. 62 shows an example of demodulator. A frame detecting module r506 can detect the preamble, cheek if a corresponding digital signal exists, and detect a start of a frame. A time/freq synchronizing module r505 can perform synchronization in time and frequency domains. At this time, for time domain synchronization, a guard interval correlation can be used. For frequency domain synchronization, correlation can be used or offset can be estimated from phase information of a subcarrier that is transmitted in the frequency domain. A preamble removing module r504 can remove preamble from the front of detected fame. A GI removing module r503 can remove guard interval. A FFT module r501 can transform signal in the time domain into signal in the frequency domain. A channel estimation/equalization module r501 can compensate errors by estimating distortion in transmission channel using pilot symbol. The Preamble removing module r504 can be omitted if the demodulator is specifically for DVB-C2.

FIG. 63 shows an example of frame parser. A pilot removing module r404 can remove pilot symbol. A freq deinterleaving module r403 can perform deinterleaving in the frequency domain. An OFDM symbol merger r402 can restore data frame from symbol streams transmitted in OFDM symbols. A frame header removing module r401 can extract physical layer signaling from header of each transmitted frame and remove header. Extracted information can be used as parameters for following processes in the receiver.

FIG. 64 shows an example of a BICM demodulator. FIG. 64a shows a data path and FIG. 64b shows a L1 signaling path. A symbol deinterleaver r308 can perform deinterleaving in the symbol domain. A ModCod extract r307 can extract ModCod parameters from front of each BB frame and make the parameters available for following adaptive/variable demodulation and decoding processes. A Symbol demapper r306 can demap input symbol streams into bit Log-Likelyhood Ratio (LLR) streams. The Output bit LLR streams can be calculated by using a constellation used in a Symbol mapper 306 of the transmitter as reference point. At this point, when the aforementioned MQAM or NU-MQAM is used, by calculating both I axis and Q axis when calculating bit nearest from MSB and by calculating either I axis or Q axis when calculating the rest bits, an efficient symbol demapper can be implemented. This method can be applied to, for example. Approximate LLR, Exact LLR, or Hard decision.

When an optimized constellation according to constellation capacity and code rate of error correction code at the Symbol mapper 306 of the transmitter is used, the Symbol demapper r306 of the receiver can obtain a constellation using the code rate and constellation capacity information transmitted from the transmitter. The bit mux r305 of the receiver can perform an inverse function of the bit demux 305 of the transmitter. The Inner deinterleaver r304 and outer deinterleaver r302 of the receiver can perform inverse functions of the inner interleave 304 and outer interleaver 302 of the transmitter, respectively to get the bitstream in its original sequence. The outer deinterleaver r302 can be omitted if the BICM demodulator is specifically for DVB-C2.

The inner decoder r303 and outer decoder r301 of the receiver can perform corresponding decoding processes to the inner coder 303 and outer code 301 of the transmitter, respectively, to correct errors in the transmission channel. Similar processes performed on data path can be performed on L1 signaling path, but with different parameters (r308-1~r301-1). At this point, as explained in the preamble part, a shortened/punctured code module r303-1 can be used for L1 signal decoding.

Figure 65:
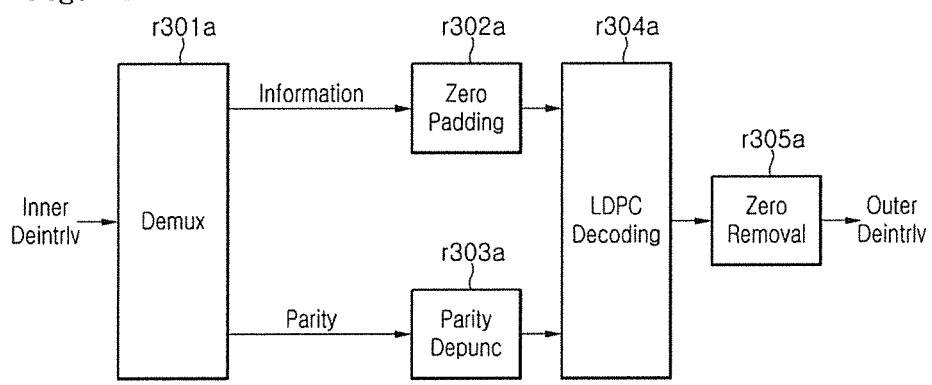
FIG. 65 is an example of LDPC decoding using shortening/puncturing.

FIG. 65 shows an example of LDPC decoding using shortening/puncturing. A demux r301a can separately output information part and parity part of systematic code from input bit streams. For the information part, a zero padding (r302a) can be performed according to a number of input bit streams of LDPC decoder, for the parity part, input bit streams for (r303a) the LDPC decoder can be generated by de-puncturing punctured part. LDPC decoding (r304a) can be performed on generated bit streams, zeros in information part can be removed and output (r305a).

Figure 66:
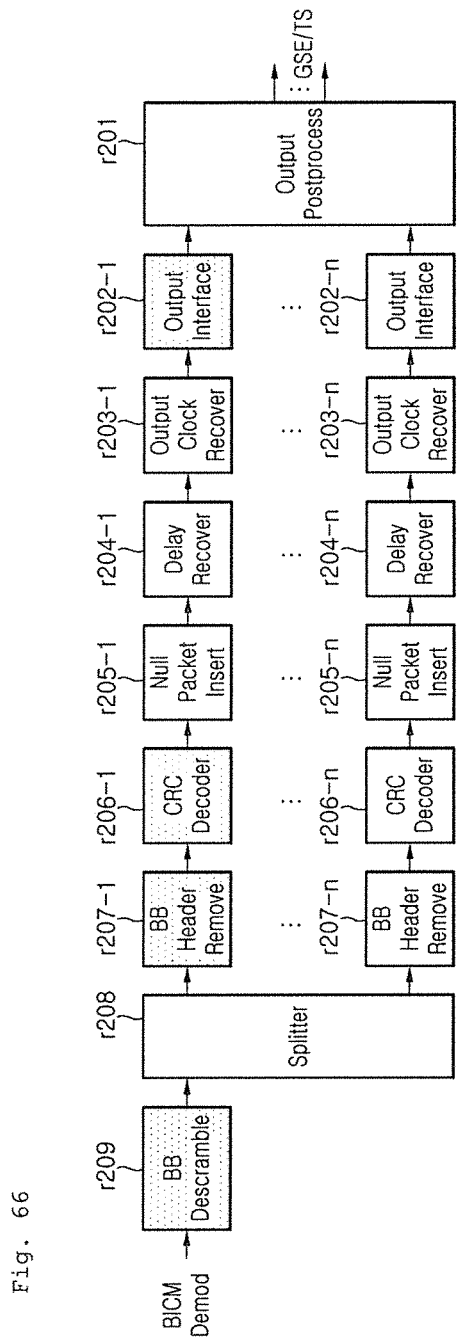
FIG. 66 is an example of output processor.

FIG. 66 shows an example of output processor. A BB descrambler r209 can restore scrambled (209) bit streams at the transmitter. A Splitter r208 can restore BB frames that correspond to multiple PLP that are multiplexed and transmitted from the transmitter according to PLP path. For each PLP path, a BB header remover r207-1~n can remove the header that is transmitted at the front of the BB frame. A CRC decoder r206-1~n can perform CRC decoding and make reliable BB frames available for selection. A Null packet inserting modules r205-1~n can restore null packets which were removed for higher transmission efficiency in their original location. A Delay recovering modules r204-1~n can restore a delay that exists between each PLP path.

An output clock recovering modules r203-1~n can restore the original timing of the service stream from timing information transmitted from the input stream synchronization modules 203-1~n. An output interface modules r202-1~n can restore data in TS/GS packet from input bit streams that are sliced in BB frame. An output postprocess modules r202-1~n can restore multiple TS/GS streams into a complete TS/GS stream, is necessary. The shaded blocks shown in FIG. 66 represent modules that can be used when a single PLP is processed at a time and the rest of the blocks represent modules that can be used when multiple PLPs are processed at the same time.

Using the suggested methods and devices, among others advantages it is possible to implement an efficient digital transmitter, receiver and structure of physical layer signaling.

By transmitting ModCod information in each BB frame header that is necessary for ACM/VCM and transmitting the rest of the physical layer signaling in a frame header, signaling overhead can be minimized.

Modified QAM for a more energy efficient transmission or a more noise-robust digital broadcasting system can be implemented. The system can include transmitter and receiver for each example disclosed and the combinations thereof.

An Improved Non-uniform QAM for a more energy efficient transmission or a more noise-robust digital braodcasting system can be implemented. A method of using code rate of error correction code of NU-MQAM and MQAM is also described. The system can include transmitter and receiver for each example disclosed and the combinations thereof.

The suggested L1 signaling method can reduce overhead by 3~4% by minimizing signaling overhead during channel bonding.

It will be apparent to those skilled in the art that various modifications and variations can be made in the present invention without departing from the invention.

What is claimed is:
1. A method of transmitting broadcast signals, the method comprising:
  encoding signaling data by an LDPC (Low Density Parity Check) scheme;
  encoding data by at least one code rate;
  mapping the encoded data onto constellations using non-uniform constellations;
  building at least one signal frame including at least one preamble data symbol having the encoded signaling data and data symbols having the mapped data;

inserting at least one pilot into each of the built at least one signal frame with a specific pattern and modulating the at least one signal frame by an OFDM (Orthogonal Frequency Division Multiplexing) method; and transmitting broadcast signals having the modulated at least one signal frame, wherein the signaling data includes channel bonding information for the broadcast signals and wherein the channel bonding information includes information about a number of frequencies and identification information for identifying a channel used in channel bonding.

2. The method of claim 1, wherein the non-uniform constellations are related to the at least one code rate.

3. The method of claim 1, wherein the signaling data includes code rate information and modulation information.

4. The method of claim 1, wherein the method further includes: time interleaving the mapped data.

5. An apparatus of transmitting broadcast signals, the apparatus comprising:
  a signaling encoder to encode signaling data by an LDPC (Low Density Parity Check) scheme;
  an encoder to encode data by at least one code rate;
  a mapper to map the encoded data onto constellations by using non-uniform constellations;
  a frame builder to build at least one signal frame including at least one preamble data symbol having the encoded signaling data and data symbols having the mapped data;
  a modulator to insert at least one pilot into each of the built at least one signal frame with a specific pattern and to modulate the at least one signal frame by an OFDM (Orthogonal Frequency Division Multiplexing) method; and
  a transmitter to transmit broadcast signals having the modulated at least one signal frame,
  wherein the signaling data includes channel bonding information for the broadcast signals and wherein the channel bonding information includes information about a number of frequencies and identification information for identifying a channel used in channel bonding.

6. The apparatus of claim 5, wherein the non-uniform constellations are related to the at least one code rate.

7. The apparatus of claim 5, wherein the signaling data includes code rate information and modulation information.

8. The apparatus of claim 5, wherein the apparatus further includes a time interleaver to time interleave the mapped data.

9. A method of receiving broadcast signals, the method comprising:
  receiving the broadcast signals;
  demodulating the received broadcast signals by an OFDM (Orthogonal Frequency Division Multiplexing) method;
  detecting at least one pilot in the demodulated broadcast signals;
  parsing at least one signal frame from the demodulated broadcast signals, wherein a signal frame includes at least one preamble data symbol having signaling data and data symbols;
  decoding the signaling data by an LDPC (Low Density Parity Check) scheme;
  demapping data in the data symbols using non-uniform constellations; and
  decoding the demapped data by at least one code rate,
  wherein the signaling data includes channel bonding information for the broadcast signals and wherein the channel bonding information includes information about a number of frequencies and identification information for identifying a channel used in channel bonding.

10. The method of claim 9, wherein the non-uniform constellations are related to the at least one code rate.

11. The method of claim 9, wherein the signaling data includes code rate information and modulation information.

12. The method of claim 9, wherein the method further includes time deinterleaving the data.

13. An apparatus of receiving broadcast signals, the apparatus comprising:
  a receiver to receive the broadcast signals;
  a demodulator to demodulate the received broadcast signals by an OFDM (Orthogonal Frequency Division Multiplexing) method and detect at least one pilot in the demodulated broadcast signals;
  a frame parser to parse at least one signal frame from the demodulated broadcast signals, wherein the at least one signal frame includes at least one preamble data symbol having signaling data and data symbols;
  a signaling decoder to decode the signaling data by an LDPC (Low Density Parity Check) scheme;
  a demapper to demap data in the data symbols using non-uniform constellations; and
  a decoder to decode the demapped data by at least one code rate,
  wherein the signaling data includes channel bonding information for the broadcast signals and wherein the channel bonding information includes information about a number of frequencies and identification information for identifying a channel used in channel bonding.

14. The apparatus of claim 13, wherein the non-uniform constellations are related to the at least one code rate.

15. The apparatus of claim 13, wherein the signaling data includes code rate information and modulation information.

16. The apparatus of claim 13, wherein the apparatus further includes:
  a time deinterleaver to time deinterleave the data.

* * * * *